(12) United States Patent
Noshiro

(10) Patent No.: US 8,750,034 B2
(45) Date of Patent: Jun. 10, 2014

(54) MAGNETORESISTANCE ELEMENT AND SEMICONDUCTOR MEMORY DEVICE

(71) Applicant: Fujitsu Limited, Kawasaki (JP)

(72) Inventor: Hideyuki Noshiro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/766,460

(22) Filed: Feb. 13, 2013

(65) Prior Publication Data

US 2013/0155764 A1  Jun. 20, 2013

Related U.S. Application Data

(63) Continuation of application No. PCT/JP2010/005085, filed on Aug. 17, 2010.

(51) Int. Cl.
*G11C 11/00* (2006.01)

(52) U.S. Cl.
USPC ......................................... 365/158

(58) Field of Classification Search
USPC ......................................... 365/148
See application file for complete search history.

(56) References Cited

U.S. PATENT DOCUMENTS

| | | | |
|---|---|---|---|
| 2003/0197984 A1* | 10/2003 | Inomata et al. | 360/324.2 |
| 2005/0045913 A1 | 3/2005 | Nguyen et al. | |
| 2005/0237788 A1 | 10/2005 | Kano et al. | |
| 2007/0297101 A1 | 12/2007 | Inomata et al. | |
| 2009/0161424 A1 | 6/2009 | Redon | |
| 2009/0303779 A1* | 12/2009 | Chen et al. | 365/158 |
| 2012/0002463 A1* | 1/2012 | Ranjan et al. | 365/158 |
| 2013/0155764 A1* | 6/2013 | Noshiro | 365/158 |

FOREIGN PATENT DOCUMENTS

| | | |
|---|---|---|
| JP | 2001-156357 A | 6/2001 |
| JP | 2005-310829 A | 11/2005 |
| JP | 2007-504651 A | 3/2007 |
| JP | 2009-152594 A | 7/2009 |

OTHER PUBLICATIONS

International Search Report of PCT/JP2010/005085, mailing date of Dec. 7, 2010.
Written Opinion of PCT/JP2010/005085, mailing date of Dec. 7, 2010, w/ partial English translation.
Japanese Office Action dated Apr. 1, 2014, issued in corresponding Japanese Patent Application No. 2012-529414, with English translation (total 7 pages).

* cited by examiner

*Primary Examiner* — Hoai V Ho
*Assistant Examiner* — Min Huang
(74) *Attorney, Agent, or Firm* — Westerman, Hattori, Daniels & Adrian, LLP

(57) ABSTRACT

A magnetoresistance element includes: a first magnetoresistance subelement including a first free magnetization layer, a first tunnel insulating layer and a first fixed magnetization layer, the first tunnel insulating layer interposed between the first free magnetization layer and the first fixed magnetization layer; and a second magnetoresistance subelement including a second free magnetization layer, a second tunnel insulating layer and a second fixed magnetization layer, the second tunnel insulating layer interposed between the second free magnetization layer and the second fixed magnetization layer, wherein the first and second magnetoresistance subelements are stacked each other, and an order of the first free magnetization layer and the first fixed magnetization layer is opposite to an order of the second free magnetization layer and the second fixed magnetization layer in a thickness direction of the magnetoresistance element.

15 Claims, 45 Drawing Sheets

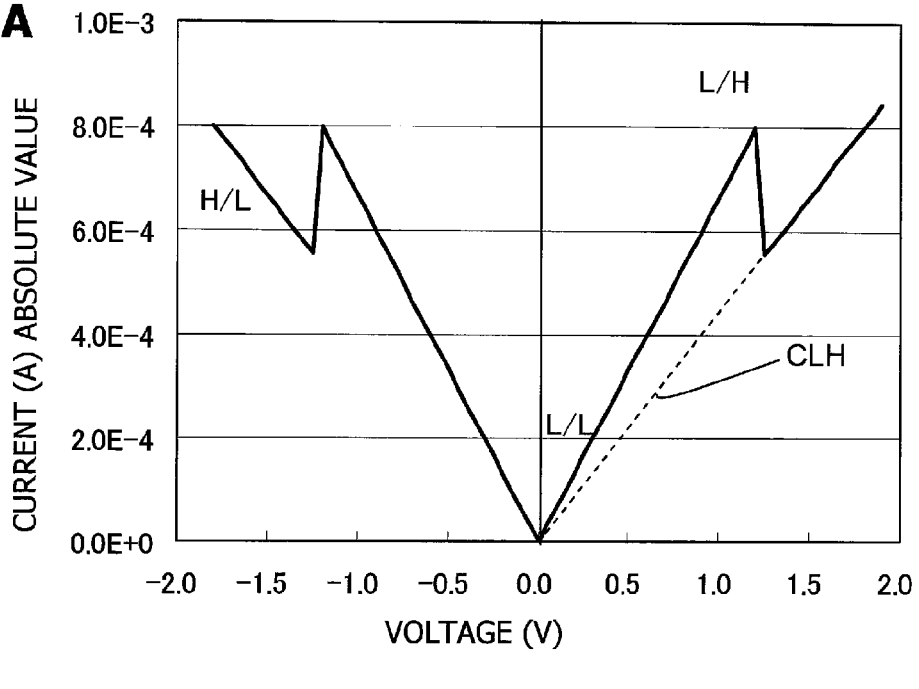
1st Simulation   L/L State
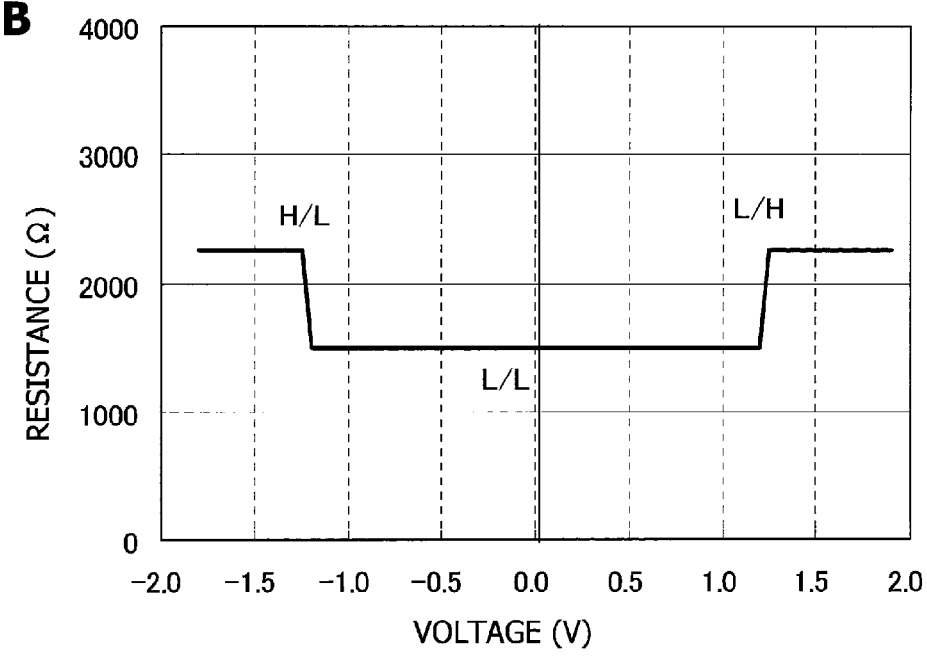
1st Simulation   L/L State

1st Simulation   H/H State

1st Simulation   H/H State

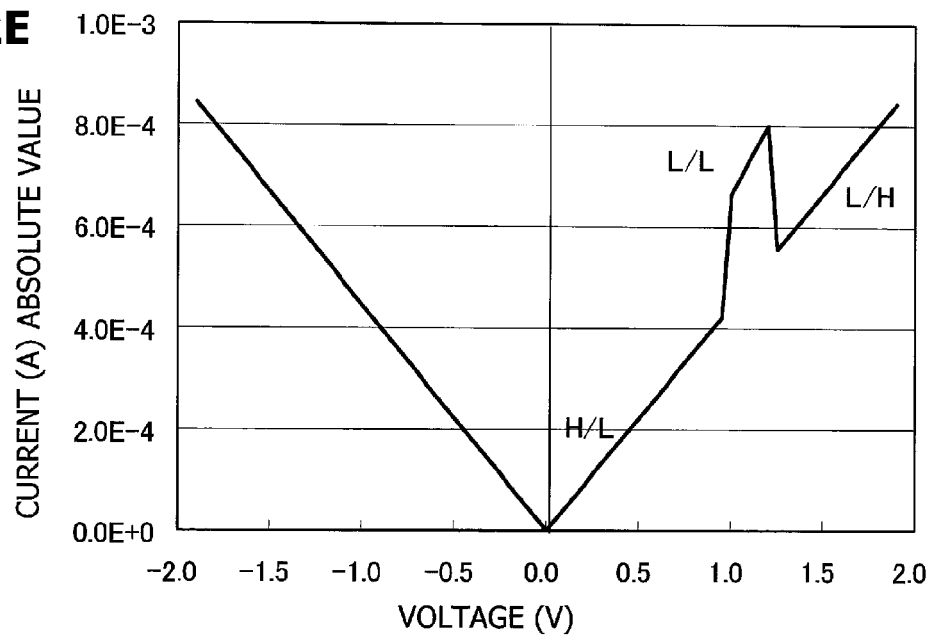
1st Simulation H/L State
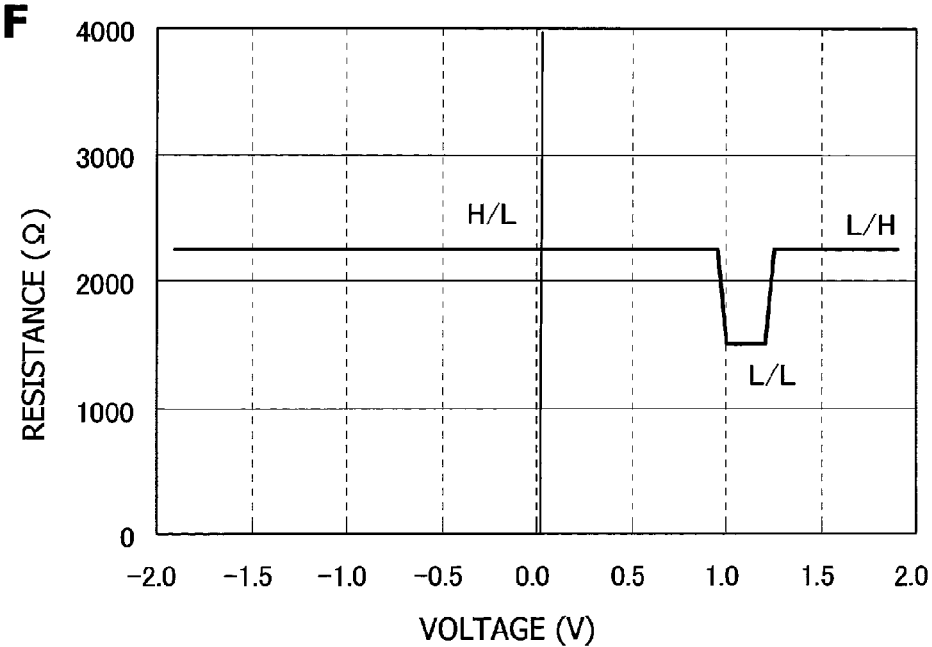
1st Simulation H/L State

1st Simulation  L/H State

1st Simulation  L/H State

FIG. 2I

1st Simulation
Possible Subsequent State and Voltage for Transition

| Present State ↓ / Subsequent State → | L/L | H/L | L/H | H/H |
|---|---|---|---|---|
| L/L | – | -1.25V | +1.25V | × |
| H/L | +1.0V | – | +1.25V | × |
| L/H | -0.9V | -1.2V | – | × |
| H/H | × | -1.2V | +1.2V | – |

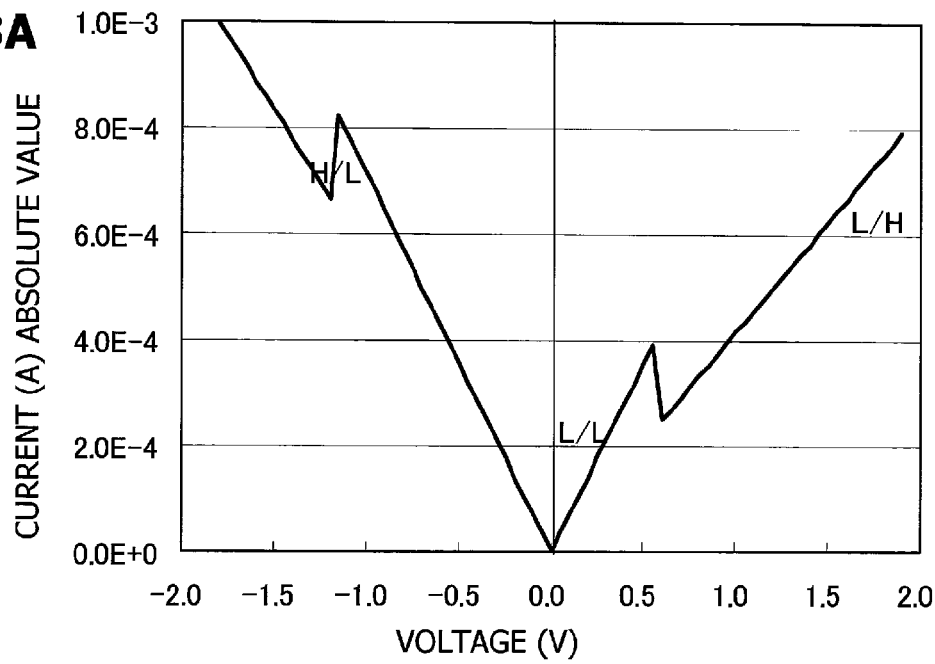
2nd Simulation L/L State
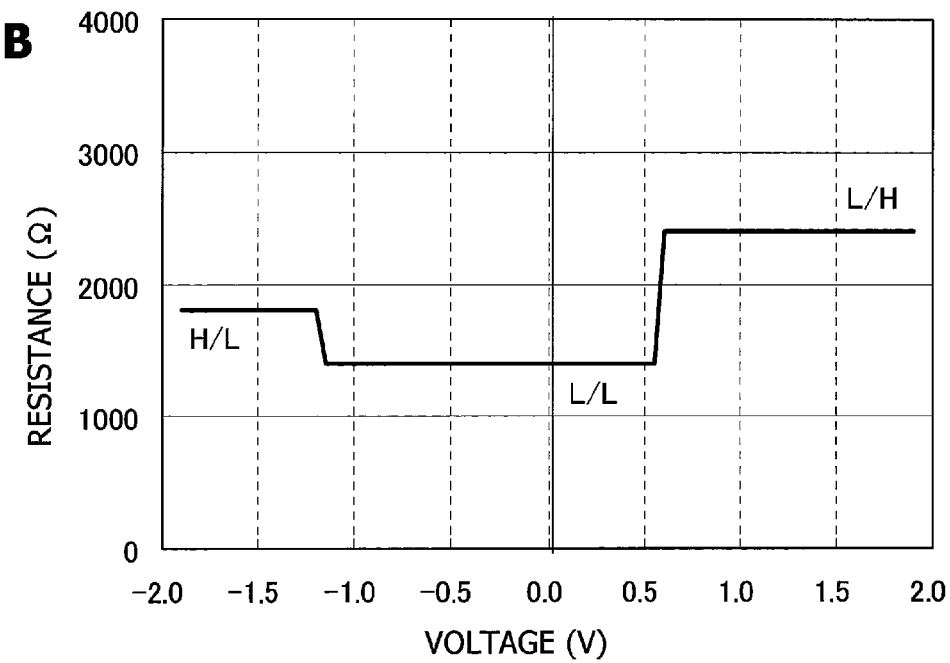
2nd Simulation L/L State

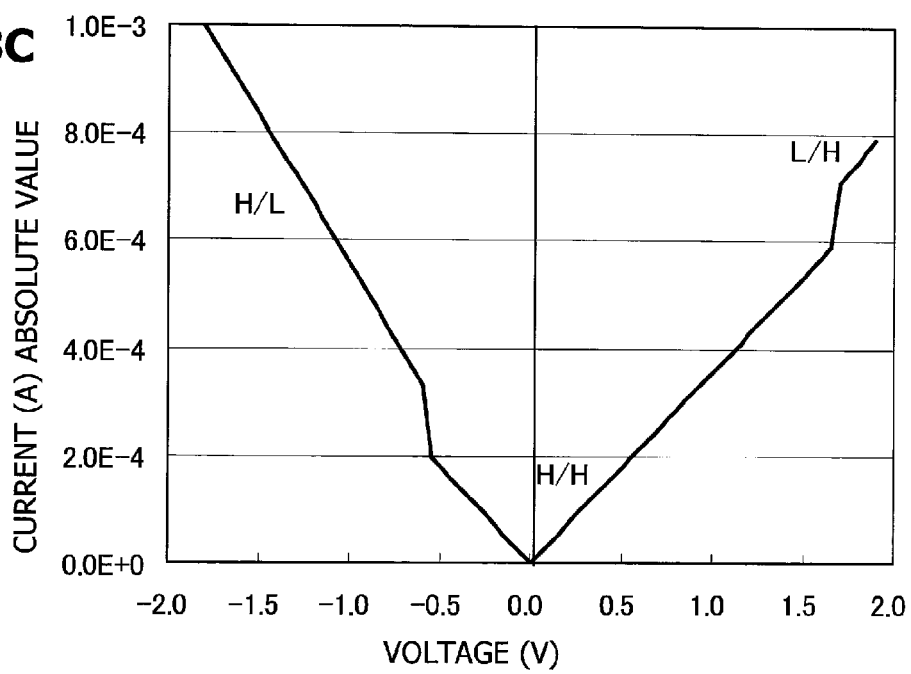
2nd Simulation H/H State
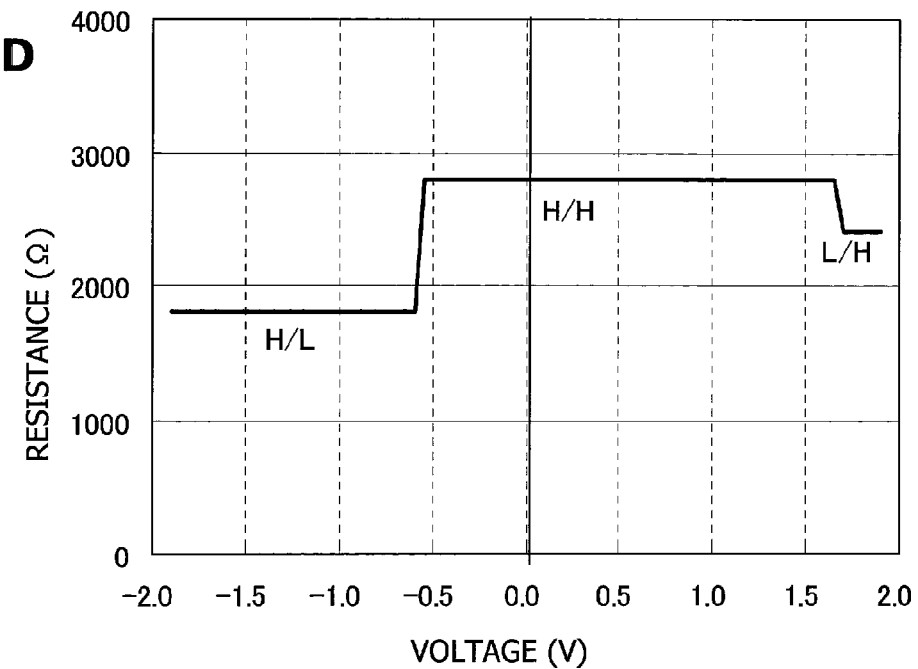
2nd Simulation H/H State

2nd Simulation H/L State

2nd Simulation H/L State

2nd Simulation L/H State

2nd Simulation L/H State

FIG. 3I

2nd Simulation
Possible Subsequent State and Voltage for Transition

| Present State ↓ / Subsequent State → | L/L | H/L | L/H | H/H |
|---|---|---|---|---|
| L/L | – | -1.25V | +0.6V | × |
| H/L | × | – | +1.70V | +0.75V |
| L/H | -0.5V | -1.15V | – | × |
| H/H | × | -0.6V | +1.7V | – |

3rd Simulation L/L State

3rd Simulation L/L State

3rd Simulation  H/H State

3rd Simulation  H/H State

3rd Simulation H/L State

3rd Simulation H/L State

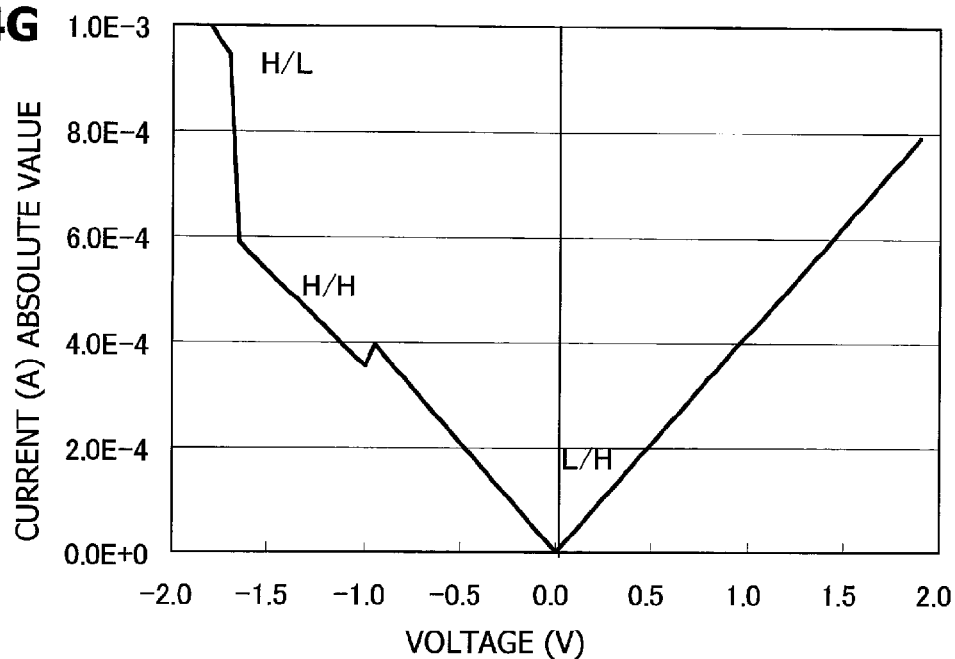
3rd Simulation  L/H State
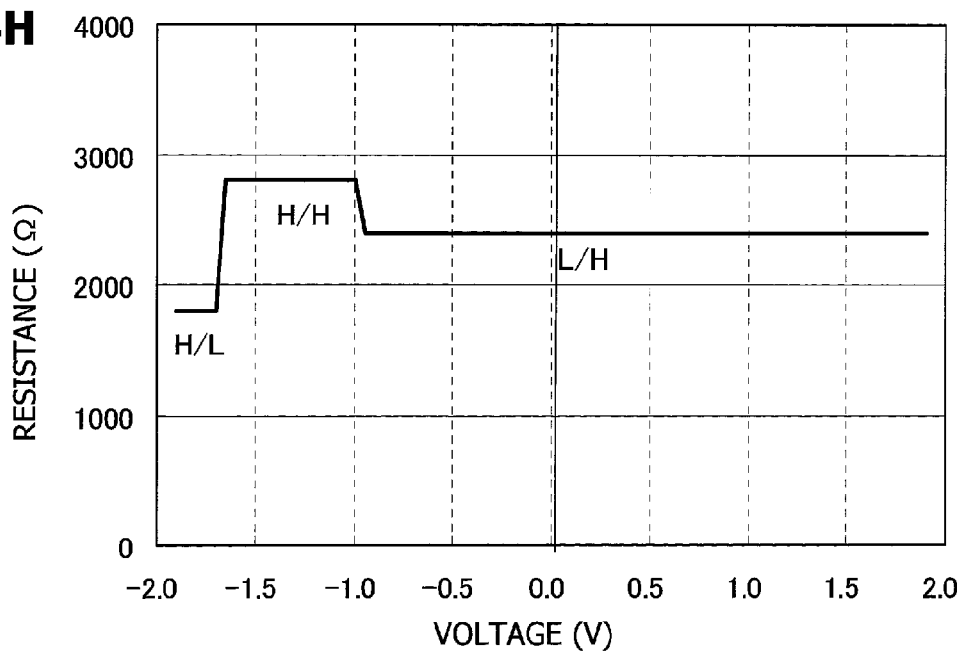
3rd Simulation  L/H State

FIG. 4I

3rd Simulation
Possible Subsequent State and Voltage for Transition

| Present State ↓ | Subsequent State → | L/L | H/L | L/H | H/H |
|---|---|---|---|---|---|
| L/L | | – | -0.6V | +1.15V | × |
| H/L | | +0.4V | – | +1.15V | × |
| L/H | | × | -1.7V | – | -1.0V |
| H/H | | × | -1.7V | +0.6V | – |

4th Simulation L/L State

4th Simulation L/L State

4th Simulation  H/H State

4th Simulation  H/H State

4th Simulation  H/L State

4th Simulation  H/L State

4th Simulation L/H State

4th Simulation L/H State

FIG. 5I

4th Simulation
Possible Subsequent State and Voltage for Transition

| Present State ↓ / Subsequent State→ | L/L | H/L | L/H | H/H |
|---|---|---|---|---|
| L/L | — | -0.9V | +1.15V | × |
| H/L | +0.4V | — | +1.15V | × |
| L/H | -0.95V (unstable) | -1.0V | — | × |
| H/H | × | -1.15V | +0.6V | — |

5th Simulation  L/L State

5th Simulation  L/L State

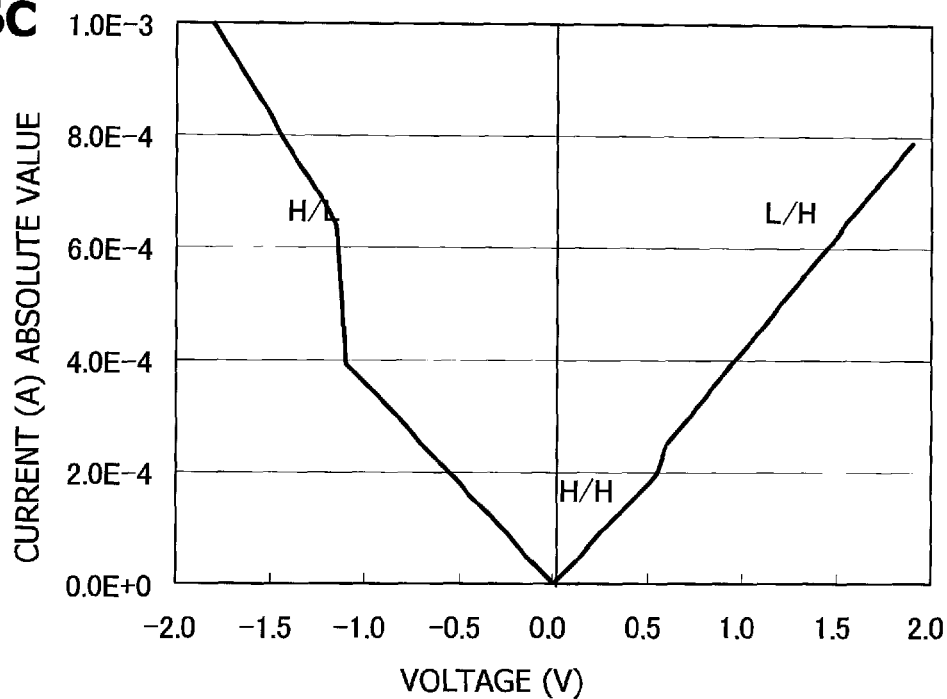
FIG.6C 5th Simulation H/H State
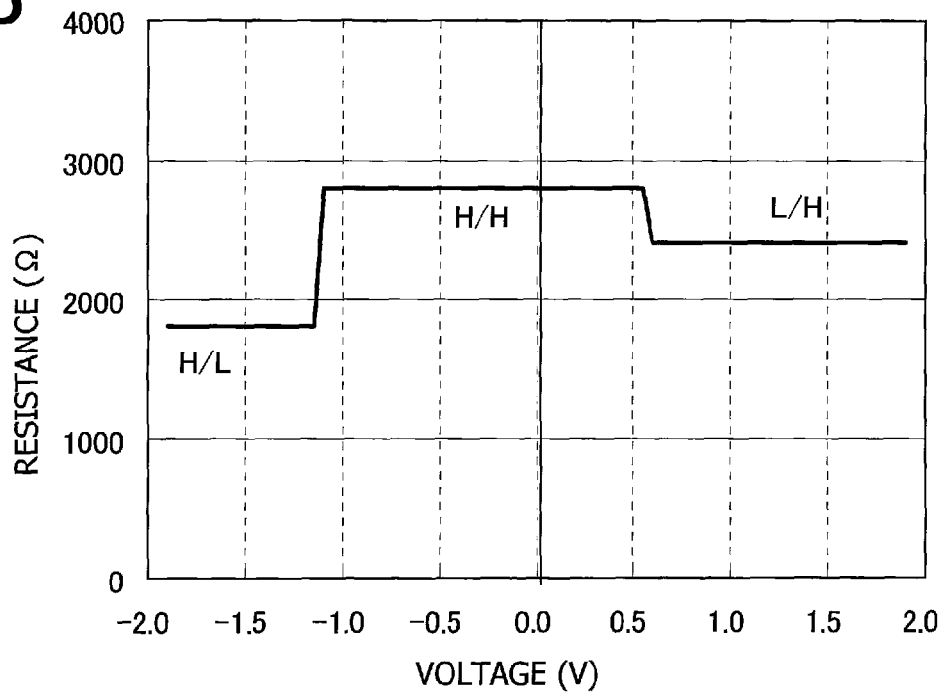
FIG.6D 5th Simulation H/H State

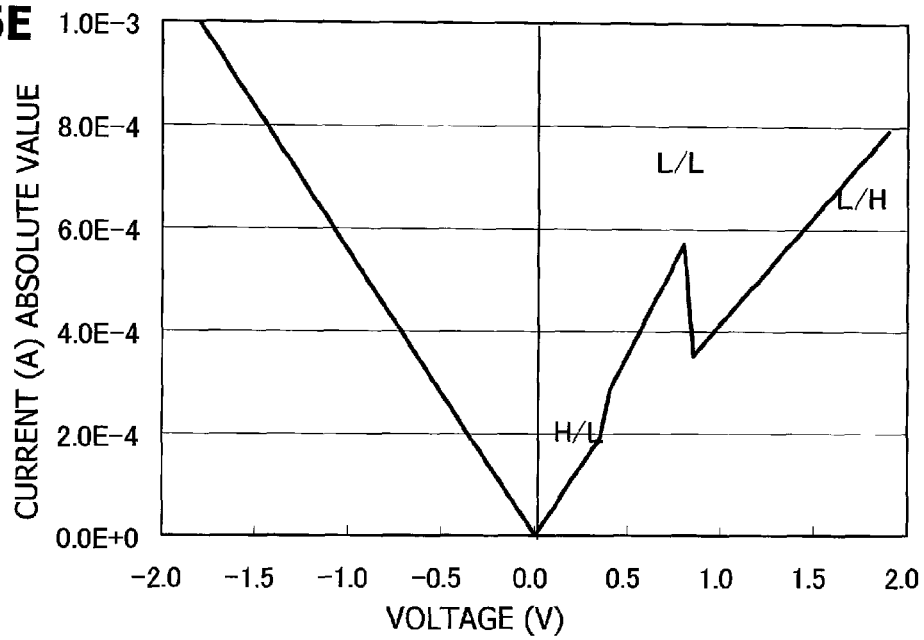
5th Simulation H/L State
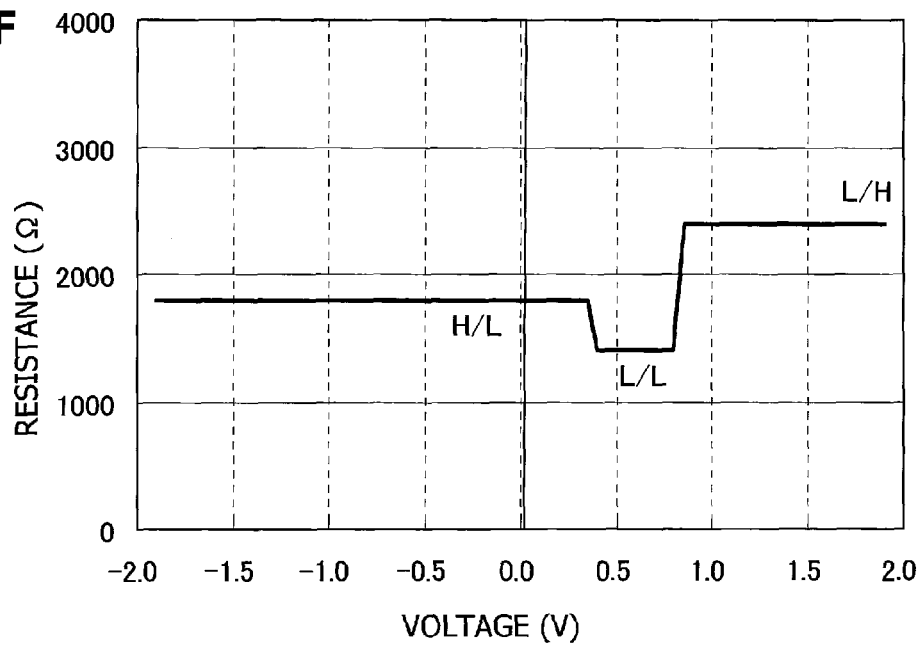
5th Simulation H/L State

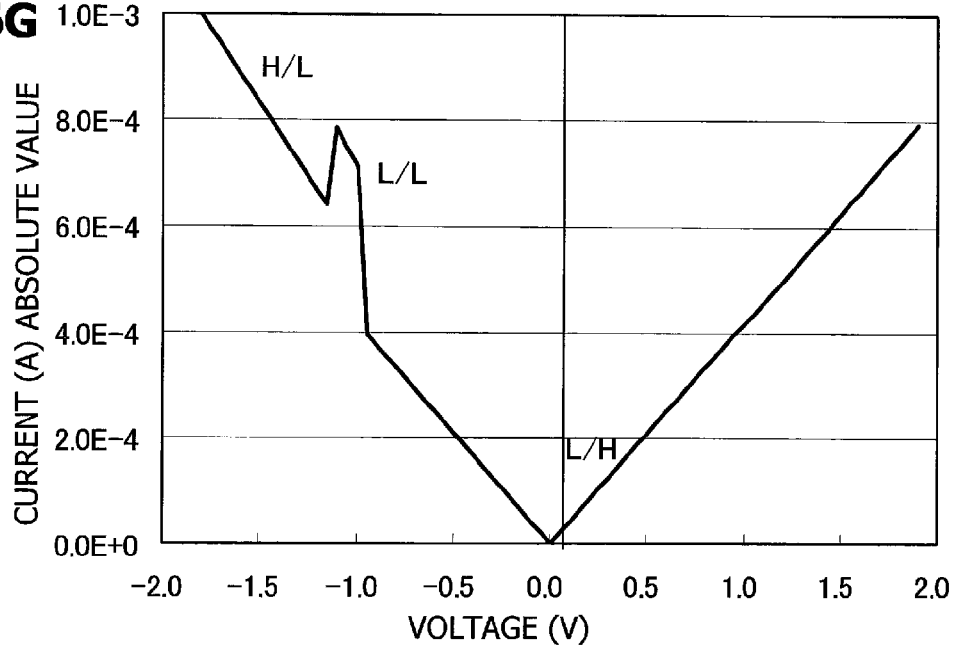
5th Simulation  L/H State
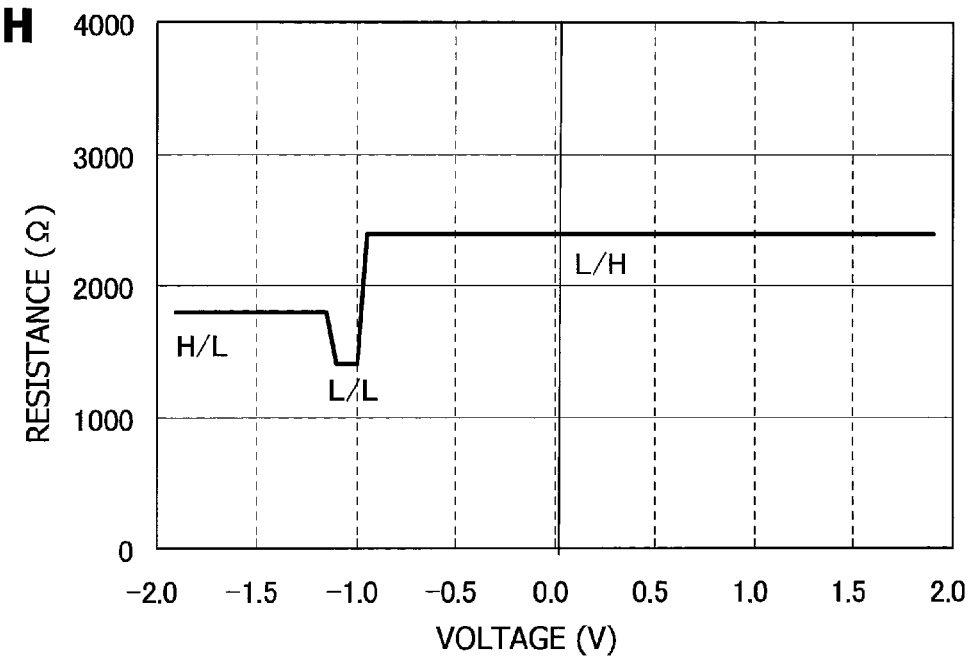
5th Simulation  L/H State

FIG. 6I

5th Simulation
Possible Subsequent State and Voltage for Transition

| Present State → Subsequent State→ | L/L | H/L | L/H | H/H |
|---|---|---|---|---|
| L/L | – | -1.15V | +0.85V | × |
| H/L | +0.4V | – | +0.85V | × |
| L/H | -1.0V | -1.15V | – | × |
| H/H | × | -1.15V | +0.6V | – |

6th Simulation L/L State

6th Simulation L/L State

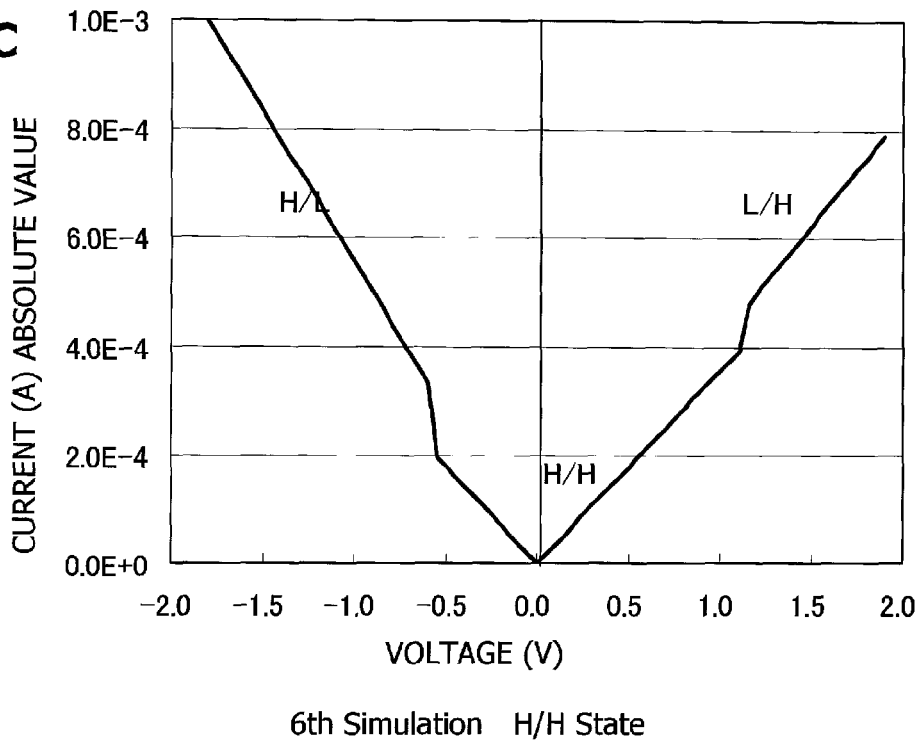
6th Simulation H/H State
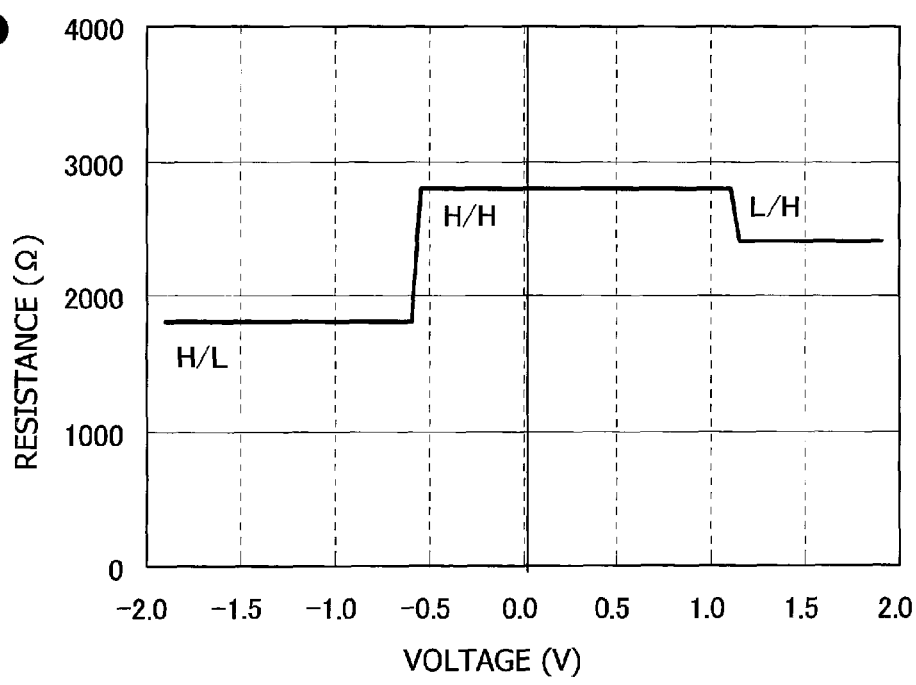
6th Simulation H/H State

6th Simulation H/L State

6th Simulation H/L State

6th Simulation  L/H State

6th Simulation  L/H State

FIG. 7I

6th Simulation
Possible Subsequent State and Voltage for Transition

| Present State ↓ | Subsequent State→ | L/L | H/L | L/H | H/H |
|---|---|---|---|---|---|
| | L/L | — | -0.85V | +1.15V | × |
| | H/L | +0.75V | — | +1.15V | × |
| | L/H | -0.5V | -0.85V | — | × |
| | H/H | × | -0.85V | +1.15V | — |

7th Simulation   L/L State

7th Simulation   L/L State

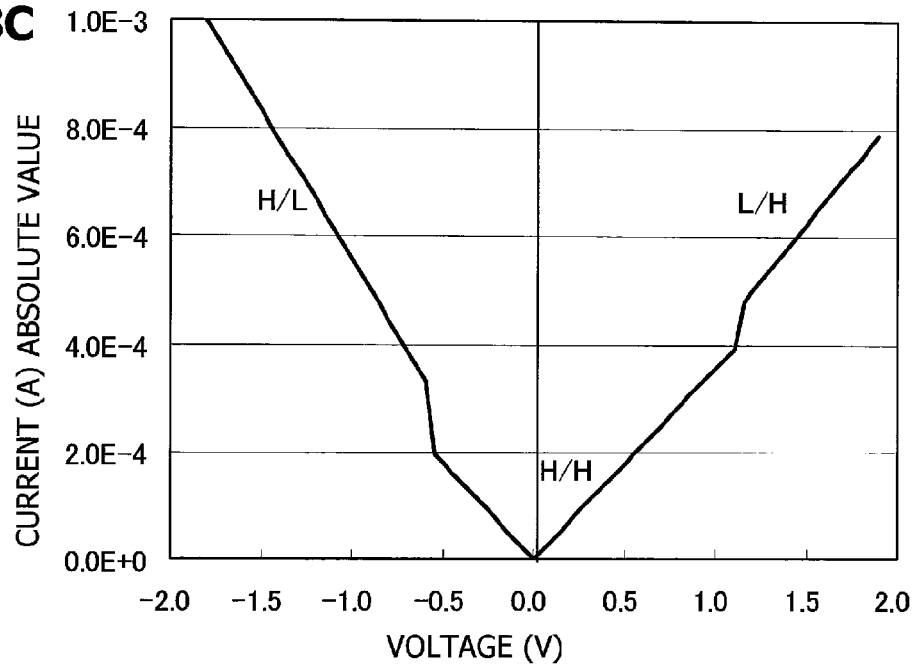
7th Simulation H/H State
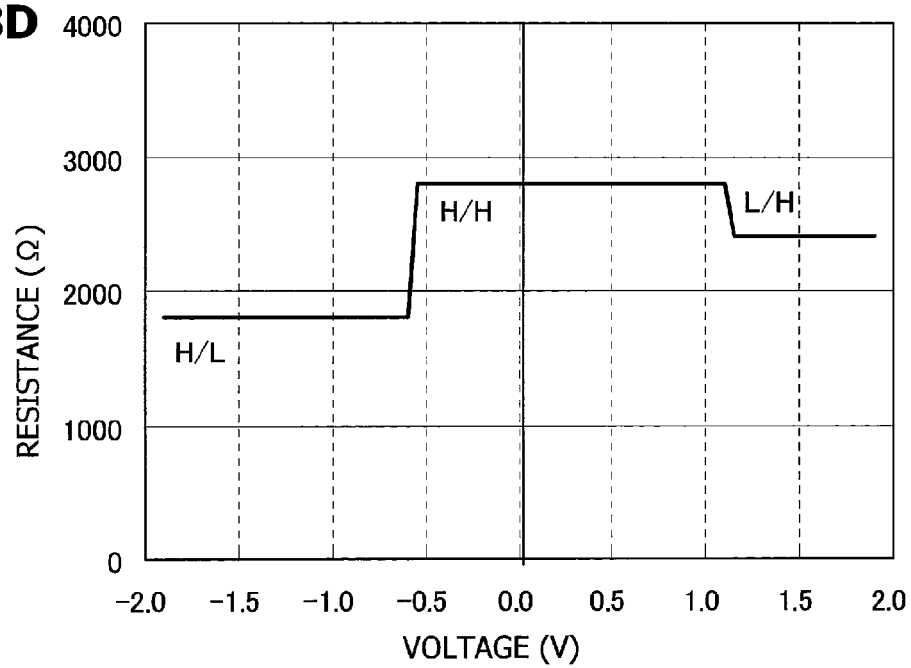
7th Simulation H/H State

7th Simulation H/L State

7th Simulation H/L State

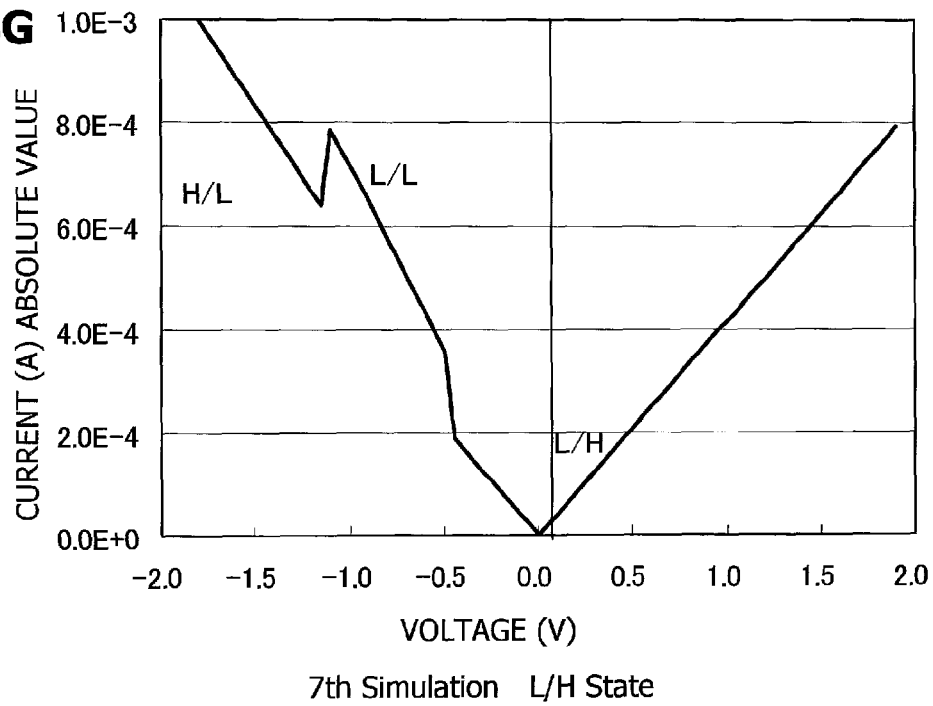
7th Simulation L/H State
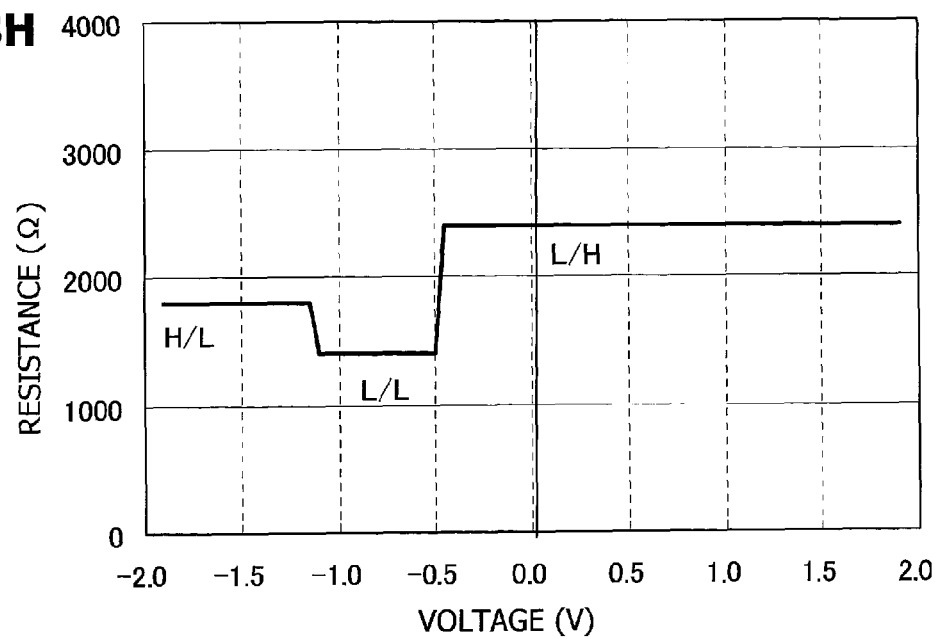
7th Simulation L/H State

FIG. 8I

7th Simulation
Possible Subsequent State and Voltage for Transition

| Present State → Subsequent State → | L/L | H/L | L/H | H/H |
|---|---|---|---|---|
| L/L | – | -1.15V | +0.85V | × |
| H/L | +0.75V | – | +0.85V | × |
| L/H | -0.5V | -1.15V | – | × |
| H/H | × | -0.6V | +1.15V | – |

FIG. 9A

| | | 1st Simulation |
|---|---|---|
| Conditions for Resistance and Threshold Current | Upper Part Resistance | L=750Ω  H=1500Ω |
| | Lower Part Resistance | L=750Ω  H=1500Ω |
| | Overall Resistance | L/L=1500Ω  H/L=2250Ω<br>L/H=2250Ω  H/H=3000Ω |
| | Upper Part Threshold Current | H to L:4E-4A   L to H:8E-4A |
| | Lower Part Threshold Current | H to L:4E-4A   L to H:8E-4A |
| Number of Available Resistance States | | 3 states: L/L, H/L, L/H<br>(transition impossible from non-H/H state to H/H state) |
| Number of Available Resistance Values | | 2 values: L/L, H/L(=L/H) |

| | | 2nd Simulation | 3rd Simulation |
|---|---|---|---|
| Conditions for Resistance and Threshold Current | Upper Part Resistance | L=400Ω  H=800Ω | L=400Ω  H=800Ω |
| | Lower Part Resistance | L=1000Ω  H=2000Ω | L=1000Ω  H=2000Ω |
| | Overall Resistance | L/L=1400Ω  H/L=1800Ω<br>L/H=2400Ω  H/H=2800Ω | L/L=1400Ω  H/L=1800Ω<br>L/H=2400Ω  H/H=2800Ω |
| | Upper Part Threshold Current | H to L:6E-4A   L to H:8E-4A | H to L:2E-4A   L to H:4E-4A |
| | Lower Part Threshold Current | H to L:2E-4A   L to H:4E-4A | H to L:6E-4A   L to H:8E-4A |
| Number of Available Resistance States | | 4 states: L/L, H/L, L/H, H/H | 4 states: L/L, H/L, L/H, H/H |
| Number of Available Resistance Values | | 4 values: L/L, H/L, L/H, H/H | 4 values: L/L, H/L, L/H, H/H |

FIG. 9B

| | | 4th Simulation | 5th Simulation |
|---|---|---|---|
| Conditions for Resistance and Threshold Current | Upper Part Resistance | L=400Ω  H=800Ω | L=400Ω  H=800Ω |
| | Lower Part Resistance | L=1000Ω  H=2000Ω | L=1000Ω  H=2000Ω |
| | Overall Resistance | L/L=1400Ω  H/L=1800Ω  L/H=2400Ω  H/H=2800Ω | L/L=1400Ω  H/L=1800Ω  L/H=2400Ω  H/H=2800Ω |
| | Upper Part Threshold Current | H to L:2E-4A   L to H:6E-4A | H to L:2E-4A   L to H:8E-4A |
| | Lower Part Threshold Current | H to L:4E-4A   L to H:8E-4A | H to L:4E-4A   L to H:6E-4A |
| Number of Available Resistance States | | 3 states: L/L, H/L, L/H (transition impossible from non-H/H state to H/H state) | 3 states: L/L, H/L, L/H (transition impossible from non-H/H state to H/H state) |
| Number of Available Resistance Values | | 3 values: L/L, H/L, L/H | 3 values: L/L, H/L, L/H |

| | | 6th Simulation | 7th Simulation |
|---|---|---|---|
| Conditions for Resistance and Threshold Current | Upper Part Resistance | L=400Ω  H=800Ω | L=400Ω  H=800Ω |
| | Lower Part Resistance | L=1000Ω  H=2000Ω | L=1000Ω  H=2000Ω |
| | Overall Resistance | L/L=1400Ω  H/L=1800Ω  L/H=2400Ω  H/H=2800Ω | L/L=1400Ω  H/L=1800Ω  L/H=2400Ω  H/H=2800Ω |
| | Upper Part Threshold Current | H to L:4E-4A   L to H:6E-4A | H to L:4E-4A   L to H:6E-4A |
| | Lower Part Threshold Current | H to L:2E-4A   L to H:8E-4A | H to L:2E-4A   L to H:8E-4A |
| Number of Available Resistance States | | 3 states: L/L, H/L, L/H (transition impossible from non-H/H state to H/H state) | 3 states: L/L, H/L, L/H (transition impossible from non-H/H state to H/H state) |
| Number of Available Resistance Values | | 3 values: L/L, H/L, L/H | 3 values: L/L, H/L, L/H |

FIG. 10F

|  | Material | Film Thickness (nm) | | | | | | |
|---|---|---|---|---|---|---|---|---|
|  |  | Simulation Number | | | | | | |
|  |  | 1 | 2 | 3 | 4 | 5 | 6 | 7 |
| Upper Electrode | Ta | 40 | 40 | 40 | 40 | 40 | 40 | 40 |
|  | Ru | 10 | 10 | 10 | 10 | 10 | 10 | 10 |
| Free Magnetic Layer | CoFeB | 2.0 | 2.2 | 1.8 | 1.8 | 1.8 | 2.2 | 2.0 |
| Tunnel Insulating layer | MgO | 0.8 | 0.75 | 0.75 | 0.75 | 0.75 | 0.75 | 0.75 |
| Fixed Magnetic Layer | CoFeB | 3.0 | 3.2 | 3.2 | 3.0 | 3.4 | 3.0 | 3.2 |
| Antiferromagnetic Layer | PtMn | 15 | 15 | 15 | 15 | 15 | 15 | 15 |
| Fixed Magnetic Layer | CoFeB | 3.0 | 3.2 | 3.2 | 3.2 | 3.0 | 3.4 | 3.2 |
| Tunnel Insulating layer | MgO | 0.8 | 0.85 | 0.85 | 0.85 | 0.85 | 0.85 | 0.85 |
| Free Magnetic Layer | CoFeB | 2.0 | 1.8 | 2.2 | 2.0 | 2.0 | 1.8 | 1.8 |
| Lower Electrode | Ta | 20 | 20 | 20 | 20 | 20 | 20 | 20 |

MAGNETORESISTANCE ELEMENT AND SEMICONDUCTOR MEMORY DEVICE

CROSS-REFERENCE TO RELATED APPLICATION

This application is based upon and claims the benefit of priority of the prior International Patent Application No. PCT/JP2010-005085, filed on Aug. 17, 2010, the entire contents of which are incorporated herein by reference.

FIELD

The embodiments discussed herein are related to a magnetoresistance element and a semiconductor memory device.

BACKGROUND

Active efforts have been made for development of storage cells that contain a magnetoresistance element consisting mainly of a tunnel insulating layer interposed between a free magnetization layer and a fixed magnetization layer. The magnetization direction of the fixed magnetization layer is fixed while that of the free magnetization layer is variable. Accordingly, a low resistance state where the magnetization direction of the fixed magnetization layer and that of the free magnetization layer coincide with each other and a high resistance state where the magnetization direction of the fixed magnetization layer and that of the free magnetization layer are in opposite directions can be switched by changing the magnetization direction of the free magnetization layer.

The known methods for changing the magnetization direction of a free magnetization layer include the use of an external magnetic field (for instance, see Japanese Unexamined Patent Publication (Kokai) No. 2009-152594), and the use of the spin torque effect of an electric current flowing through a magnetoresistance element.

SUMMARY

According to one aspect of the present invention, a magnetoresistance element includes: a first magnetoresistance subelement including a first free magnetization layer, a first tunnel insulating layer and a first fixed magnetization layer, the first tunnel insulating layer interposed between the first free magnetization layer and the first fixed magnetization layer, a magnetization direction of the first free magnetization layer changing according to an electric current flowing in a thickness direction of the first magnetoresistance subelement, and a resistance of the first magnetoresistance subelement changing between a low resistance state and a high resistance state according to the magnetization direction of the first free magnetization layer; and a second magnetoresistance subelement including a second free magnetization layer, a second tunnel insulating layer and a second fixed magnetization layer, the second tunnel insulating layer interposed between the second free magnetization layer and the second fixed magnetization layer, a magnetization direction of the second free magnetization layer changing according to an electric current flowing in a thickness direction of the second magnetoresistance subelement, and a resistance of the second magnetoresistance subelement changing between a low resistance state and a high resistance state according to the magnetization direction of the second free magnetization layer, wherein the first and second magnetoresistance subelements are stacked each other, and an order of the first free magnetization layer and the first fixed magnetization layer is opposite to an order of the second free magnetization layer and the second fixed magnetization layer in a thickness direction of the magnetoresistance element.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 2A and 2B are a graph illustrating a relation between applied voltage and electric current and a graph illustrating a relation between applied voltage and resistance in the course of transition from an L/L state examined in a first simulation.

FIGS. 2E and 2F are a graph illustrating a relation between applied voltage and electric current and a graph illustrating a relation between applied voltage and resistance in the course of transition from an H/L state examined in the first simulation.

FIG. 2I gives a table that lists different cases of transition from a present state to a possible subsequent state, along with the voltage necessary for the transition to each subsequent state, examined in the first simulation.

FIGS. 3A and 3B are a graph illustrating a relation between applied voltage and electric current and a graph illustrating a relation between applied voltage and resistance in the course of transition from an L/L state examined in a second simulation.

FIGS. 3C and 3D are a graph illustrating a relation between applied voltage and electric current and a graph illustrating a relation between applied voltage and resistance in the course of transition from an H/H state examined in the second simulation.

FIG. 3I gives a table that lists different cases of transition from a present state to a possible subsequent state, along with the voltage necessary for the transition to each subsequent state, examined in the second simulation.

FIGS. 4G and 4H are a graph illustrating a relation between applied voltage and electric current and a graph illustrating a relation between applied voltage and resistance in the course of transition from an L/H state examined in the third simulation.

FIG. 4I gives a table that lists different cases of transition from a present state to a possible subsequent state, along with the voltage necessary for the transition to each subsequent state, examined in the third simulation.

FIG. 5I gives a table that lists different cases of transition from a present state to a possible subsequent state, along with the voltage necessary for the transition to each subsequent state, examined in the fourth simulation.

FIGS. 6C and 6D are a graph illustrating a relation between applied voltage and electric current and a graph illustrating a relation between applied voltage and resistance in the course of transition from an H/H state examined in the fifth simulation.

FIGS. 6E and 6F are a graph illustrating a relation between applied voltage and electric current and a graph illustrating a relation between applied voltage and resistance in the course of transition from an H/L state examined in the fifth simulation.

FIGS. 6G and 6H are a graph illustrating a relation between applied voltage and electric current and a graph illustrating a relation between applied voltage and resistance in the course of transition from an L/H state examined in the fifth simulation.

FIG. 6I gives a table that lists different cases of transition from a present state to a possible subsequent state, along with the voltage necessary for the transition to each subsequent state, examined in the fifth simulation.

FIGS. 7C and 7D are a graph illustrating a relation between applied voltage and electric current and a graph illustrating a relation between applied voltage and resistance in the course of transition from an H/H state examined in the sixth simulation.

FIG. 7I gives a table that lists different cases of transition from a present state to a possible subsequent state, along with the voltage necessary for the transition to each subsequent state, examined in the sixth simulation.

FIGS. 8C and 8D are a graph illustrating a relation between applied voltage and electric current and a graph illustrating a relation between applied voltage and resistance in the course of transition from an H/H state examined in the seventh simulation.

FIGS. 8G and 8H are a graph illustrating a relation between applied voltage and electric current and a graph illustrating a relation between applied voltage and resistance in the course of transition from an L/H state examined in the seventh simulation.

FIG. 8I gives a table that lists different cases of transition from a present state to a possible subsequent state, along with the voltage necessary for the transition to each subsequent state, examined in the seventh simulation.

FIGS. 9A and 9B give tables that summarize results of the first to seventh simulations.

FIG. 10D is an enlarged schematic cross section view illustrating the vicinity of the magnetoresistance element according to the first embodiment, while

FIG. 10F gives a table listing the material and film thickness of each layer that is located between the lower electrode and the upper electrode assumed in the first to seventh simulations that address the magnetoresistance element according to the first embodiment.

DESCRIPTION OF EMBODIMENTS

First, described below are general characteristics of magnetoresistance elements. Structurally, a magnetoresistance element contains a tunnel insulating layer interposed between a free magnetization layer and a fixed magnetization layer. The fixed magnetization layer and the free magnetization layer have the feature that the magnetization direction of the fixed magnetization layer is fixed while the magnetization direction of the free magnetization layer is variable.

The magnetoresistance element is in a low resistance state when the magnetization direction of the free magnetization layer is identical with the magnetization direction of the fixed magnetization layer, whereas the magnetoresistance element is in a high resistance state when the magnetization direction of the free magnetization layer is opposite to the magnetization direction of the fixed magnetization layer. A magnetoresistance element can be switched between a high and a low resistance state by changing the magnetization direction of the free magnetization layer, and accordingly, it can serve as a storage cell if it is structured so that the high and the low resistance state represent 0 or 1, respectively.

The known methods for changing the magnetization direction of the free magnetization layer, that is, for switching the resistance state, include the use of an external magnetic field generated by an electric current supplied through a specific wiring line (often called write word line) (write wiring type), and use of the spin torque effect of an electric current supplied through the magnetoresistance element itself in its thickness direction (spin injection type).

In a spin injection type element, an electric current is supplied from the free magnetization layer to the fixed magnetization layer to change the resistance state from a high resistance state to a low resistance state, or on the contrary, an electric current is supplied from the fixed magnetization layer to the free magnetization layer to change the resistance state from a low resistance state to high resistance state.

Figure 13:
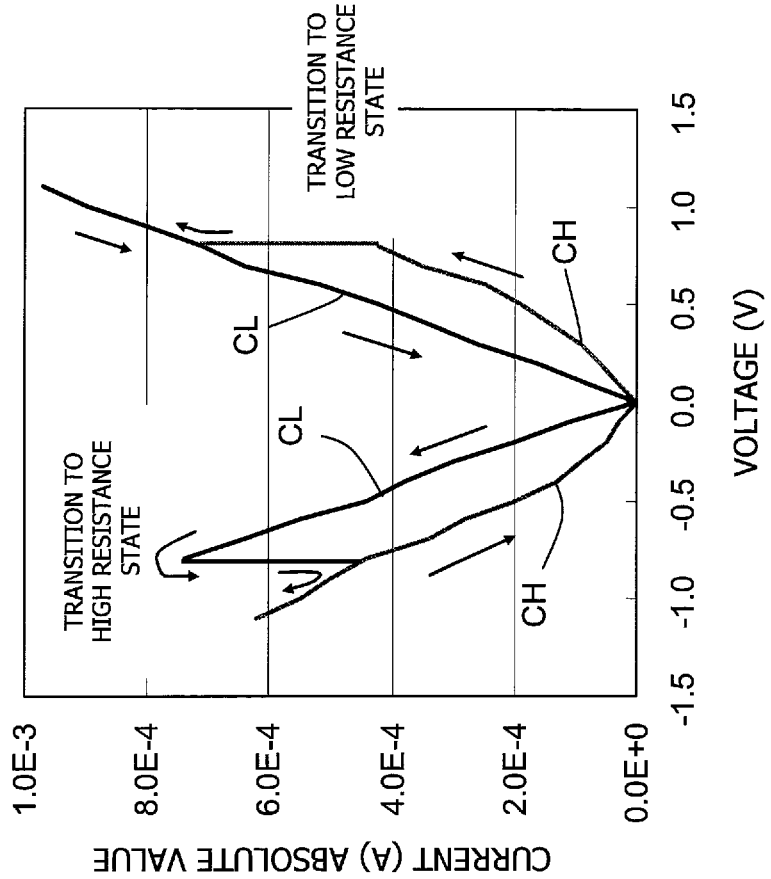
FIG. 13 is a graph illustrating the resistance state transition process in a spin injection type magnetoresistance element (subelement).

FIG. 13 is a graph illustrating the resistance state transition process in a spin injection type magnetoresistance element. The direction of a current flow from a free magnetization layer to a fixed magnetization layer is defined as positive while the direction a current flow from the fixed magnetization layer to a free magnetization layer is defined as minus. In the graph, the horizontal axis represents the applied voltage while the longitudinal axis represents the current value (quantity of electric current). To show a current value, $10^{-N}$ is denoted as E-N.

The following description is started with a high resistance state as initial state. As a positive applied voltage is increased from zero, the positive directional current increases along a voltage-current characteristic curve CH in the high resistance range. As the current value reaches a threshold of about 4E-4, transition to a low resistance state takes place and subsequently, the current value increases sharply to about 7E-4.

As the positive voltage is further increased after the transition into a low resistance state, the positive directional current increases along a voltage-current characteristic curve CL in the low resistance range. Compared with this, as a positive voltage is decreased from the value at the point of transition into a low resistance state, the positive directional current decreases along the voltage-current characteristic curve CL in the low resistance range. The low resistance state is maintained until the positive voltage reaches zero.

As a negative voltage is increased from zero, the negative directional current continues to increase along the voltage-current characteristic curve CL in the low resistance range. As the current value reaches a threshold of about 7E-4, transition to a high resistance state takes place and subsequently, the current value decreases sharply to about 4E-4.

As the negative voltage is further increased after the transition into a high resistance state, the negative directional current increases along the voltage-current characteristic curve CH in the high resistance range. Compared with this, as the negative voltage is decreased from the value at the point of transition into a high resistance state, the negative directional current decreases along the voltage-current characteristic curve CH in the high resistance range. The high resistance state is maintained until the negative voltage reaches zero.

This suggests that application of a positive directional current above the threshold can cause transition from a high resistance state to a low resistance state. Transition will not take place in a low resistance state if a positive directional current is applied. Application of a negative directional current higher than the threshold can cause transition from a lower resistance state to a higher resistance state. Transition will not take place in a high resistance state if a negative directional current is applied.

It is noted here that as seen in FIG. 13, the threshold current value for the transition from a low resistance state to a high resistance state tends to be higher than the threshold current value for the transition from a high resistance state to a low resistance state.

Outlined below is the structure and workings of a magnetoresistance element according to the first embodiment of the invention.

Figure 1:
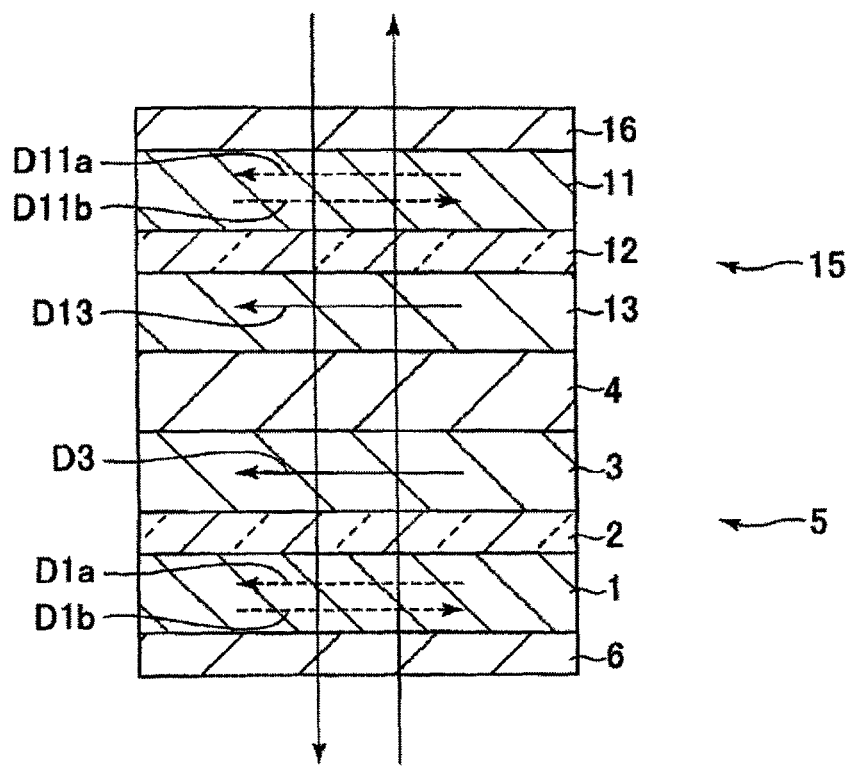
FIG. 1 is a schematic cross section view of a magnetoresistance element according to a first embodiment.

FIG. 1 is a schematic cross section view of a magnetoresistance element according to the first embodiment. A free magnetization layer 1 is formed on a lower electrode 6; a tunnel insulating layer 2 is formed on the free magnetization layer 1; and a fixed magnetization layer 3 is formed on the tunnel insulating layer 2. An antiferromagnetic layer 4 is formed on the fixed magnetization layer 3, and a fixed magnetization layer 13 is formed on the antiferromagnetic layer 4. A tunnel insulating layer 12 is formed on the fixed magnetization layer 13; a free magnetization layer 11 is formed on the tunnel insulating layer 12; and an upper electrode 16 is formed on the free magnetization layer 11.

The tunnel insulating layer 2 is interposed between the free magnetization layer 1 and the fixed magnetization layer 3 to form a lower magnetoresistance element 5, while the tunnel insulating layer 12 is interposed between the free magnetization layer 11 and the fixed magnetization layer 13 to form an upper magnetoresistance element 15. The lower magnetoresistance element 5 and the upper magnetoresistance element 15, in which a free magnetization layer, tunnel insulating layer, fixed magnetization layer are stacked in the reversed orders, are stacked with an antiferromagnetic layer 4 interposed in between.

For easy understanding of the following description, the entire magnetoresistance element according to the first embodiment is hereinafter referred as a magnetoresistance element while the two parts, namely, the magnetoresistance element 5 and the magnetoresistance element 15 included in the former, are each referred to as a magnetoresistance subelement.

The antiferromagnetic layer 4 is interposed between the fixed magnetization layer 13 of the upper magnetoresistance subelement 15 and the fixed magnetization layer 3 of the lower magnetoresistance subelement 5 and works to fix the magnetization direction of the fixed magnetization layer 13 and the fixed magnetization layer 3. The free magnetization layer 11 of the upper magnetoresistance subelement 15 and the free magnetization layer 1 of the lower magnetoresistance subelement 5 are disposed above and below the fixed magnetization layer 13 and the fixed magnetization layer 3, respectively.

The upper magnetoresistance subelement 15 is in a low resistance state when as indicated by an arrow D11a, the magnetization direction of the free magnetization layer 11 is identical with the magnetization direction of the fixed magnetization layer 13 denoted by an arrow D13. The upper magnetoresistance subelement 15 is in a high resistance state when as indicated by an arrow D11b, the magnetization direction of the free magnetization layer 11 is opposed to the magnetization direction of the fixed magnetization layer 13 denoted by the arrow D13.

The upper magnetoresistance subelement 5 is in a low resistance state when as indicated by an arrow D1a, the magnetization direction of the free magnetization layer 1 identical with the magnetization direction of the fixed magnetization layer 3 denoted by an arrow D3. The lower magnetoresistance subelement 5 is in a high resistance state when as indicated by an arrow D1b, the magnetization direction of the free magnetization layer 1 is opposed to the magnetization direction of the fixed magnetization layer 3 denoted by the arrow D3.

The magnetoresistance element according to the first embodiment can be in one of the following four resistance states: both the upper magnetoresistance subelement 15 and the lower magnetoresistance subelement 5 are in a high resistance state; the upper magnetoresistance subelement 15 is in a low resistance state while the lower magnetoresistance subelement 5 is in a high resistance state; the upper magnetoresistance subelement 15 is in a high resistance state while the lower magnetoresistance subelement 5 is in a low resistance state; and both the upper magnetoresistance subelement 15 and the lower magnetoresistance subelement 5 are in a low resistance state.

The magnetization direction of the free magnetization layer 1 and that of the free magnetization layer 11 are switched by supplying a current to the magnetoresistance element itself. This means that the magnetoresistance element according to the first embodiment is of the spin injection type. Here, the direction pointing from the free magnetization layer 11 toward the fixed magnetization layer 13 of the upper magnetoresistance subelement 15, or the direction pointing from the fixed magnetization layer 3 toward the free magnetization layer 1 of the lower magnetoresistance subelement 5, is defined as positive current direction. On the other hand, the direction pointing from the fixed magnetization layer 13 toward the free magnetization layer 11 of the upper magnetoresistance subelement 15, or the direction pointing from the free magnetization layer 1 toward the fixed magnetization layer 3 of the lower magnetoresistance subelement 5 is defined as negative current direction. In FIG. 1, the positive current direction is denoted by an arrow pointing from the top to the bottom while the negative current direction is denoted by an arrow pointing from the bottom to the top.

A positive directional current causes transition from a high resistance state to a low resistance state in the upper magnetoresistance subelement 15 and causes transition from a low resistance state to a high resistance state in the lower magnetoresistance subelement 5. A positive directional current then maintains a low resistance state, rather than causing any transition, in the upper magnetoresistance subelement 15, and maintains a high resistance state, rather than causing any transition, in the lower magnetoresistance subelement 5.

A negative directional current, on the other hand, causes transition from a low resistance state to a high resistance state in the upper magnetoresistance subelement 15 and causes transition from a high resistance state to a low resistance state in the lower magnetoresistance subelement 5. A negative directional current then maintains a high resistance state, rather than causing any transition, in the upper magnetoresistance subelement 15, and maintains a low resistance state, rather than causing any transition, in the lower magnetoresistance subelement 5.

Thus, in the magnetoresistance element according to the first embodiment, layers are stacked in the reversed manner in the upper magnetoresistance subelement 15 and the lower magnetoresistance subelement 5, and accordingly, a current in a direction causes resistance state transition in the reversed directions in the upper magnetoresistance subelement 15 and the lower magnetoresistance subelement 5.

Here, if the upper magnetoresistance subelement 15 in which transition from a high resistance state to a low resistance state is caused by a positive directional current while transition from a low resistance state to a high resistance state is caused by a negative directional current is referred to as normal type, then the lower magnetoresistance subelement 15 in which transition from a high resistance state to a low resistance state is caused by a negative directional current while transition from a low resistance state to a high resistance state is caused by a positive directional current can be referred to as inverted type.

Described next are a first to seventh simulations that examined the behavior of the magnetoresistance element according to the first embodiment at a varied resistance and threshold current value for transition in each magnetoresistance subelement.

To avoid complication in the following description, the upper magnetoresistance subelement and the lower magnetoresistance subelement are simply referred to as the upper part and the lower part, respectively. Furthermore, a high resistance state and a low resistance state in the upper part or the lower part are represented by H and L, respectively. By giving the resistance state in the lower part at the denominator position and giving the resistance state in the upper part at the numerator position, the resistance state of the entire magnetoresistance element will be denoted as L/L, H/H, H/L, or L/H.

For the first to seventh simulations, A, C, E, and G annexed to FIGS. 2 to 8 indicate graphs illustrating a relation between applied voltage and current value, while B, D, F, and H annexed to FIGS. 2 to 8 indicate graphs illustrating a relation between applied voltage and resistance.

The first simulation is as described below. For the first simulation, the resistance value is 750Ω in the low resistance state and 1,500Ω in the high resistance state in the upper part, and it is also 750Ω in the low resistance state and 1,500Ω in the high resistance state in the lower part. The threshold current value is 4E-4A for transition from the high resistance state to the low resistance state and 8E-4A for transition from the low resistance state to the high resistance state in the upper part, and it is also 4E-4A for transition from the high resistance state to the low resistance state and 8E-4A for transition from the low resistance state to the high resistance state in the lower part.

The resistance of the entire magnetoresistance element is 1,500Ω in the L/L state, 2,250Ω in the H/L state, 2,250Ω in the L/H state, and 3,000Ω in the H/H state. Conditions including resistance for the first to seventh simulations are summarized in the tables given in FIGS. 9A and 9B.

Transition from the L/L state is described first with reference to FIGS. 2A and 2B. When a positive voltage is applied, the L/L state shifts to the L/H state as a result of transition to the H state in the lower part at a threshold current value of 8E-4A. If the positive voltage is increased further, the upper part is already in the L state and will not undergo further transition.

Transition between resistance states can be controlled by changing the applied voltage. A state brought about by transition can be stable above a certain voltage slightly higher than the voltage that gives the threshold current value. Application of a positive voltage of 1.25V or more causes transition from the L/L state to the L/H state.

When a negative voltage is applied, on the other hand, the L/L state shifts to the H/L state as a result of transition to the H state in the upper part at a threshold current value of 8E-4A. If the negative voltage is increased further, the lower part is already in the L state and will not undergo further transition. Application of a negative voltage of 1.25V or more causes transition from the L/L state to the H/L state.

Here, a method used to determine a resistance state is described with reference to FIG. 2A as an example. When transition from the L/L state to the L/H state has taken place as a result of application of a positive voltage, for instance, the L/H state will be maintained until transition to another state occurs. The magnetoresistance element is maintained in the L/H state even in a lower voltage region than the voltage that gave the threshold current value for transition to the L/H state. The voltage-current characteristics in the L/H state are represented by the curve CLH (illustrated in the positive voltage range).

Thus, the overall resistance state of a magnetoresistance element can be determined by applying a small voltage (for instance, 0.3V) that causes no transition between any states and determining the resistance based on current value measurement.

Figure 2C:
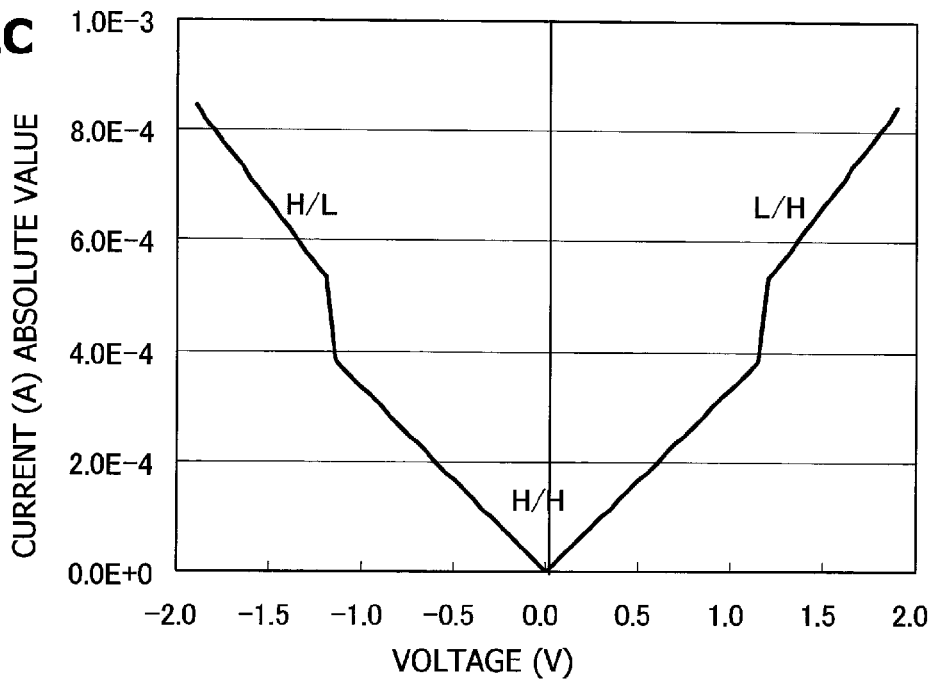
FIGS. 2C and 2D are a graph illustrating a relation between applied voltage and electric current and a graph illustrating a relation between applied voltage and resistance in the course of transition from an H/H state examined in the first simulation.
Figure 2D:
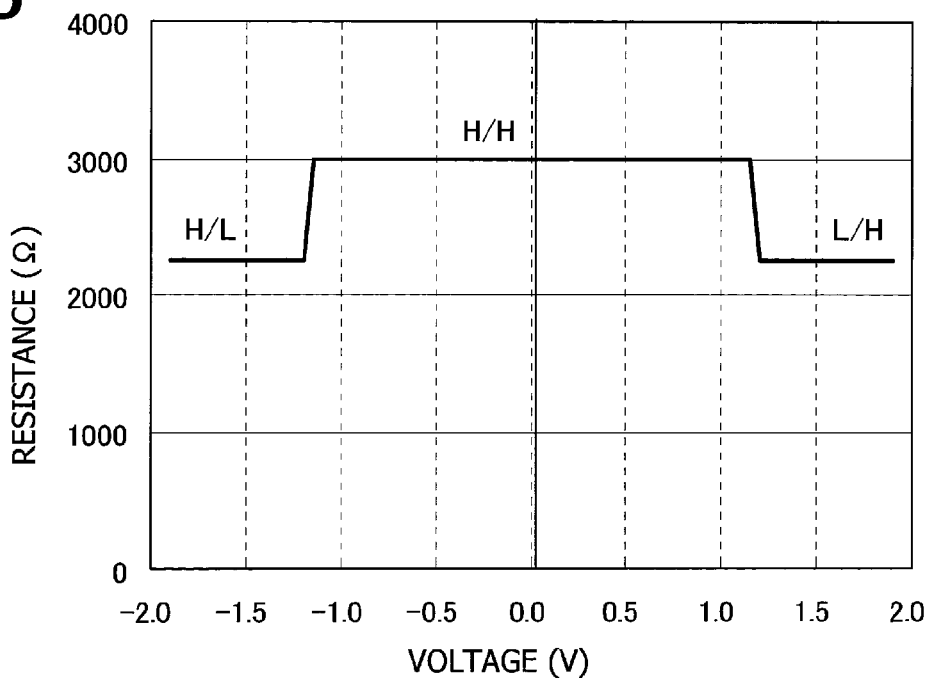

Transition from the H/H state is described next with reference to FIGS. 2C and 2D. When a positive voltage is applied, the H/H state shifts to the L/H state as a result of transition to the L state in the upper part at a threshold current value of 4E-4A. If the positive voltage is increased further, the lower part is already in the H state and will not undergo further transition. Application of a positive voltage of 1.2V or more causes transition from the H/H state to the L/H state.

When a negative voltage is applied, on the other hand, the H/H state shifts to the H/L state as a result of transition to the L state in the lower part at a threshold current value of 4E-4A. If the negative voltage is increased further, the upper part is already in the H state and will not undergo further transition. Application of a negative voltage of 1.2V or more causes transition from the H/H state to the H/L state.

Transition from the H/L state is described next with reference to FIGS. 2E and 2F. When a positive voltage is applied, the H/L state shifts to the L/L state as a result of transition to the L state in the upper part at a threshold current value of 4E-4A. As the positive voltage is increased further, this state shifts to the L/H state as a result of transition to the H state in the lower part at the threshold current value of 8E-4A. Application of a positive voltage of 1.0V or more but less than 1.25V where transition to the L/H state does not take place causes transition from the H/L state to the L/L state. Application of a positive voltage of 1.25V or more causes transition from the H/L state to the L/H state.

If a negative voltage is applied, on the other hand, no transition from the H/L state will take place because the upper part is already in the H state and the lower part is already in the L state.

Figure 2G:
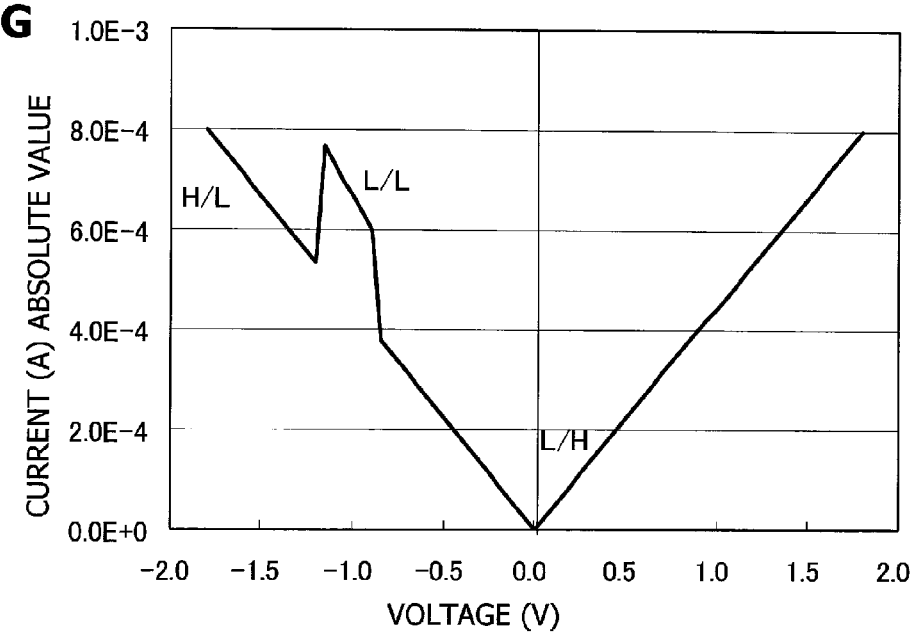
FIGS. 2G and 2H are a graph illustrating a relation between applied voltage and electric current and a graph illustrating a relation between applied voltage and resistance in the course of transition from an L/H state examined in the first simulation.
Figure 2H:
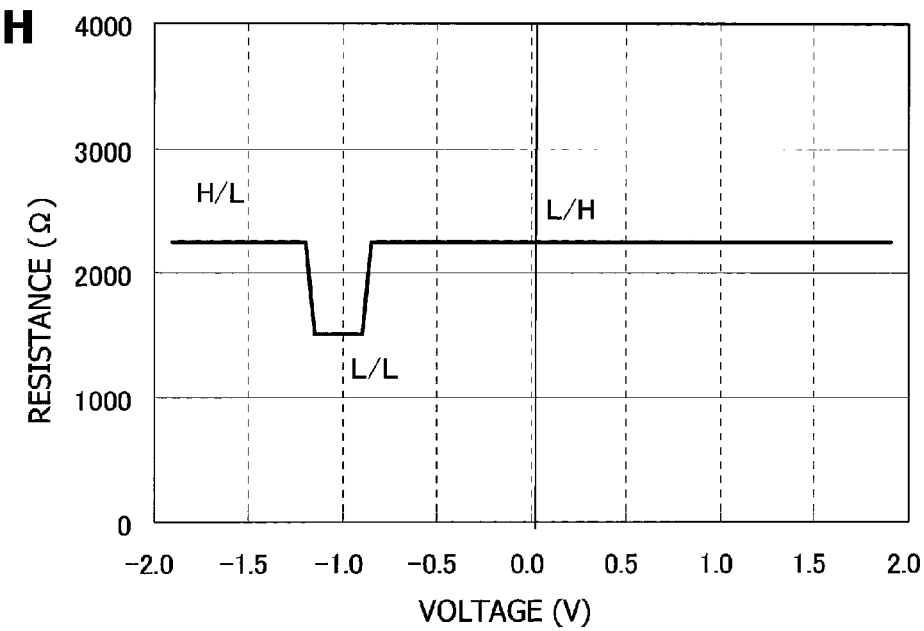

Transition from the L/H state is described next with reference to FIGS. 2G and 2H. If a positive voltage is applied, no transition from the L/H state will take place because the upper part is already in the L state and the lower part is already in the H state.

When a negative voltage is applied, on the other hand, the L/H state shifts to the L/L state as a result of transition to the L state in the lower part at a threshold current value of 4E-4A. As the negative voltage is increased further, this state shifts to the H/L state as a result of transition to the H state in the upper part at the threshold current value of 8E-4A. Application of a negative voltage of 0.9V or more but less than about 1.2V where transition to the H/L state does not take place causes transition from the L/H state to the L/L state. Application of a negative voltage of 1.2V or more causes transition from the L/H state to the H/L state.

FIG. 2I summarizes different cases of transition from a present state to a possible subsequent state, along with the voltage necessary for transition to each subsequent state, examined in the first simulation.

Under the conditions for the first simulation, transition can take place between any pair of the three states of L/L, H/L, and L/H. It is impossible for the three states of L/L, H/L, and L/H, however, to undergo transition to the H/H state.

A storage cell that makes use of the three states of L/L, H/L, and L/H can be developed by using the magnetoresistance element according to the first embodiment under the conditions for the first simulation. However, the resistance in the case of the H/L state is equal to that in the case of the L/H state under the conditions for the first simulation. Accordingly, although the three states of L/L, H/L, L/H are available, the magnetoresistance element can have only two resistance values of 1,500Ω and 2,250Ω which correspond to the L/L state and the H/L or L/H state, respectively. Under the conditions for the first simulation, therefore, the magnetoresistance element according to the first embodiment can serve as a binary storage cell.

The second simulation is as described below. For the second simulation, the resistance value is 400Ω in the low resistance state and 800Ω in the high resistance state in the upper part, and it is 1,000Ω in the low resistance state and 2,000Ω in the high resistance state in the lower part. The overall resistance value of the magnetoresistance element is 1,400Ω in the L/L state, 1,800Ω for the H/L state, 2,400Ω in the L/H state, and 2,800Ω in the H/H state.

The threshold current value is 6E-4A for transition from the high resistance state to the low resistance state and 8E-4A for transition from the low resistance state to the high resistance state in the upper part, and it is 2E-4A for transition from the high resistance state to the low resistance state and 4E-4A for transition from the low resistance state to the high resistance state in the lower part.

Transition from the L/L state is described first with reference to FIGS. 3A and 3B. When a positive voltage is applied, the L/L state shifts to the L/H state as a result of transition to the H state in the lower part at the threshold current value of 4E-4A. Application of a positive voltage of 0.6V or more causes transition from the L/L state to the L/H state.

When a negative voltage is applied, on the other hand, the L/L state shifts to the H/L state as a result of transition to the H state in the upper part at a threshold current value of 8E-4A. Application of a negative voltage of 1.25V or more causes transition from the L/L state to the H/L state.

Transition from the H/H state is described next with reference to FIGS. 3C and 3D. When a positive voltage is applied, the H/H state shifts to the L/H state as a result of transition to the L state in the upper part at a threshold current value of 6E-4A. Application of a positive voltage of 1.7V or more causes transition from the H/H state to the L/H state.

When a negative voltage is applied, on the other hand, the H/H state shifts to the H/L state as a result of transition to the L state in the lower part at a threshold current value of 2E-4A. Application of a negative voltage of 0.6V or more causes transition from the H/H state to the H/L state.

Figure 3E:
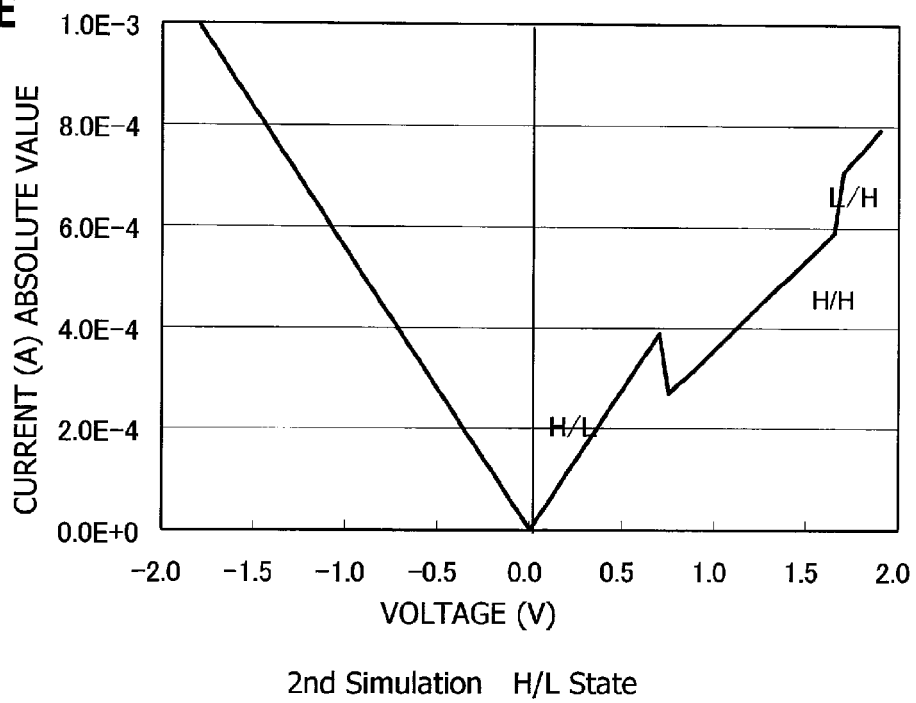
FIGS. 3E and 3F are a graph illustrating a relation between applied voltage and electric current and a graph illustrating a relation between applied voltage and resistance in the course of transition from an H/L state examined in the second simulation.
Figure 3F:
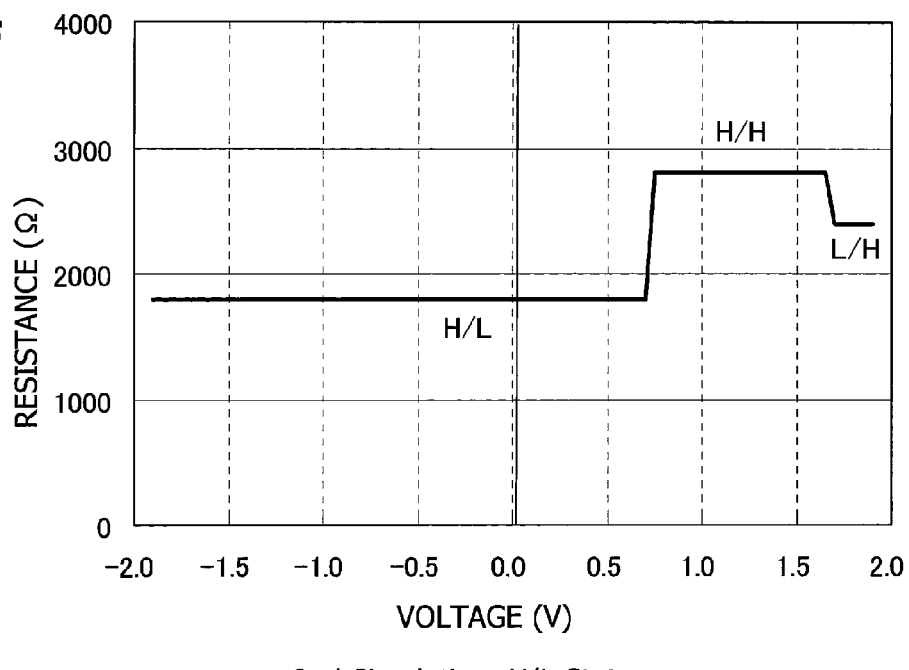

Transition from the H/L state is described next with reference to FIGS. 3E and 3F. When a positive voltage is applied, the H/L state shifts to the H/H state as a result of transition to the H state in the lower part at the threshold current value of 4E-4A. As the positive voltage is increased further, this state shifts to the L/H state as a result of transition to the L state in the upper part at the threshold current value of 6E-4A. Application of a positive voltage of 0.75V or more but less than about 1.70V where transition to the L/H state does not take place causes transition from the H/L state to the H/H state. Application of a positive voltage of 1.70V or more causes transition from the H/L state to the L/H state.

If a negative voltage is applied, on the other hand, no transition from the H/L state will take place because the upper part is already in the H state and the lower part is already in the L state.

Figure 3G:
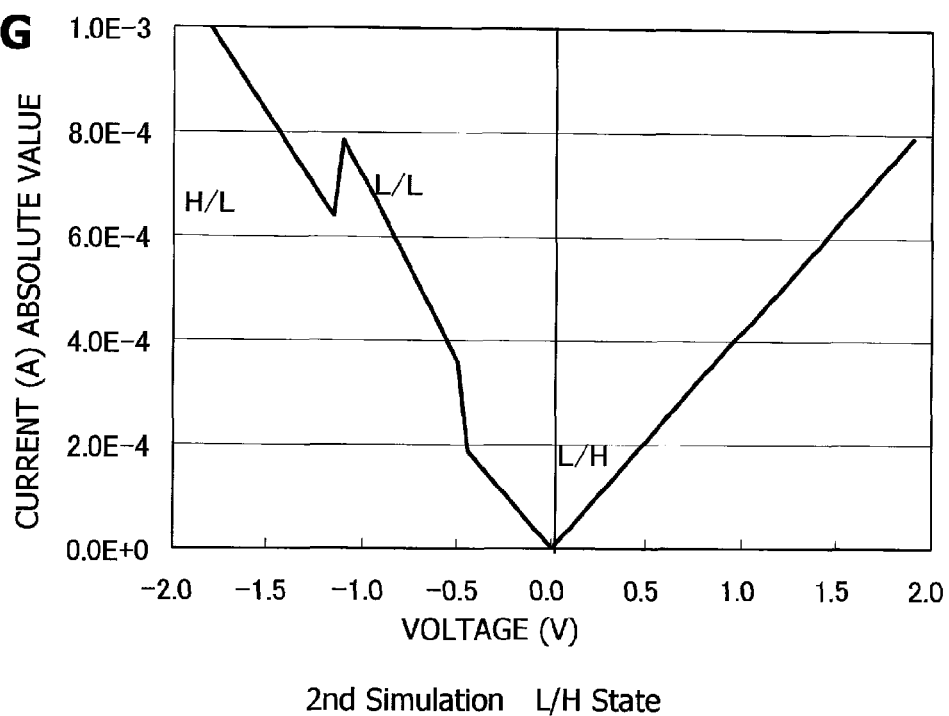
FIGS. 3G and 3H are a graph illustrating a relation between applied voltage and electric current and a graph illustrating a relation between applied voltage and resistance in the course of transition from an L/H state examined in the second simulation.
Figure 3H:
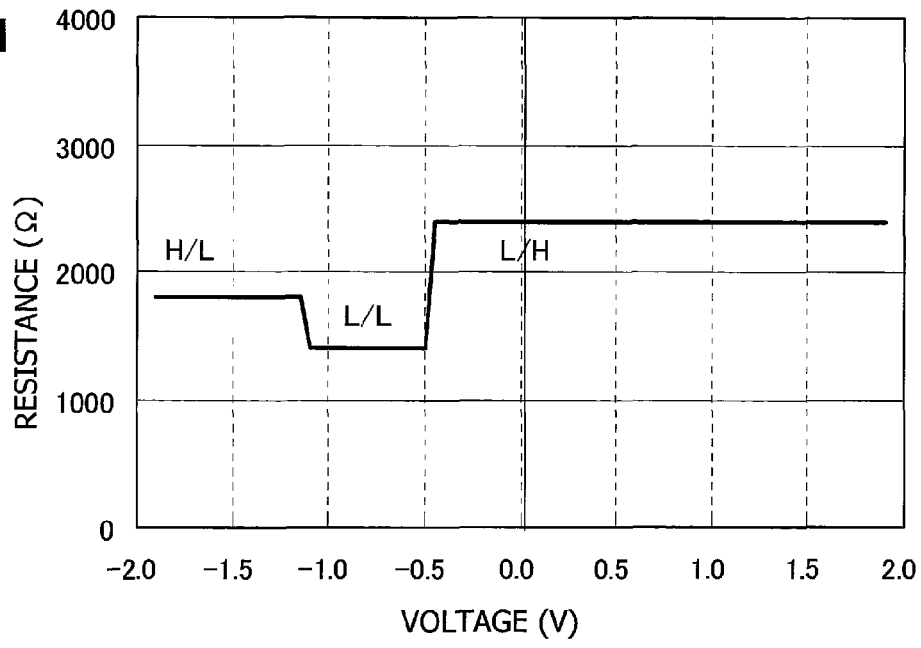

Transition of resistance from the L/H state is described next with reference to FIGS. 3G and 3H.

If a positive voltage is applied, no transition from the L/H state will take place because the upper part is already in the L state and the lower part is already in the H state.

When a negative voltage is applied, on the other hand, the L/H state shifts to the L/L state as a result of transition to the L state in the lower part at a threshold current value of 2E-4A. As the negative voltage is increased further, this state shifts to the H/L state as a result of transition to the H state in the upper part at the threshold current value of 8E-4A. Application of a negative voltage of 0.5V or more but less than about 1.15V where transition to the H/L state does not take place causes transition from the L/H state to the L/L state. Application of a negative voltage of 1.15V or more causes transition from the L/H state to the H/L state.

FIG. 3I summarizes different cases of transition from a present state to a possible subsequent state, along with the voltage necessary for transition to each subsequent state, examined in the second simulation.

Direct transition is possible between the two states of H/L and L/H. Direct transition is also possible from the L/H state to the L/L state. Indirect transition is possible from the H/L state to the L/L state via the L/H state. Direct transition is possible from the L/L state to the H/L or L/H state. Thus, transition can take place between any pair of the three states of L/L, H/L, and L/H.

Furthermore, direct transition is possible from the H/L state to the H/H state. Indirect transition is possible from the L/L or L/H state to the H/H state via the H/L state. Direct transition is possible from the H/H state to the H/L or L/H state. Indirect transition is possible from the H/H state to the L/L state via the L/H state.

Thus, under the conditions for the second simulation, transition can take place between any pair of the four states of L/L, H/L, L/H, and H/H.

A storage cell that makes use of the four states of L/L, H/L, L/H, and the H/H can be developed by using the magnetoresistance element according to the first embodiment under the conditions for the second simulation. The resistance value differs between the H/L state and the L/H state under the conditions for the second simulation, allowing the use of four different resistance values, namely, 1,400Ω in the L/L state, 1,800Ω in the H/L state, 2,400Ω in the L/H state, and 2,800Ω in the H/H state. Under the conditions for the second simulation, therefore, the magnetoresistance element according to the first embodiment can serve as a quaternary storage cell.

The third simulation is as described below. For the third simulation, the resistance value is 400Ω in the low resistance state and 800Ω in the high resistance state in the upper part, and it is 1,000Ω in the low resistance state and 2,000Ω in the high resistance state in the lower part, as in the case of the second simulation. The overall resistance value of the magnetoresistance element is 1,400Ω in the L/L state, 1,800Ω in the H/L state, 2,400Ω in the L/H state, and 2,800Ω in the H/H state. The same resistance values are assumed in the fourth to seventh simulations described later.

For the third simulation, the threshold current value is 2E-4A for transition from the high resistance state to the low resistance state and 4E-4A for transition from the low resistance state to the high resistance state in the upper part, and it is 6E-4A for transition from the high resistance state to the low resistance state and 8E-4A for transition from the low resistance state to the high resistance state in the lower part.

Figure 4A:
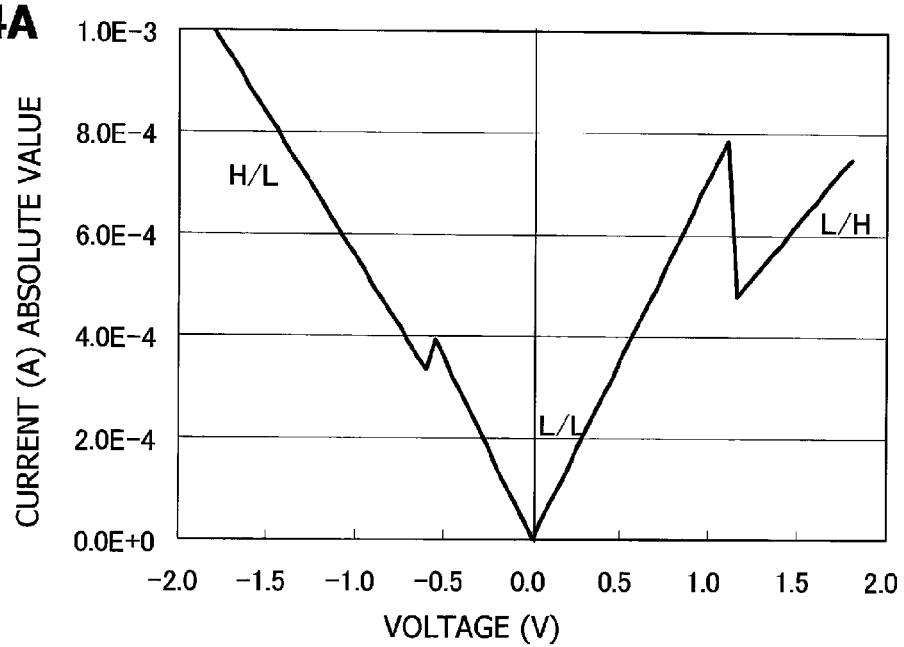
FIGS. 4A and 4B are a graph illustrating a relation between applied voltage and electric current and a graph illustrating a relation between applied voltage and resistance in the course of transition from an L/L state examined in a third simulation.
Figure 4B:
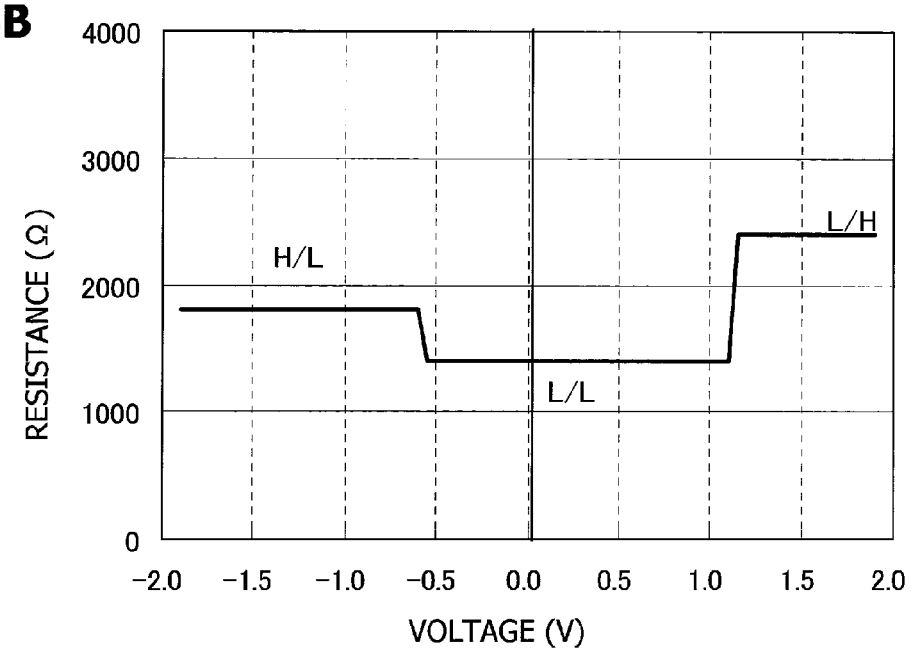

Transition from the L/L state is described first with reference to FIGS. 4A and 4B. When a positive voltage is applied, the L/L state shifts to the L/H state as a result of transition to the H state in the lower part at the threshold current value of 8E-4A. Application of a positive voltage of 1.15V or more causes transition from the L/L state to the L/H state.

When a negative voltage is applied, on the other hand, the L/L state shifts to the H/L state as a result of transition to the H state in the upper part at a threshold current value of 4E-4A. Application of a negative voltage of 0.6V or more causes transition from the L/L state to the H/L state.

Figure 4C:
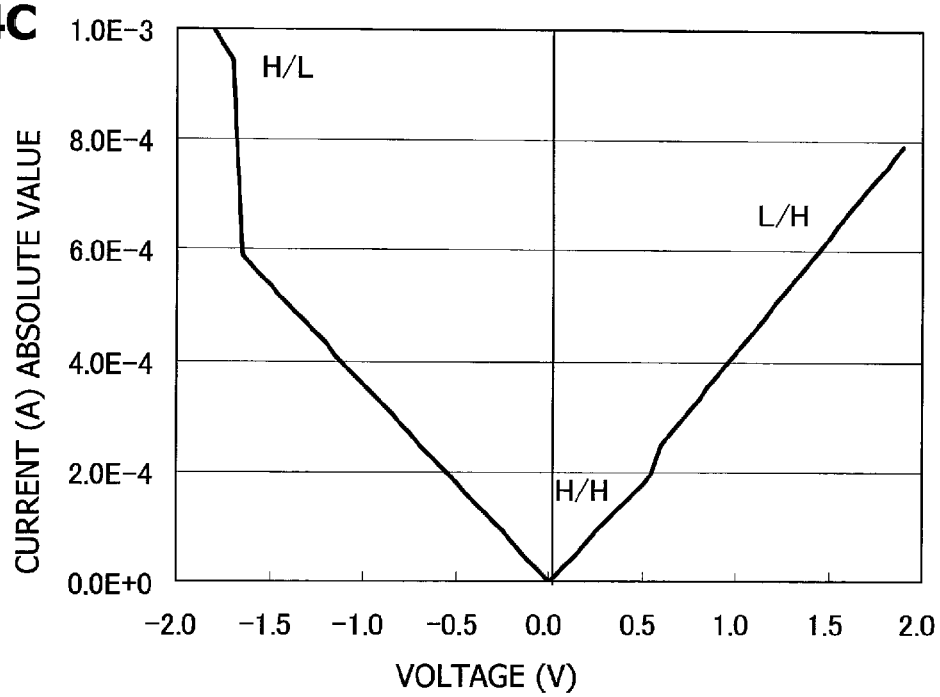
FIGS. 4C and 4D are a graph illustrating a relation between applied voltage and electric current and a graph illustrating a relation between applied voltage and resistance in the course of transition from an H/H state examined in the third simulation.
Figure 4D:
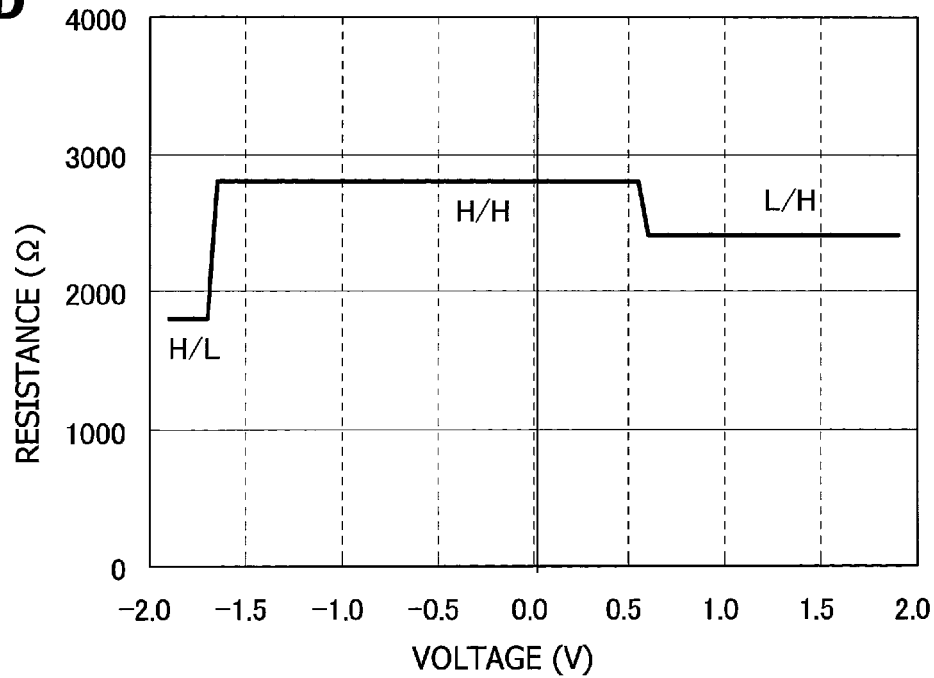

Transition from the H/H state is described next with reference to FIGS. 4C and 4D. When a positive voltage is applied, the H/H state shifts to the L/H state as a result of transition to the L state in the upper part at a threshold current value of 2E-4A. Application of a positive voltage of 0.6V or more causes transition from the H/H state to the L/H state.

When a negative voltage is applied, on the other hand, the H/H state shifts to the H/L state as a result of transition to the L state in the lower part at a threshold current value of 6E-4A. Application of a negative voltage of 1.7V or more causes transition from the H/H state to the H/L state.

Figure 4E:
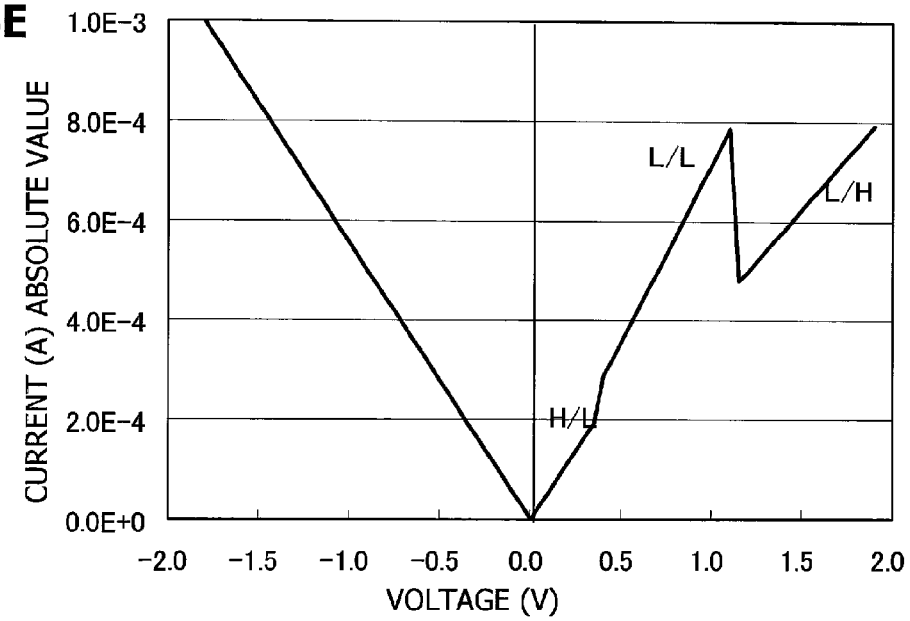
FIGS. 4E and 4F are a graph illustrating a relation between applied voltage and electric current and a graph illustrating a relation between applied voltage and resistance in the course of transition from an H/L state examined in the third simulation.
Figure 4F:
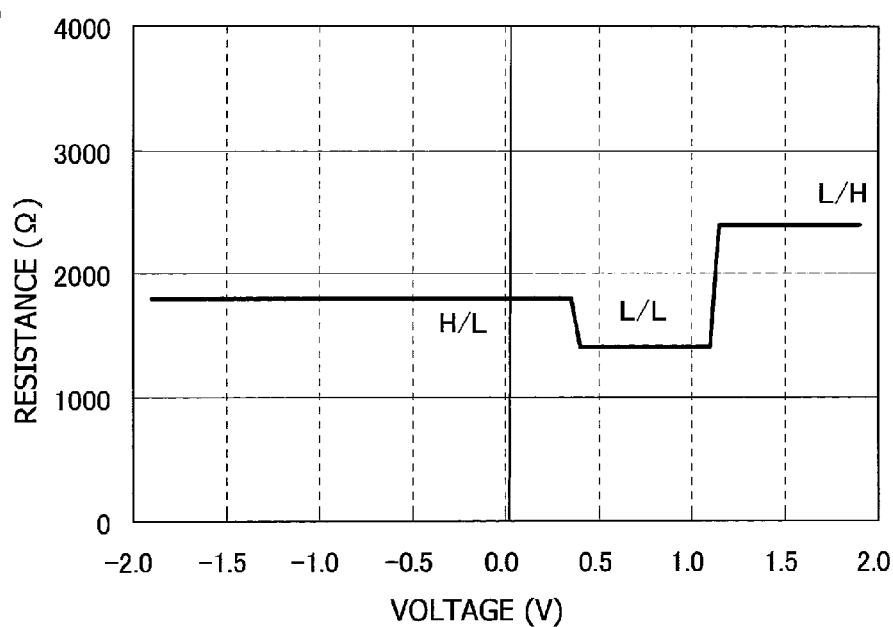

Transition from the H/L state is described next with reference to FIGS. 4E and 4F. When a positive voltage is applied, the H/L state shifts to the L/L state as a result of transition to the L state in the upper part at a threshold current value of 2E-4A. As the positive voltage is increased further, this state shifts to the L/H state as a result of transition to the H state in the lower part at the threshold current value of 8E-4A. Application of a positive voltage of 0.4V or more but lower than 1.15V where transition to the L/H state does not take place causes transition from the H/L state to the L/L state. Application of a positive voltage of 1.15V or more causes transition from the H/L state to the L/H state.

If a negative voltage is applied, on the other hand, no transition from the H/L state will take place because the upper part is already in the H state and the lower part is already in the L state.

Transition of resistance from the L/H state is described next with reference to FIGS. 4G and 4H.

If a positive voltage is applied, no transition from the L/H state will take place because the upper part is already in the L state and the lower part is already in the H state.

When a negative voltage is applied, on the other hand, the L/H state shifts to the H/H state as a result of transition to the H state in the upper part at a threshold current value of 4E-4A. As the positive voltage is increased further, this state shifts to the H/L state as a result of transition to the L state in the lower part at the threshold current value of 6E-4A. Application of a negative voltage of 1.0V or more but less than about 1.7V where transition to the H/L state does not take place causes transition from the L/H state to the H/H state. Application of a negative voltage of 1.7V or more causes transition from the L/H state to the H/L state.

FIG. 4I summarizes different cases of transition from a present state to a possible subsequent state, along with the voltage necessary for transition to each subsequent state, examined in the third simulation.

Direct transition is possible between the two states of H/L and L/H. Direct transition is also possible from the H/L state to the L/L state. Indirect transition is possible from the L/H state to the L/L state via the H/L state. Direct transition is possible from the L/L state to the H/L or L/H state. Thus, transition can take place between any pair of the three states of L/L, H/L, and L/H.

Furthermore, direct transition is possible from the L/H state to the H/H state. Indirect transition is possible from the L/L or H/L state to the H/H state via the L/H state. Direct transition is possible from the H/H state to the H/L or L/H state. Indirect transition is possible from the H/H state to the L/L state via the H/L state.

Under the conditions for the third simulation, transition can take place between any pair of the four states of L/L, H/L, L/H, and H/H, as in the case of the second simulation.

A storage cell that makes use of the four states of L/L, H/L, L/H, and the H/H can be developed by using the magnetoresistance element according to the first embodiment under the conditions for the third simulation, as in the case of the second simulation. The four states of L/L, H/L, L/H, and H/H can also be made use of under the conditions according to the third simulation, as in the case of the second simulation. Under the conditions for the third simulation as well, therefore, the magnetoresistance element according to the first embodiment can serve as a quaternary storage cell.

The fourth simulation is as described below. For the fourth simulation as well, the resistance value is 400Ω in the low resistance state and 800Ω in the high resistance state in the upper part, and it is 1,000Ω in the low resistance state and 2,000Ω in the high resistance state in the lower part. The overall resistance value of the magnetoresistance element is 1,400Ω in the L/L state, 1,800Ω in the H/L state, 2,400Ω in the L/H state, and 2,800Ω in the H/H state.

For the fourth simulation, the threshold current value is 2E-4A for transition from the high resistance state to the low resistance state and 6E-4A for transition from the low resistance state to the high resistance state in the upper part, and it is 4E-4A for transition from the high resistance state to the low resistance state and 8E-4A for transition from the low resistance state to the high resistance state in the lower part.

Figure 5A:
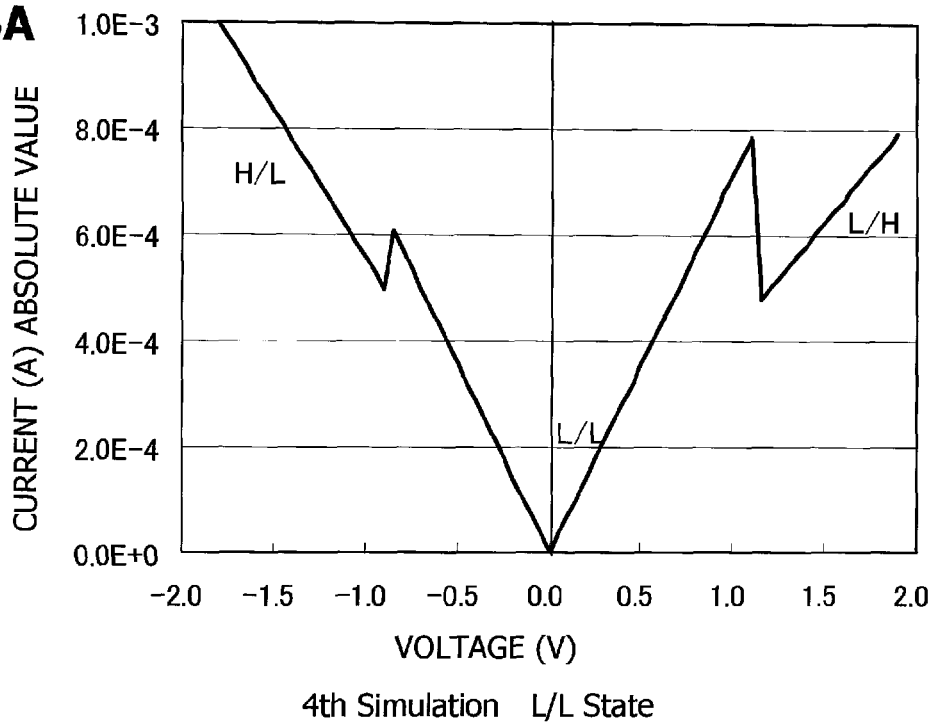
FIGS. 5A and 5B are a graph illustrating a relation between applied voltage and electric current and a graph illustrating a relation between applied voltage and resistance in the course of transition from an L/L state examined in a fourth simulation.
Figure 5B:
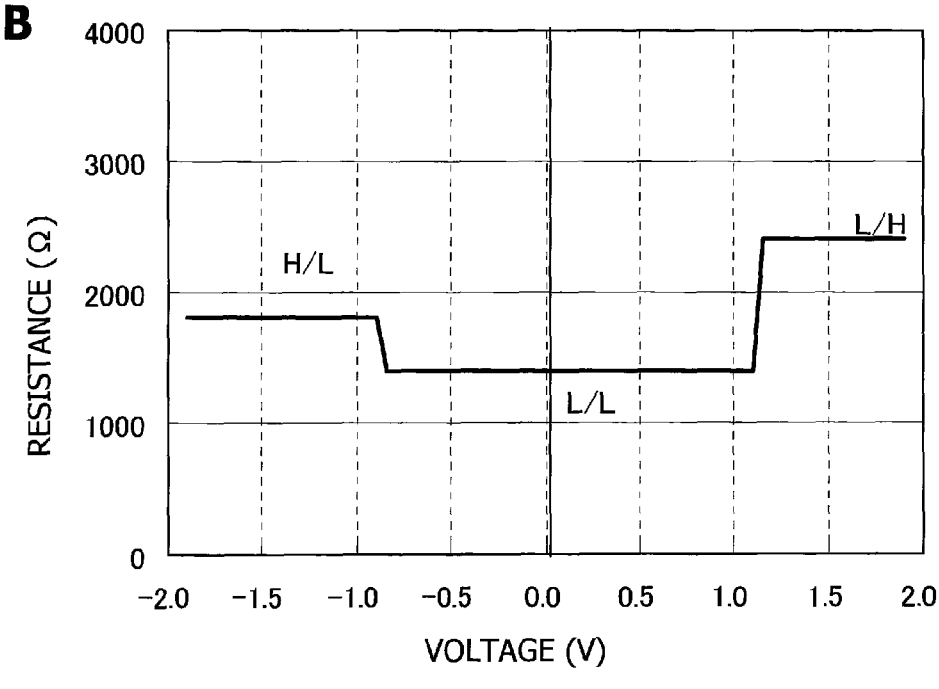

Transition from the L/L state is described first with reference to FIGS. 5A and 5B. When a positive voltage is applied, the L/L state shifts to the L/H state as a result of transition to the H state in the lower part at the threshold current value of 8E-4A. Application of a positive voltage of 1.15V or more causes transition from the L/L state to the L/H state.

When a negative voltage is applied, on the other hand, the L/L state shifts to the H/L state as a result of transition to the H state in the upper part at a threshold current value of 6E-4A. Application of a negative voltage of 0.9V or more causes transition from the L/L state to the H/L state.

Figure 5C:
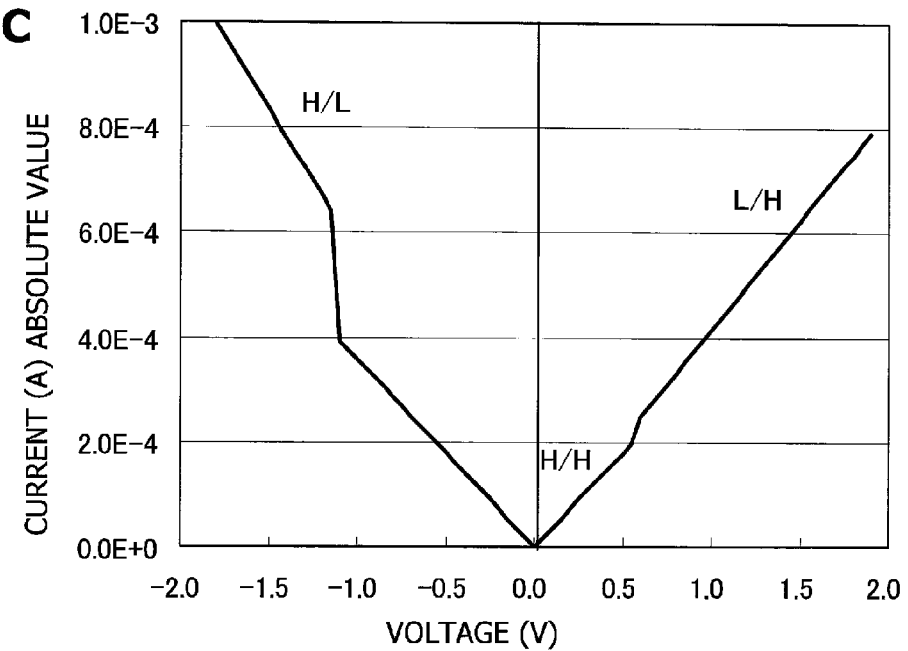
FIGS. 5C and 5D are a graph illustrating a relation between applied voltage and electric current and a graph illustrating a relation between applied voltage and resistance in the course of transition from an H/H state examined in the fourth simulation.
Figure 5D:
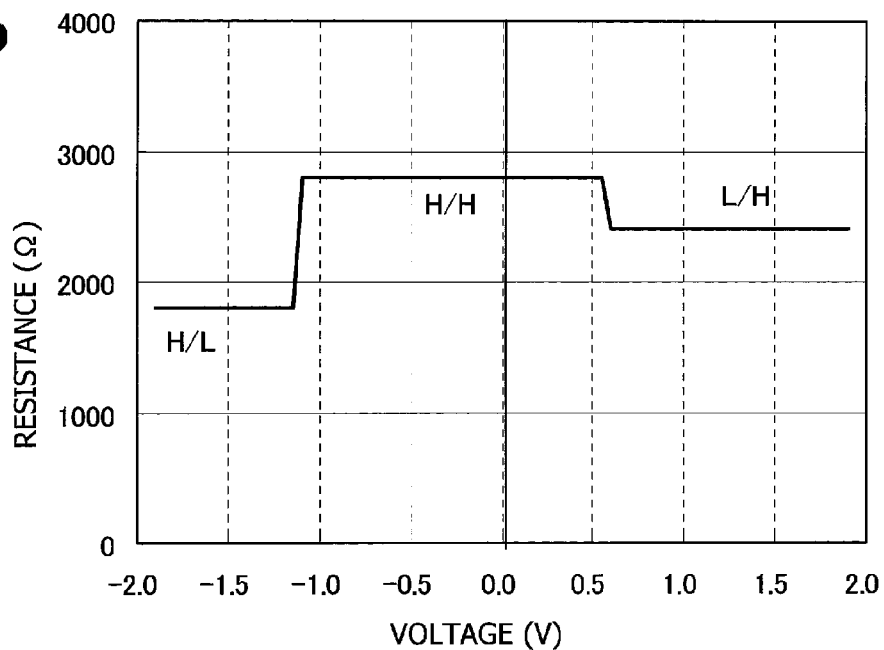

Transition from the H/H state is described next with reference to FIGS. 5C and 5D. When a positive voltage is applied, the H/H state shifts to the L/H state as a result of transition to the L state in the upper part at a threshold current value of 2E-4A. Application of a positive voltage of 0.6V or more causes transition from the H/H state to the L/H state.

When a negative voltage is applied, on the other hand, the H/H state shifts to the H/L state as a result of transition to the L state in the lower part at a threshold current value of 4E-4A. Application of a negative voltage of 1.15V or more causes transition from the H/H state to the H/L state.

Figure 5E:
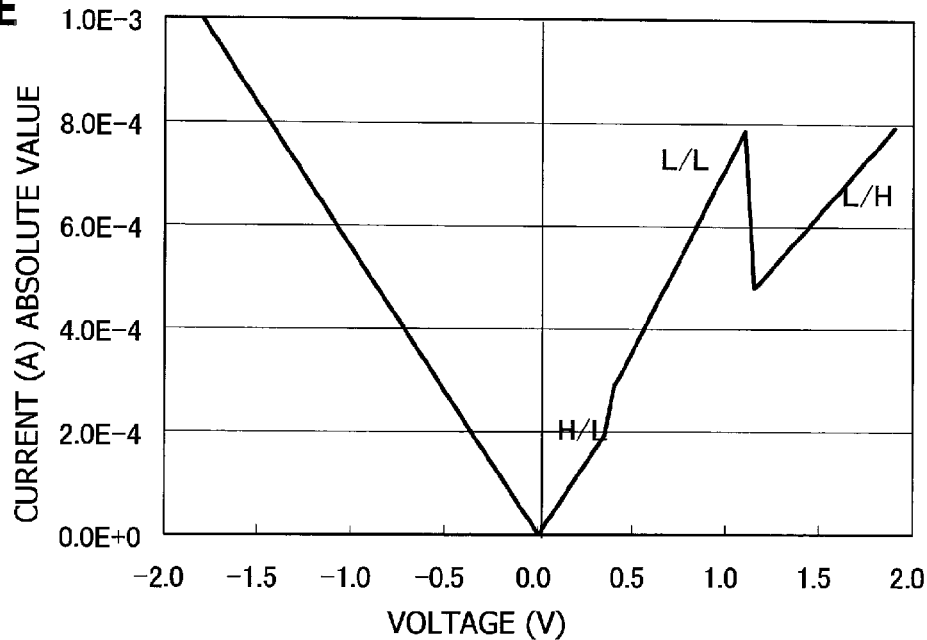
FIGS. 5E and 5F are a graph illustrating a relation between applied voltage and electric current and a graph illustrating a relation between applied voltage and resistance in the course of transition from an H/L state examined in the fourth simulation.
Figure 5F:
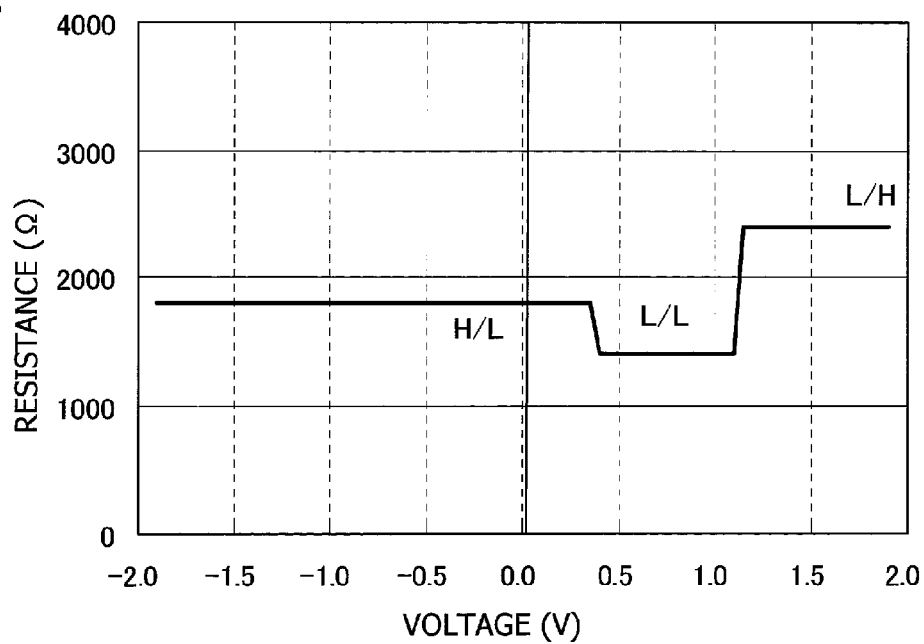

Transition from the H/L state is described next with reference to FIGS. 5E and 5F. When a positive voltage is applied, the H/L state shifts to the L/L state as a result of transition to the L state in the upper part at a threshold current value of 2E-4A. As the positive voltage is increased further, this state shifts to the L/H state as a result of transition to the H state in the lower part at the threshold current value of 8E-4A. Application of a positive voltage of 0.4V or more but lower than 1.15V where transition to the L/H state does not take place causes transition from the H/L state to the L/L state. Application of a positive voltage of 1.15V or more causes transition from the H/L state to the L/H state.

If a negative voltage is applied, on the other hand, no transition from the H/L state will take place because the upper part is already in the H state and the lower part is already in the L state.

Figure 5G:
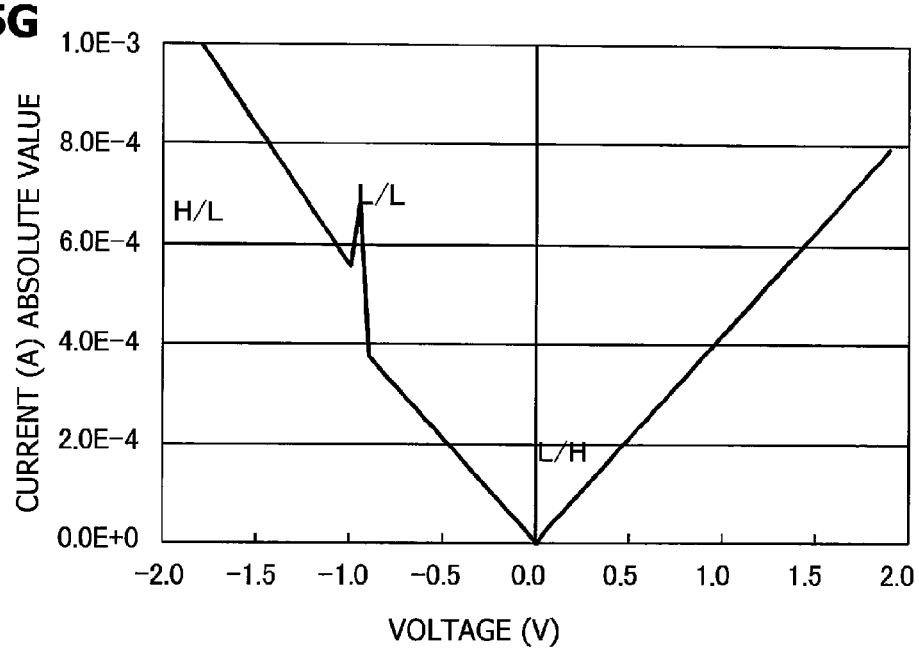
FIGS. 5G and 5H are a graph illustrating a relation between applied voltage and electric current and a graph illustrating a relation between applied voltage and resistance in the course of transition from an L/H state examined in the fourth simulation.
Figure 5H:
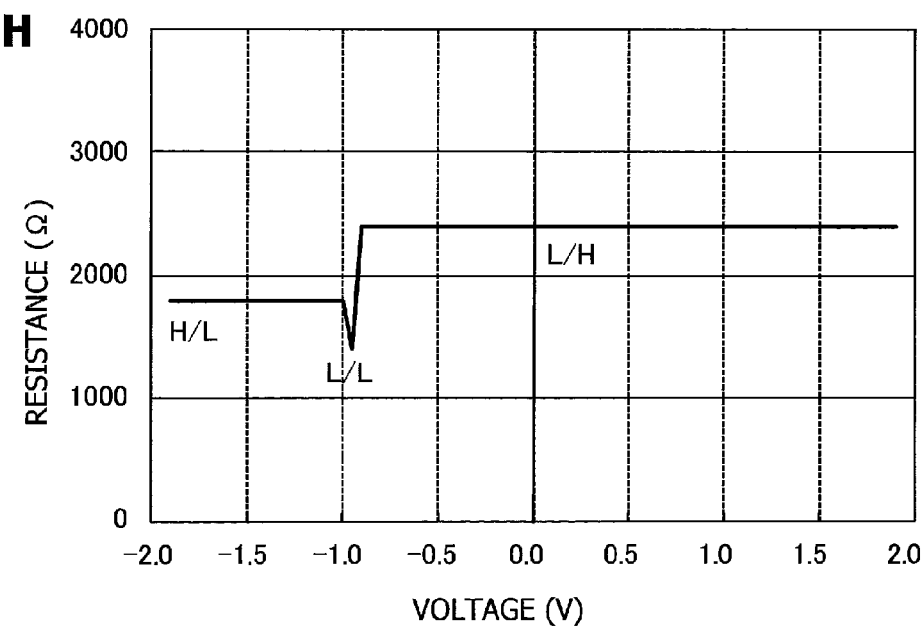

Transition of resistance from the L/H state is described next with reference to FIGS. 5G and 5H.

If a positive voltage is applied, no transition from the L/H state will take place because the upper part is already in the L state and the lower part is already in the H state.

When a negative voltage is applied, on the other hand, the L/H state shifts to the L/L state as a result of transition to the L state in the lower part at a threshold current value of 4E-4A. As the negative voltage is increased further, this state shifts to the H/L state as a result of transition to the H state in the upper part at the threshold current value of 6E-4A. Application of a negative voltage of 0.95V or more but less than about 1.0V where transition to the H/L state does not take place causes transition from the L/H state to the L/L state. Application of a negative voltage of 1.0V or more causes transition from the L/H state to the H/L state. In this case, the L/L state is unstable because the L/L state can develop only in a very narrow voltage range.

FIG. 5I summarizes different cases of transition from a present state to a possible subsequent state, along with the voltage necessary for transition to each subsequent state, examined in the fourth simulation.

Under the conditions for the fourth simulation, transition can take place between any pair of the three states of L/L, H/L, and L/H, but transition to the H/H state is impossible from the other three states of L/L, H/L, and L/H, as in the case of the first simulation.

A storage cell that makes use of the three states of L/L, H/L, and L/H can be developed by using the magnetoresistance element according to the first embodiment under the conditions for the fourth simulation. Under the conditions for the fourth simulation, the resistance value differs between the H/L state and the L/H state, and accordingly, three resistance values corresponding to the L/L, H/L, and L/H states can be used. Under the conditions for the fourth simulation, therefore, the magnetoresistance element according to the first embodiment can serve as a ternary storage cell.

The fifth simulation is as described below. For the fifth simulation as well, the resistance value is 400Ω in the low resistance state and 800Ω in the high resistance state in the upper part, and it is 1,000Ω in the low resistance state and 2,000Ω in the high resistance state in the lower part. The overall resistance value of the magnetoresistance element is 1,400Ω in the L/L state, 1,800Ω in the H/L state, 2,400Ω in the L/H state, and 2,800Ω for in H/H state.

For the fifth simulation, the threshold current value is 2E-4A for transition from the high resistance state to the low resistance state and 8E-4A for transition from the low resistance state to the high resistance state in the upper part, and it is 4E-4A for transition from the high resistance state to the low resistance state and 6E-4A for transition from the low resistance state to the high resistance state in the lower part.

Figure 6A:
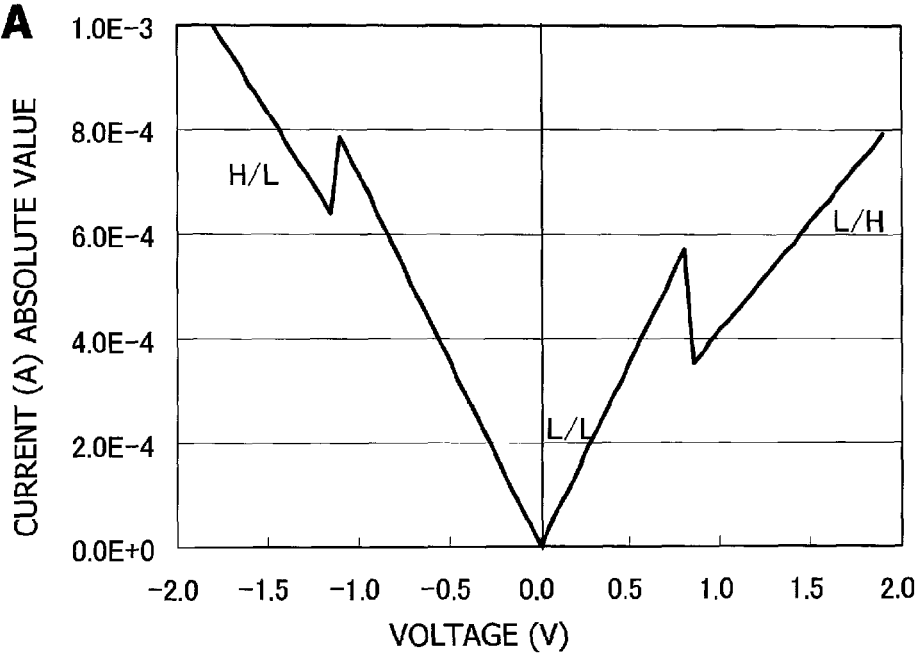
FIGS. 6A and 6B are a graph illustrating a relation between applied voltage and electric current and a graph illustrating a relation between applied voltage and resistance in the course of transition from an L/L state examined in a fifth simulation.
Figure 6B:
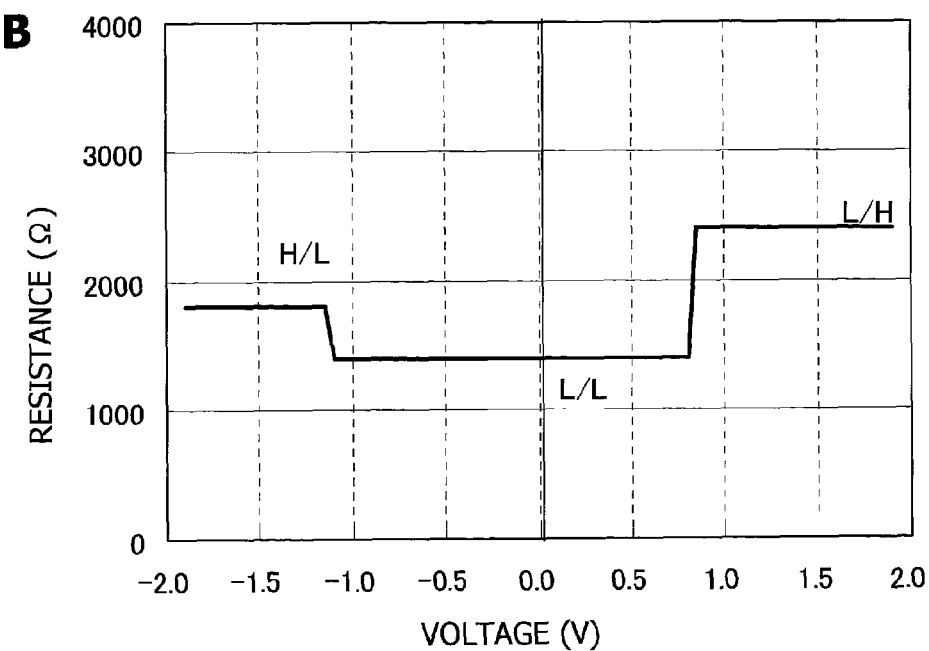

Transition from the L/L state is described first with reference to FIGS. 6A and 6B. When a positive voltage is applied, the L/L state shifts to the L/H state as a result of transition to the H state in the lower part at the threshold current value of 6E-4A. Application of a positive voltage of 0.85V or more causes transition from the L/L state to the L/H state.

When a negative voltage is applied, on the other hand, the L/L state shifts to the H/L state as a result of transition to the H state in the upper part at a threshold current value of 8E-4A. Application of a negative voltage of 1.15V or more causes transition from the L/L state to the H/L state.

Transition from the H/H state is described next with reference to FIGS. 6C and 6D. When a positive voltage is applied, the H/H state shifts to the L/H state as a result of transition to the L state in the upper part at a threshold current value of 2E-4A. Application of a positive voltage of 0.6V or more causes transition from the H/H state to the L/H state.

When a negative voltage is applied, on the other hand, the H/H state shifts to the H/L state as a result of transition to the L state in the lower part at a threshold current value of 4E-4A. Application of a negative voltage of 1.15V or more causes transition from the H/H state to the H/L state.

Transition from the H/L state is described next with reference to FIGS. 6E and 6F. When a positive voltage is applied, the H/L state shifts to the L/L state as a result of transition to the L state in the upper part at a threshold current value of 2E-4A. As the positive voltage is increased further, this state shifts to the L/H state as a result of transition to the H state in the lower part at the threshold current value of 6E-4A. Application of a positive voltage of 0.4V or more but lower than 0.85V where transition to the L/H state does not take place causes transition from the H/L state to the L/L state. Application of a positive voltage of 0.85V or more causes transition from the H/L state to the L/H state.

If a negative voltage is applied, on the other hand, no transition from the H/L state will take place because the upper part is already in the H state and the lower part is already in the L state.

Transition of resistance from the L/H state is described next with reference to FIGS. 6G and 6H.

If a positive voltage is applied, no transition from the L/H state will take place because the upper part is already in the L state and the lower part is already in the H state.

When a negative voltage is applied, on the other hand, the L/H state shifts to the L/L state as a result of transition to the L state in the lower part at a threshold current value of 4E-4A.

As the negative voltage is increased further, this state shifts to the H/L state as a result of transition to the H state in the upper part at the threshold current value of 8E-4A. Application of a negative voltage of 1.0V or more but less than 1.15V where transition to the H/L state does not take place causes transition from the L/H state to the L/L state. Application of a negative voltage of 1.15V or more causes transition from the L/H state to the H/L state.

FIG. 6I summarizes different cases of transition from a present state to a possible subsequent state in the fifth simulation, along with the voltage necessary for transition to each subsequent state.

Under the conditions for the fifth simulation as well, three resistance values corresponding to the L/L, H/L, and L/H states can be used by means of the three states of L/L, H/L, and L/H, and accordingly, the magnetoresistance element according to the first embodiment can serve as a ternary storage cell, as in the case of the fourth simulation.

The sixth simulation is as described below. For the sixth simulation as well, the resistance value is 400Ω in the low resistance state and 800Ω in the high resistance state in the upper part, and it is 1,000Ω in the low resistance state and 2,000Ω in the high resistance state in the lower part. The overall resistance value of the magnetoresistance element is 1,400Ω for the L/L state, 1,800Ω for the H/L state, 2,400Ω for the L/H state, and 2,800Ω for the H/H state.

For sixth simulation, the threshold current value is 4E-4A for transition from the high resistance state to the low resistance state and 6E-4A for transition from the low resistance state to the high resistance state in the upper part, and it is 2E-4A for transition from the high resistance state to the low resistance state and 8E-4A for transition from the low resistance state to the high resistance state in the lower part.

Figure 7A:
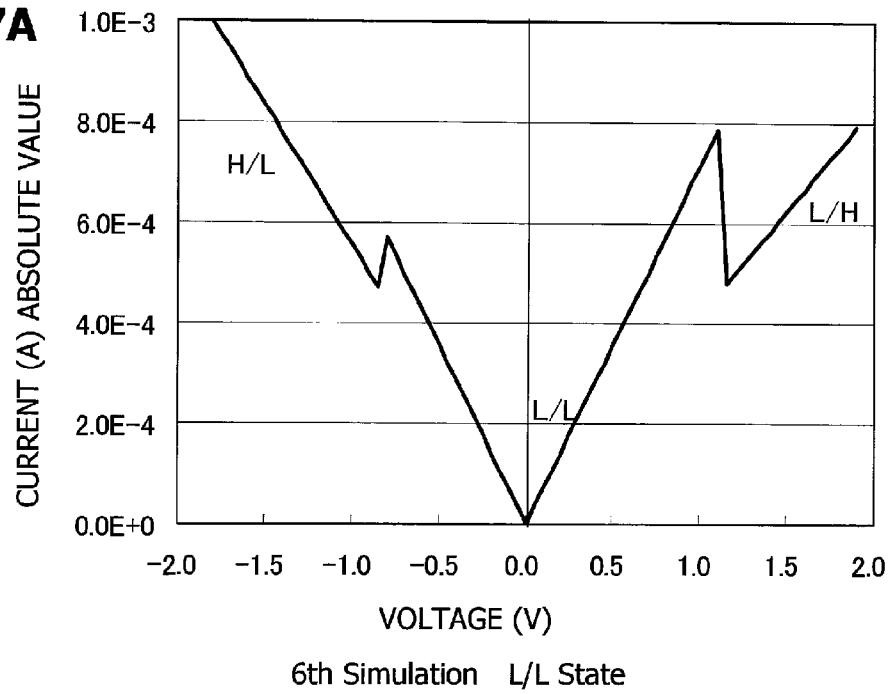
FIGS. 7A and 7B are a graph illustrating a relation between applied voltage and electric current and a graph illustrating a relation between applied voltage and resistance in the course of transition from an L/L state examined in a sixth simulation.
Figure 7B:
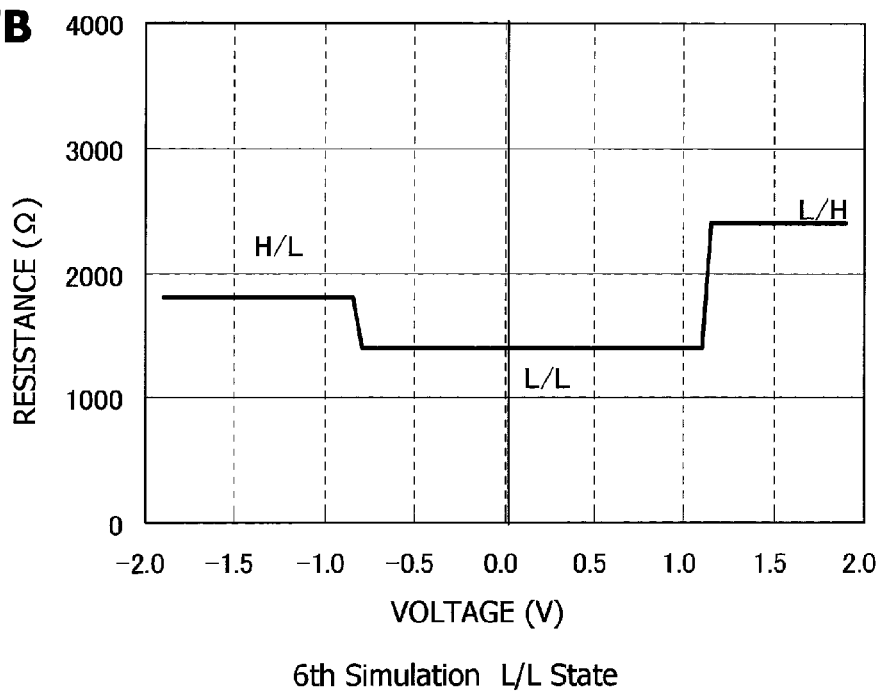

Transition from the L/L state is described first with reference to FIGS. 7A and 7B. When a positive voltage is applied, the L/L state shifts to the L/H state as a result of transition to the H state in the lower part at the threshold current value of 8E-4A. Application of a positive voltage of 1.15V or more causes transition from the L/L state to the L/H state.

When a negative voltage is applied, on the other hand, the L/L state shifts to the H/L state as a result of transition to the H state in the upper part at a threshold current value of 6E-4A. Application of a negative voltage of 0.85V or more causes transition from the L/L state to the H/L state.

Transition from the H/H state is described next with reference to FIGS. 7C and 7D. When a positive voltage is applied, the H/H state shifts to the L/H state as a result of transition to the L state in the upper part at a threshold current value of 4E-4A. Application of a positive voltage of 1.15V or more causes transition from the H/H state to the L/H state.

When a negative voltage is applied, on the other hand, the H/H state shifts to the H/L state as a result of transition to the L state in the lower part at a threshold current value of 2E-4A. Application of a negative voltage of 0.85V or more causes transition from the H/H state to the H/L state.

Figure 7E:
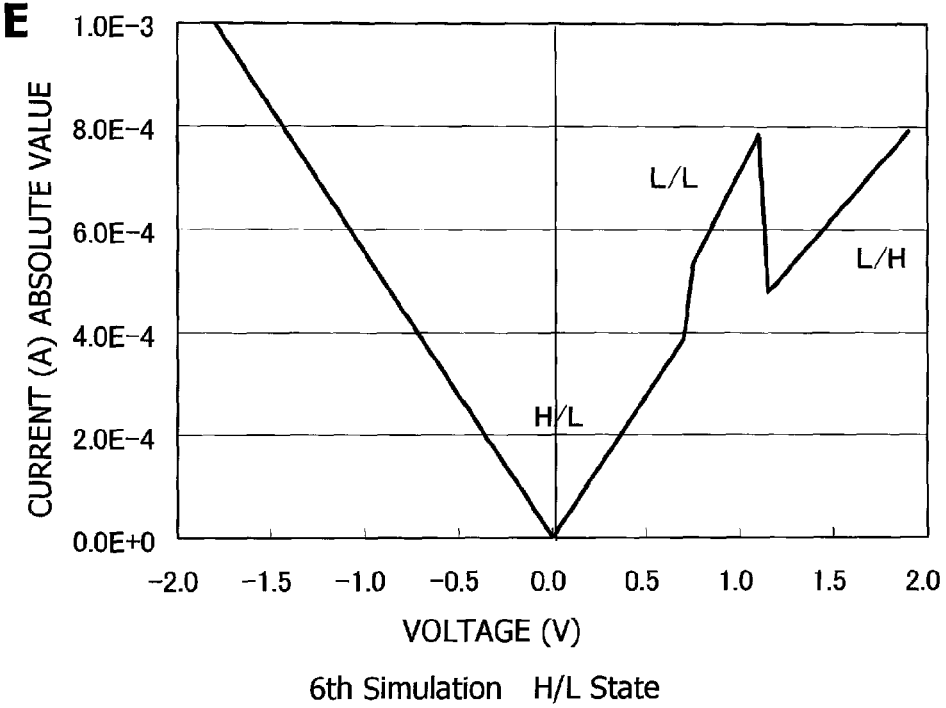
FIGS. 7E and 7F are a graph illustrating a relation between applied voltage and electric current and a graph illustrating a relation between applied voltage and resistance in the course of transition from an H/L state examined in the sixth simulation.
Figure 7F:
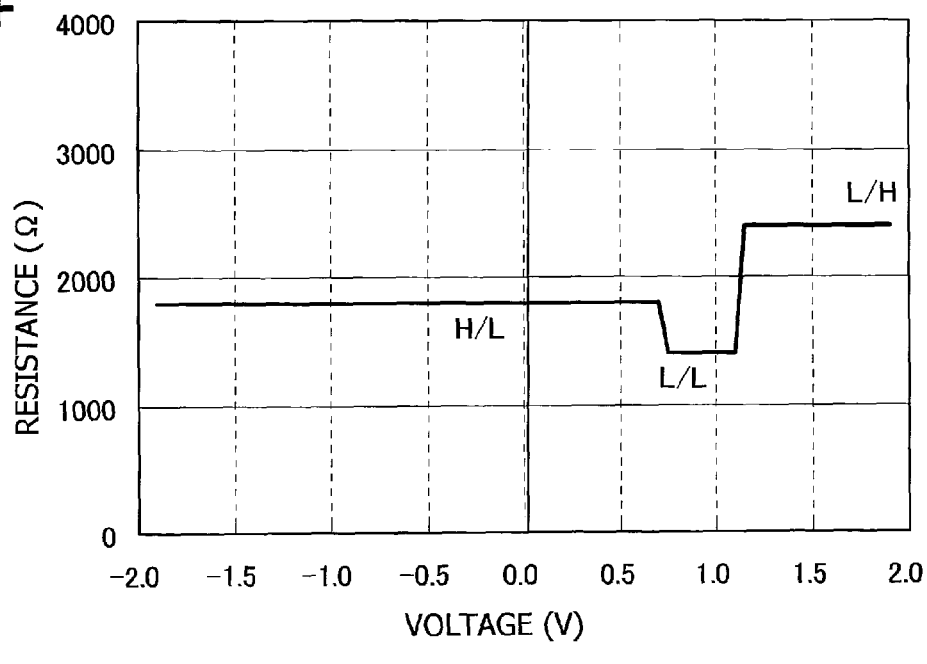

Transition from the H/L state is described next with reference to FIGS. 7E and 7F. When a positive voltage is applied, the H/L state shifts to the L/L state as a result of transition to the L state in the upper part at a threshold current value of 4E-4A. As the positive voltage is increased further, this state shifts to the L/H state as a result of transition to the H state in the lower part at the threshold current value of 8E-4A. Application of a positive voltage of 0.75V or more but lower than 1.15V where transition to the L/H state does not take place causes transition from the H/L state to the L/L state. Application of a positive voltage of 1.15V or more causes transition from the H/L state to the L/H state.

If a negative voltage is applied, on the other hand, no transition from the H/L state will take place because the upper part is already in the H state and the lower part is already in the L state.

Figure 7G:
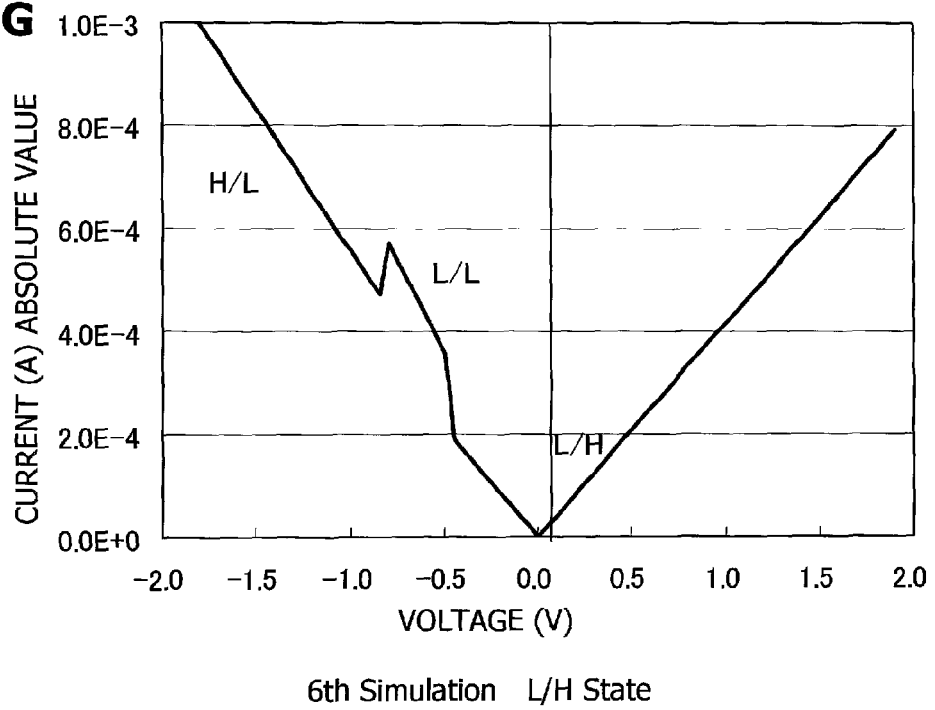
FIGS. 7G and 7H are a graph illustrating a relation between applied voltage and electric current and a graph illustrating a relation between applied voltage and resistance in the course of transition from an L/H state examined in the sixth simulation.
Figure 7H:
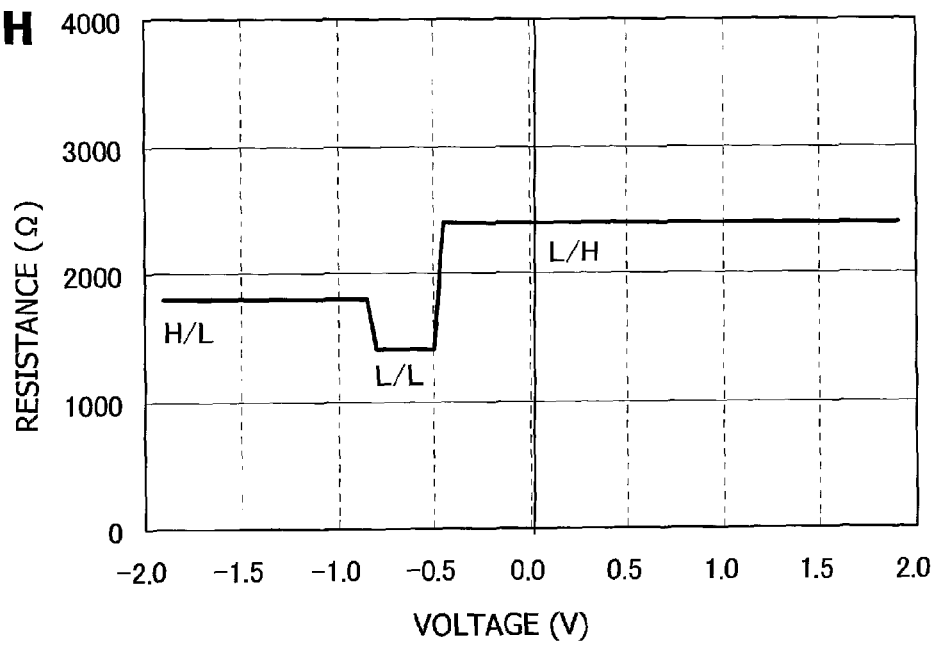

Transition of resistance from the L/H state is described next with reference to FIGS. 7G and 7H.

If a positive voltage is applied, no transition from the L/H state will take place because the upper part is already in the L state and the lower part is already in the H state.

When a negative voltage is applied, on the other hand, the L/H state shifts to the L/L state as a result of transition to the L state in the lower part at a threshold current value of 2E-4A. As the negative voltage is increased further, this state shifts to the H/L state as a result of transition to the H state in the upper part at the threshold current value of 6E-4A. Application of a negative voltage of 0.5V or more but less than about 0.85V where transition to the H/L state does not take place causes transition from the L/H state to the L/L state. Application of a negative voltage of 0.85V or more causes transition from the L/H state to the H/L state.

FIG. 7I summarizes different cases of transition from a present state to a possible subsequent state, along with the voltage necessary for transition to each subsequent state, examined in the sixth simulation.

Under the conditions for the sixth simulation as well, three resistance values corresponding to the L/L, H/L, and L/H states can be used by means of the three states of L/L, H/L, and L/H, and accordingly, the magnetoresistance element according to the first embodiment can serve as a ternary storage cell, as in the case of the fourth simulation and the fifth simulation.

The seventh simulation is as described below. For the seventh simulation as well, the resistance value is 400Ω in the low resistance state and 800Ω in the high resistance state in the upper part, and it is 1,000Ω in the low resistance state and 2,000Ω in the high resistance state in the lower part. The overall resistance value of the magnetoresistance element is 1,400Ω in the L/L state, 1,800Ω in the H/L state, 2,400Ω in the L/H state, and 2,800Ω in the H/H state.

For the seventh simulation, the threshold current value is 4E-4A for transition from the high resistance state to the low resistance state and 8E-4A for transition from the low resistance state to the high resistance state in the upper part, and it is 2E-4A for transition from the high resistance state to the low resistance state and 6E-4A for transition from the low resistance state to the high resistance state in the lower part.

Figure 8A:
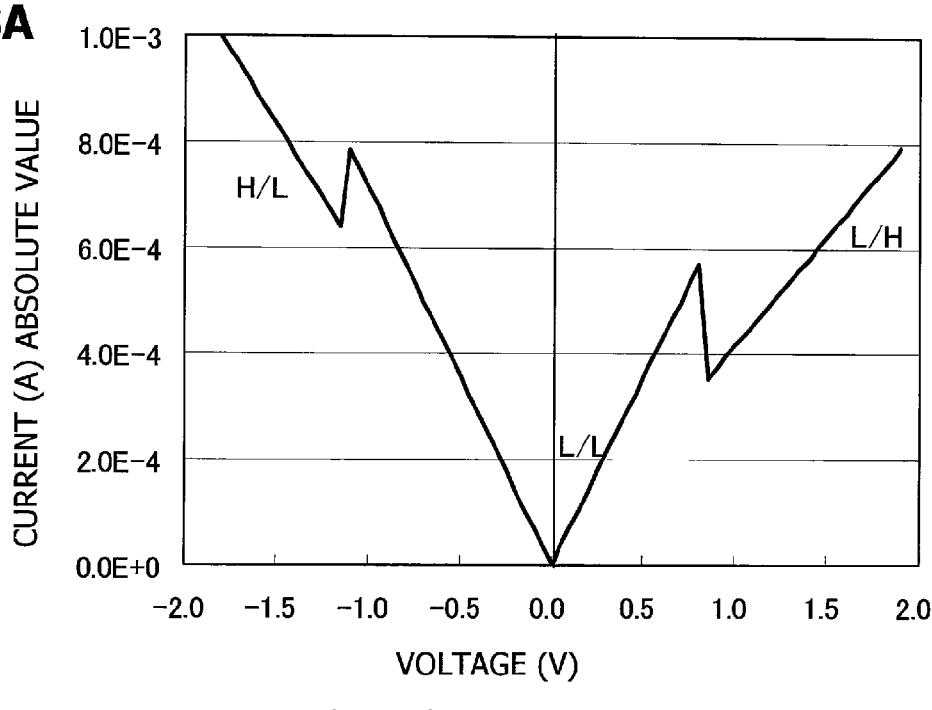
FIGS. 8A and 8B are a graph illustrating a relation between applied voltage and electric current and a graph illustrating a relation between applied voltage and resistance in the course of transition from an L/L state examined in a seventh simulation.
Figure 8B:
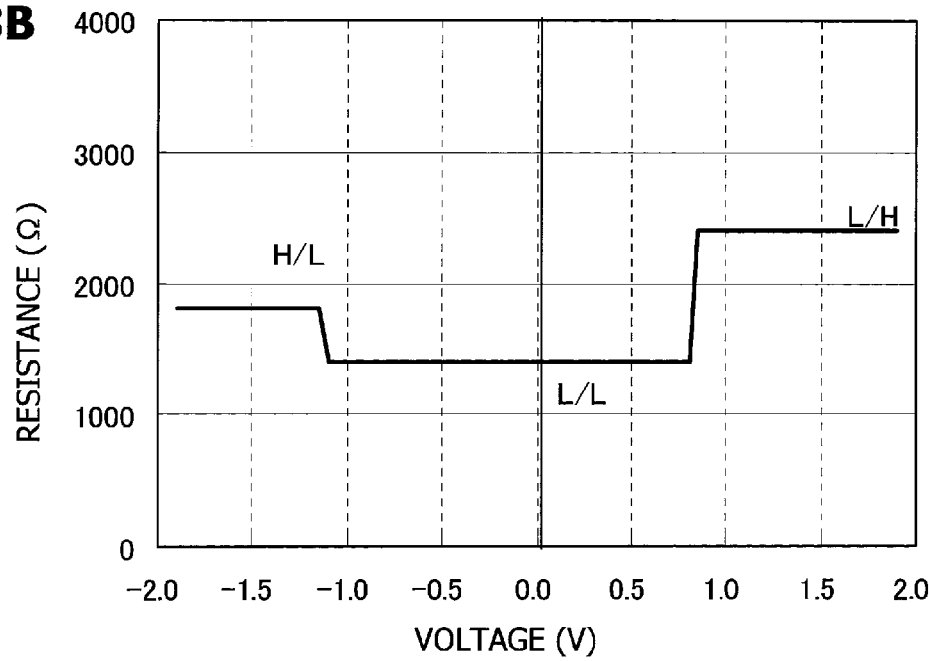

Transition from the L/L state is described first with reference to FIGS. 8A and 8B. When a positive voltage is applied, the L/L state shifts to the L/H state as a result of transition to the H state in the lower part at the threshold current value of 6E-4A. Application of a positive voltage of 0.85V or more causes transition from the L/L state to the L/H state.

When a negative voltage is applied, on the other hand, the L/L state shifts to the H/L state as a result of transition to the H state in the upper part at a threshold current value of 8E-4A. Application of a negative voltage of 1.15V or more causes transition from the L/L state to the H/L state.

Transition from the H/H state is described next with reference to FIGS. 8C and 8D. When a positive voltage is applied, the H/H state shifts to the L/H state as a result of transition to the L state in the upper part at a threshold current value of 4E-4A. Application of a positive voltage of 1.15V or more causes transition from the H/H state to the L/H state.

When a negative voltage is applied, on the other hand, the H/H state shifts to the H/L state as a result of transition to the L state in the lower part at a threshold current value of 2E-4A. Application of a negative voltage of 0.6V or more causes transition from the H/H state to the H/L state.

Figure 8E:
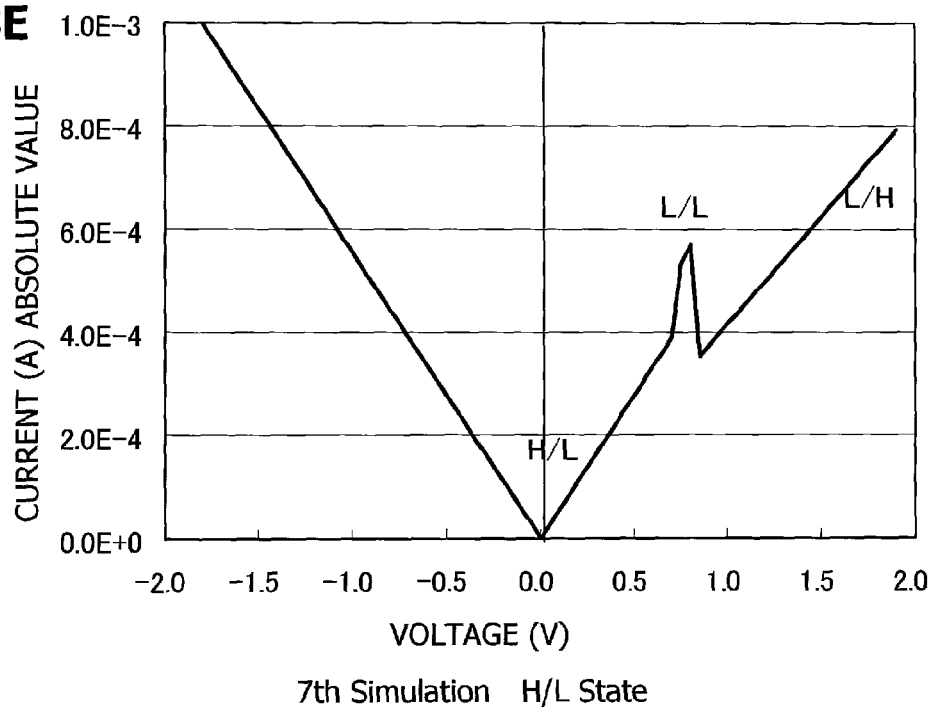
FIGS. 8E and 8F are a graph illustrating a relation between applied voltage and electric current and a graph illustrating a relation between applied voltage and resistance in the course of transition from an H/L state examined in the seventh simulation.
Figure 8F:
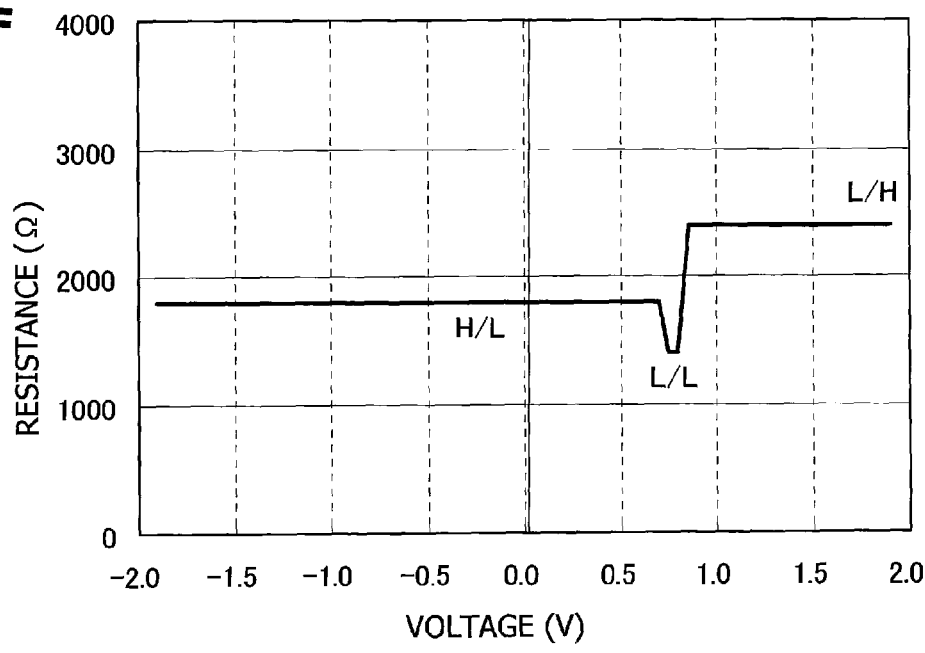

Transition from the H/L state is described next with reference to FIGS. 8E and 8F. When a positive voltage is applied, the H/L state shifts to the L/L state as a result of transition to the L state in the upper part at a threshold current value of 4E-4A. As the positive voltage is increased further, this state shifts to the L/H state as a result of transition to the H state in the lower part at the threshold current value of 6E-4A. Application of a positive voltage of 0.75V or more but lower than 0.85V where transition to the L/H state does not take place causes transition from the H/L state to the L/L state. Application of a positive voltage of 0.85V or more causes transition from the H/L state to the L/H state.

If a negative voltage is applied, on the other hand, no transition from the H/L state will take place because the upper part is already in the H state and the lower part is already in the L state.

Transition of resistance from the L/H state is described next with reference to FIGS. 8G and 8H.

If a positive voltage is applied, no transition from the L/H state will take place because the upper part is already in the L state and the lower part is already in the H state.

When a negative voltage is applied, on the other hand, the L/H state shifts to the L/L state as a result of transition to the L state in the lower part at a threshold current value of 2E-4A. As the negative voltage is increased further, this state shifts to the H/L state as a result of transition to the H state in the upper part at the threshold current value of 8E-4A. Application of a negative voltage of 0.5V or more but less than about 1.15V where transition to the H/L state does not take place causes transition from the L/H state to the L/L state. Application of a negative voltage of 1.15V or more causes transition from the L/H state to the H/L state.

FIG. 8I summarizes different cases of transition from a present state to a possible subsequent state, along with the voltage necessary for transition to each subsequent state, examined in the seventh simulation.

Under the conditions for the seventh simulation as well, three resistance values corresponding to the L/L, H/L, and L/H states can be used by means of the three states of L/L, H/L, and L/H, and accordingly, the magnetoresistance element according to the first embodiment can serve as a ternary storage cell, as in the case of the fourth to sixth simulation.

FIGS. 9A and 9B summarize results of the first to seventh simulations. The magnetoresistance element according to the first embodiment can serve as a storage cell that switches over among at least the three states of L/L, H/L, and L/H.

Then, if the resistance value differs between the H/L state and the L/H state, that is, if the sum of the resistance value of the upper part in the H state and the resistance value of the lower part in the L state differs from the sum of the resistance value of the upper part in the L state and the resistance value of the lower part in the H state, it can work as a ternary or higher storage cell as in the second to seventh simulations.

In the second and third simulations, transition to the H/H state is possible from the L/L, H/L, or L/H state, and accordingly, four different resistance states are available. In the fourth to seventh simulations, on the other hand, transition to the H/H state is not possible from the L/L, H/L, or L/H state, and accordingly, three different resistance states are available. Discussed below is the reason for this.

If an increasing positive directional voltage is applied to an element in the H/L state, transition takes place in both the upper part and the lower part, leading to the L/H state. If an increasing negative directional voltage is applied to an element in the L/H state, transition will take place eventually in both the upper part and the lower part, leading to the H/L state. The L/L state or the H/H state appears at a stage where only one of either the upper part or the lower part has undergone transition in the course of the transition process from the H/L state to the L/H state or in the course of the transition process from the L/H state to the H/L state.

The L/L state develops if the transition from the H state to the L state in either the upper part or the lower part is faster (that is, if the threshold current value is smaller) than the transition from the L state to the H state in the other part. The H/H state develops if the transition from the L state to the H state in either the upper part or the lower part is faster (that is, if the threshold current value is smaller) than the transition from the H state to the L state in the other part.

In the second and third simulations, the threshold current value for the transition from the L state to the H state in one of either the upper part or the lower part is smaller than the threshold current value for the transition from the H state to the L state in the other one of the upper part or the lower part. Accordingly, in the second and third simulations, the H/H state can develop as the transition from the L state to the H state is faster than the transition from the H state to the L state in the course of transition from the H/L state or in the course of transition from the L/H state.

Here, in each of the upper part and the lower part, the threshold current value for the transition from the L state to the H state is larger than the threshold current value for the transition from the H state to the L state. Accordingly, in the second and third simulations, the L/L state can also develop as the transition from the H state to the L state is faster than the transition from the L state to the H state in the other one of either the course of transition from the H/L state or the course of transition from the L/H state.

In the fourth to seventh simulations, on the other hand, the threshold current value for the transition from the L state to the H state in both the upper part and the lower part is larger than the threshold current value for the transition from the H state to the L state in both the upper part and the lower part. Accordingly, in the fourth to seventh simulations, only the L/L state can develop as the transition from the H state to the L state is faster than the transition from the L state to the H state both in the course of transition from the H/L state and in the course of transition from the L/H state.

A storage cell that can switch over among four different resistance states can be produced if the threshold current value for the transition from the L state to the H state in one of either the upper part or the lower part is adjusted to be smaller than the threshold current value for the transition from the H state to the L state in the other one of either the upper part or the lower part. Then, it works as a quaternary storage cell if the resistance value differs between the H/L state and the L/H state.

Figure 9C:
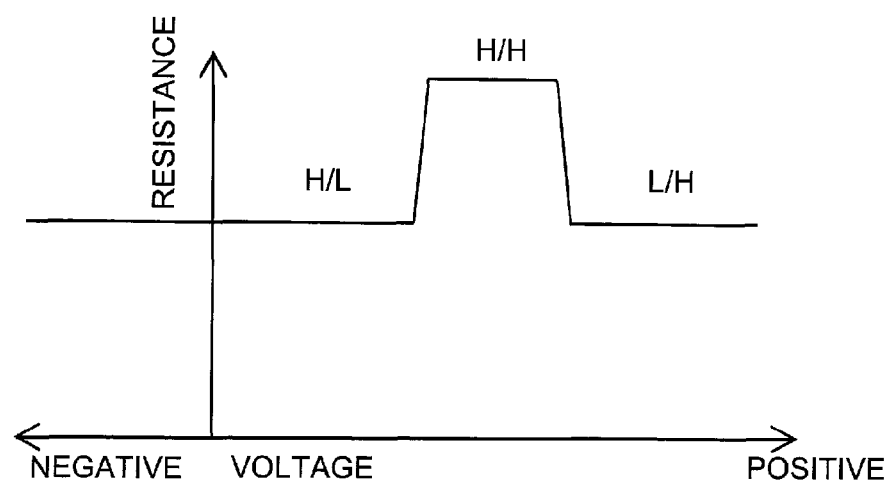
FIGS. 9C and 9D give graphs roughly illustrating changes in resistance that are expected when it is assumed that the resistance in the H/L state is equal to that in the L/H state in the second simulation.
Figure 9D:
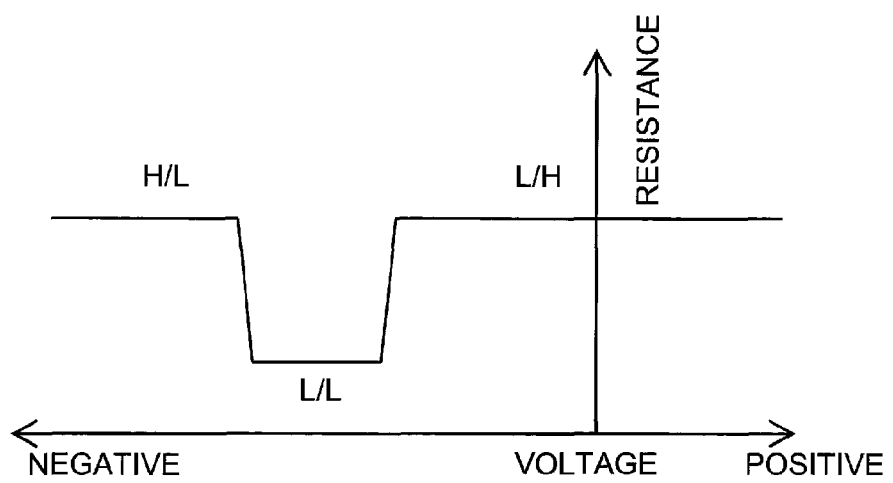

However, as illustrated in FIGS. 9C and 9D, such a storage cell that switches over among four resistance states works as a ternary storage cell if the resistance value for the H/L state is adjusted to be equal to the resistance value for the L/H state. FIGS. 9C and 9D give graphs roughly illustrating changes in resistance that are expected when it is assumed that the H/L state is equal to that in the L/H state in the second simulation, each depicting transition either from the H/L state or from the L/H state.

Described next is a production process for a semiconductor memory device that contains the magnetoresistance element according to the first embodiment. The description particularly focuses on methods for producing a magnetoresistance element, a switching transistor designed for writing and reading, and a wiring for connection to them.

Figure 10A:
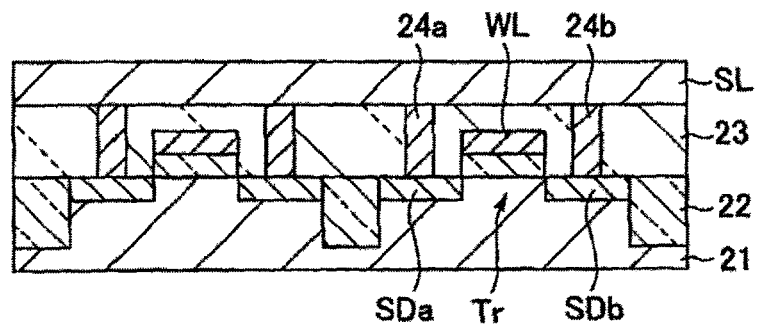
FIGS. 10A to 10C are schematic cross section views illustrating a production process of a semiconductor memory device including a magnetoresistance element according to the first (or second) embodiment.
Figure 10B:
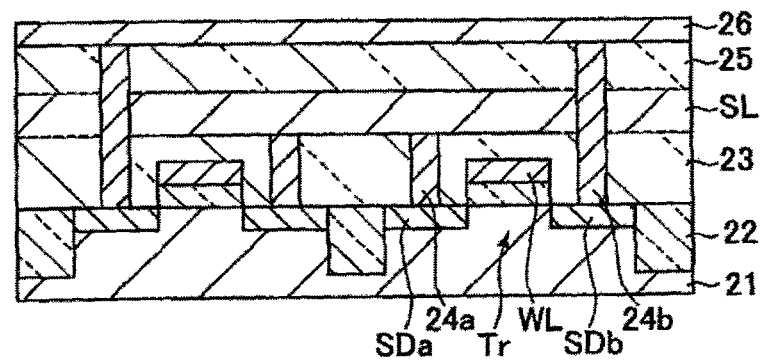
Figure 10C:
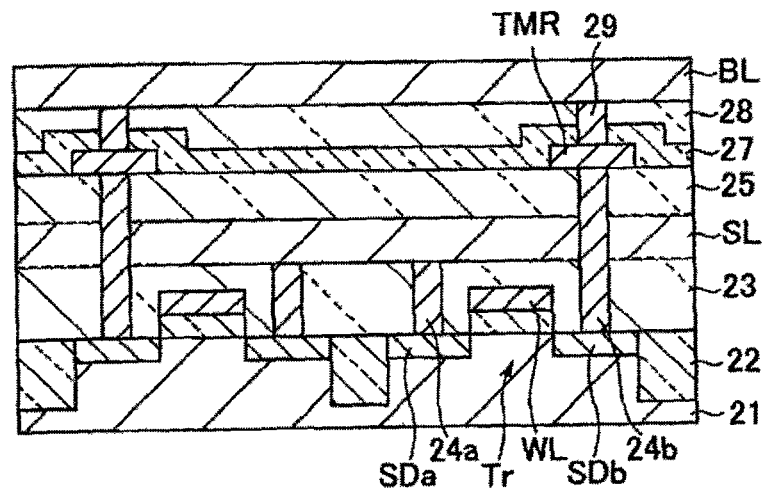
Figure 10D:
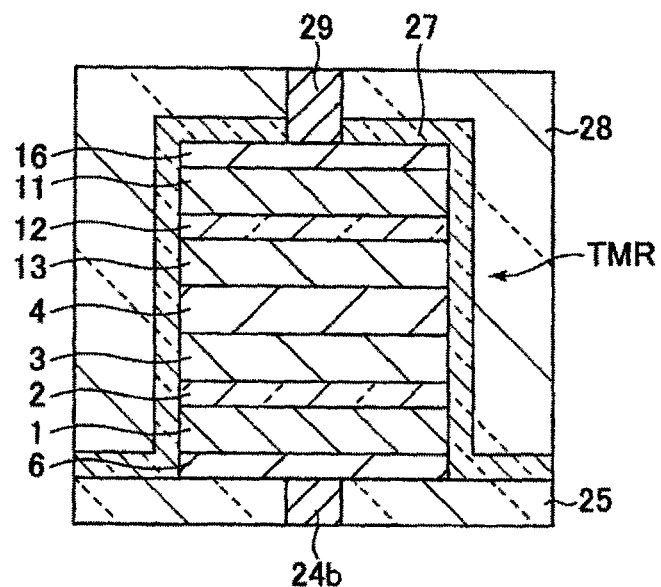
Figure 10E:
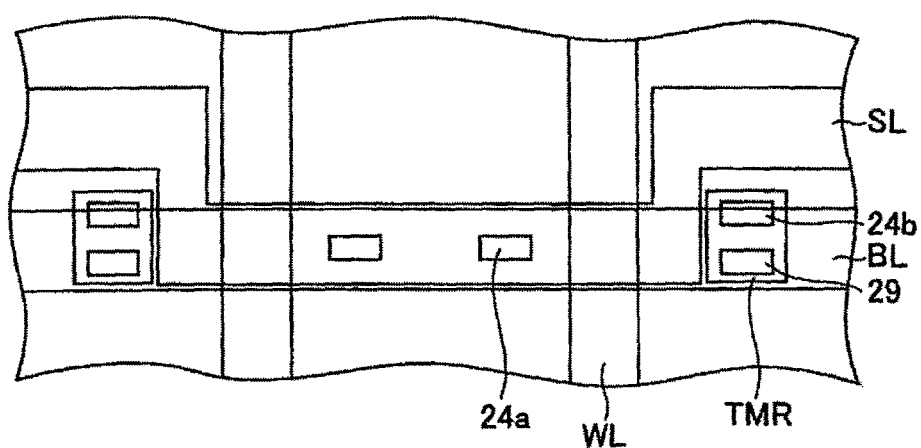
FIG. 10E is a schematic plan view illustrating the wiring structure in the vicinity of the magnetoresistance element according to the first (or second) embodiment.

FIGS. 10A to 10D are schematic cross section views illustrating a production process of a semiconductor memory device including the magnetoresistance element according to the first embodiment, and in particular, FIG. 10D focuses on the cross sectional structure in the vicinity of the magnetoresistance element according to the first embodiment. FIG. 10E is a schematic plan view illustrating the wiring structure in the vicinity of the magnetoresistance element.

Refer to FIG. 10A. For instance, an element-separating insulation film 22 is formed on a silicon substrate 21 by shallow trench isolation (STI) to define active regions. A metal oxide semiconductor (MOS) transistor Tr is formed in each active region. The MOS transistor Tr can be formed by a generally known method. A source/drain region SDa, which will later be connected to a source line SL, is disposed on one side of the gate electrode WL of the MOS transistor Tr, and another source/drain region SDb, which will later be connected to a magnetoresistance element TMR, is disposed on the other side of the gate electrode WL of the MOS transistor Tr.

An interlayer insulation film 23 that covers the MOS transistor Tr is formed on the silicon substrate 21 by carrying out, for instance, chemical vapor deposition (CVD) to deposit a silicon oxide film. Contact holes serving to expose the source/drain regions SDa and SDb are formed in the interlayer insulation film 23 by photolithography and dry etching.

A TiN film as a barrier metal layer and a W film are formed on the interlayer insulation film 23 to cover the contact holes by, for example, sputtering or CVD. Then, unnecessary portions are removed from the TiN film and W film by chemical mechanical polishing (CMP) to form contact plugs 24a and 24b that are connected to the source/drain regions SDa and SDb.

A conductive film (for instance, Al or Cu) is deposited on the interlayer insulation film 23 to cover the contact plugs 24a and 24b and then patterned by photolithography and dry etching to form a source line SL.

As illustrated in FIG. 10E, the source line SL passes over the contact plug 24a and connects to the contact plug 24a, but it does not connect to the contact plug 24b as it detours the contact plug 24b to avoid contact with it. For easy understanding of the description, FIGS. 10A to 10C illustrate the plug 24a, contact plug 24b, etc., in one cross section although they are not disposed in the same plane.

Refer to FIG. 10B. An interlayer insulation film 25 that covers the source line SL is formed by carrying out, for instance, CVD to deposit a silicon oxide film on the interlayer insulation film 23. Contact holes serving to expose the contact plugs 24b are formed in the interlayer insulation film 25 by photolithography and dry etching.

A TiN film as a barrier metal layer and a W film are formed on the interlayer insulation film 25 to cover the contact holes by, for example, sputtering or CVD. Then, unnecessary portions are removed from the TiN film and W film by CMP to form contact plugs 24b that extend upward. Layers that correspond to the lower electrode 6 to the upper electrode 16 (see FIG. 1) of the magnetoresistance element layer 26 are formed on the interlayer insulation film 25 by, for instance, sputtering so that they cover the contact plugs 24b.

Nonmagnetic conductive material such as Ta is deposited to a thickness of, for example, 20 nm to form a lower electrode layer 6. On the lower electrode layer 6, a ferromagnetic material such as CoFeB is deposited to a thickness of, for example, 1.8 nm to form a free magnetic layer 1 for a lower part. On the free magnetic layer 1 for a lower part, an insulation material such as MgO is deposited as thinly as required for tunnel current to flow, for instance, to a thickness of 0.85 nm, to form a tunnel insulating layer 2 for a lower part. On the tunnel insulating layer 2 for a lower part, a ferromagnetic material such as CoFeB is deposited to a thickness of, for example, 3.2 nm to form a fixed magnetic layer 3 for a lower part.

On the fixed magnetic layer 3 for a lower part, an antiferromagnetic material such as PtMn is deposited to a thickness of, for example, 15 nm to form an antiferromagnetic layer 4. On the antiferromagnetic layer 4, a ferromagnetic material such as CoFeB is deposited to a thickness of, for example, 3.2 nm to form a fixed magnetic layer 13 for an upper part. On the fixed magnetic layer 13 for an upper part, an insulation material such as MgO is deposited as thinly as required for tunnel current to flow, for instance, to a thickness of 0.75 nm, to form a tunnel insulating layer 12 for an upper part. On the tunnel insulating layer 12 for an upper part, a ferromagnetic material such as CoFeB is deposited to a thickness of, for example, 2.2 nm to form a free magnetic layer 11 for an upper part. On the free magnetic layer 11 for an upper part, a nonmagnetic conductive material is deposited to form an upper electrode layer 16. For example, Ru is deposited to a thickness of 10 nm, and Ta is deposited on the Ru layer to a thickness of 40 nm to form an upper electrode layer 16.

FIG. 10F gives a table listing the material and film thickness of each layer that is located between the lower electrode and the upper electrode assumed in the first to seventh simulations. Here, the thickness conditions for the second simulation are given as an example. The material of each layer is common among the first to seventh simulations. The thicknesses of the lower electrode layer, antiferromagnetic layer, and upper electrode are common among the first to seventh simulations.

The tunnel insulating layer thicknesses in the upper part and lower part differ between the first simulation and the second to seventh simulations. The resistances in the upper part and lower part can be adjusted by changing the material and thickness of the tunnel insulating layer in each part.

The thicknesses of the fixed and free magnetic layers in the upper part and the lower part differ among the first to seventh simulations. The threshold current values for transition in the upper part and lower part can be adjusted by changing the material and thickness of the fixed magnetic layer and the free magnetic layer in each part.

Now, FIG. 10B is referred to again to continue description. The magnetoresistance element layer 26 as formed suffers from nonuniform magnetization partly because magnetization takes place in the thickness direction in some portions. Here, the magnetoresistance element layer 26 is heat-treated at, for example, 300° C. to 350° C., in a magnetic field of, for example, 1T so that all portions have the same in-plane magnetization direction. This brings both the upper part and the lower part into a low resistance state.

Refer to FIGS. 10C and 10D. The magnetoresistance element layer 26 is patterned by photolithography and dry etching to form a magnetoresistance element TMR on a contact plug 24b.

The etching gas to be used may be a mixed gas of CF$_4$ and Ar for, for example, Ta in the upper electrode layer 16 and the lower electrode layer 6, while it may be a mixed gas of CO and NH$_3$ for, for example, Ru in the upper electrode layer 16, CoFeB in the free magnetic layer 11, fixed magnetic layer 13, fixed magnetic layer 3, and free magnetic layer 1, PtMn in the antiferromagnetic layer 4, and MgO in the tunnel insulating layers 12 and 2.

As illustrated in FIG. 10E, the contact plug 24b extends upward without crossing the source line SL and connects to the magnetoresistance element TMR. Thus, the source/drain region SDb and the magnetoresistance element TMR are electrically connected via the contact plug 24b.

Now, FIGS. 10C and 10D are referred to again to continue description. A cover film 27 is formed by depositing SiN on the interlayer insulation film 25 to a thickness of 20 nm to 50 nm by, for example, CVD or sputtering so as to cover the magnetoresistance element TMR. The cover film 27 serves to prevent oxidization (namely, rusting) of the magnetic material contained in the magnetoresistance element TMR.

On the cover film 27, an interlayer insulation film 28 is formed by depositing a silicon oxide film by, for example, CVD, and the top surface of the interlayer insulation film 28 is planarized by CMP. Contact holes serving to expose the magnetoresistance element TMR are formed in the interlayer insulation film 28 and the cover film 27 by photolithography and dry etching.

A TiN film as a barrier metal layer and a W film are formed on the interlayer insulation film 28 to cover the contact holes by, for example, sputtering or CVD. Then, unnecessary portions are removed from the TiN film and W film by CMP to form a contact plugs 29 that is connected to the magnetoresistance element TMR. A conductive film (for example, Al or Cu) is deposited on the interlayer insulation film 28 to cover the contact plug 29 and then patterned by photolithography and dry etching to form an interconnect line BL that is connected to the contact plug 29.

It is noted that the contact plug 24b that connects the source/drain region SDb with the magnetoresistance element TMR and the contact plug 29 that connects the magnetoresistance element TMR with the interconnect line BL are located away from each other in FIG. 10E for purposes of graphic illustration, but they may be located in such a way that they overlap each other in a plan view.

Figure 11:
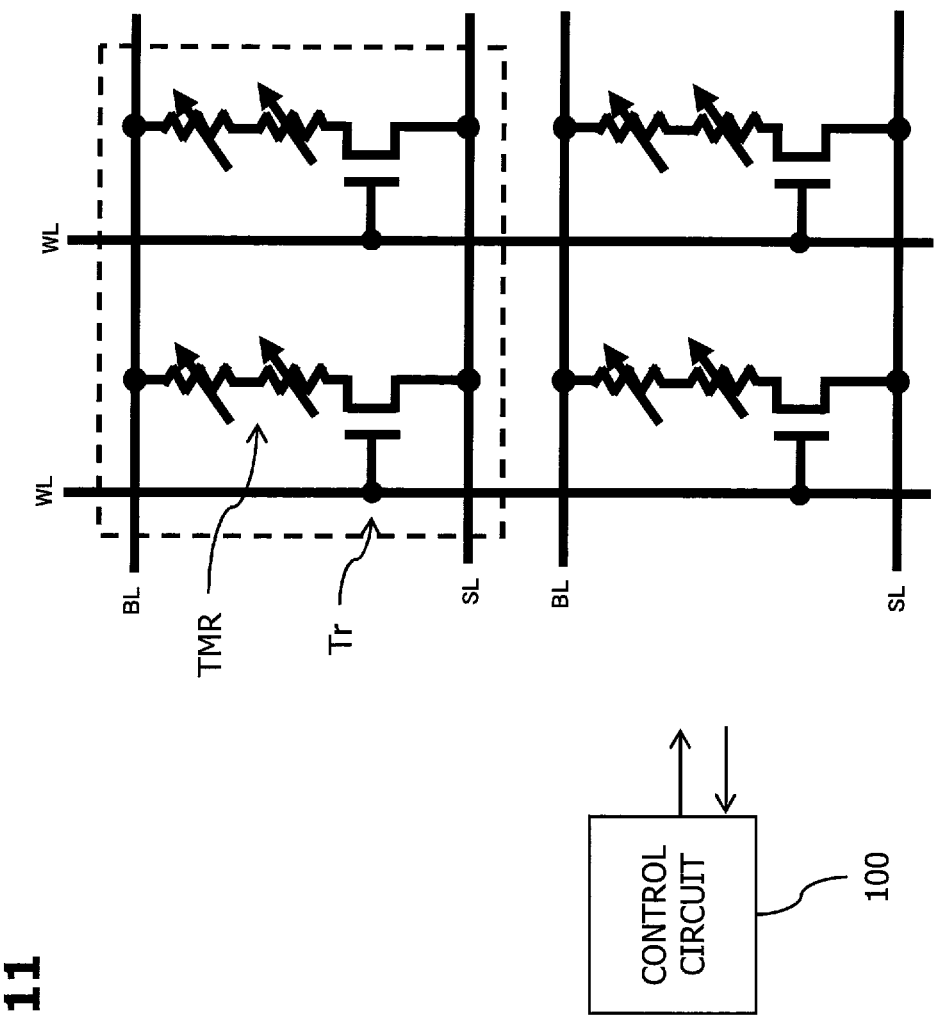
FIG. 11 is a schematic diagram of a semiconductor memory device including the magnetoresistance element according to the first (or second) embodiment.

FIG. 11 is a schematic diagram of a semiconductor memory device containing the magnetoresistance element according to the first embodiment, illustrating a circuit for a magnetoresistance element TMR and a switching transistor Tr. The portion enclosed by broken lines corresponds to the schematic cross section view given in FIG. 10C. Either of the source/drain regions in the switching transistor Tr is connected to the source line SL and the other of the source/drain regions is connected to an end of the magnetoresistance element TMR. The magnetoresistance element TMR is illustrated as two variable resistances connected in series. The other end of the magnetoresistance element TMR is connected to the interconnect line BL.

A voltage is applied to the gate electrode to maintain the switching transistor Tr activated during writing of data in the magnetoresistance element TMR or reading of data from the magnetoresistance element TMR.

Writing is effected by controlling the polarity and intensity of the voltage between the interconnect line BL and the source line SL so that a current required for transition flows either from the interconnect line BL to the source line SL or from the source line SL to the interconnect line BL depending on the target resistance state. It is noted that two steps of transition are required to write data in some cases, such as where transition from the L/L or L/H state to the H/H state is effected via the H/L state in the first embodiment under the conditions for the second simulation.

Reading is effected by controlling the voltage between the interconnect line BL and the source line SL so as to supply a low current at which no transition takes place, and determining the resistance state of the magnetoresistance element TMR based on resistance values.

A control circuit 100 works to control the voltage applied to the gate electrode, control the polarity and intensity of the voltage applied between the interconnect line BL and the source line SL, and determine the resistance state of the magnetoresistance element TMR.

As described above, the magnetoresistance element according to the first embodiment can switch over among at least the three states of L/L, H/L, and L/H and therefore, it is suitable for producing, for example, a multivalued, i.e., ternary or higher, memory element.

The magnetoresistance element according to the first embodiment described above contains an upper magnetoresistance subelement having a magnetoresistance element structure in which a free magnetic layer is located above a fixed magnetic layer, and a lower magnetoresistance subelement having a magnetoresistance element structure in which a free magnetic layer is located below a fixed magnetic layer, but a magnetoresistance element can also be produced according to a second embodiment that contains an upper magnetoresistance subelement having a magnetoresistance element structure in which a fixed magnetic layer is located above a free magnetic layer, and a lower magnetoresistance subelement having a magnetoresistance element structure in which a fixed magnetic layer is located below a free magnetic layer.

Figure 12:
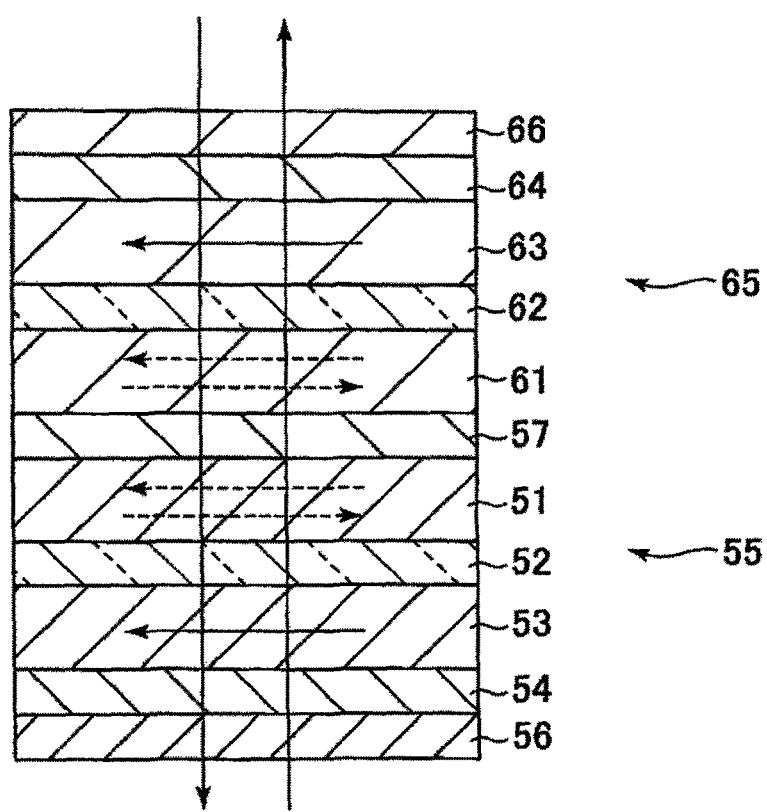
FIG. 12 is a schematic cross section view of a magnetoresistance element according to the second embodiment.

FIG. 12 is a schematic cross section view of a magnetoresistance element according to the second embodiment. A lower electrode 56 is located at the bottom, and an antiferromagnetic layer 54, a fixed magnetic layer 53, a tunnel insulating layer 52, a free magnetic layer 51, an intermediate electrode 57, a free magnetic layer 61, a tunnel insulating layer 62, a fixed magnetic layer 63, an antiferromagnetic layer 64, and a upper electrode 66 are stacked in this order.

In the first embodiment (see FIG. 1), the fixed magnetic layer 13 in the upper part 15 and the fixed magnetic layer 3 in the lower part 5 share one antiferromagnetic layer 4. In the second embodiment, the antiferromagnetic layer 64, which fixes the magnetization direction of the fixed magnetic layer 63 in the upper part 65, is provided separately from the antiferromagnetic layer 54, which fixes the magnetization direction of the fixed magnetic layer 53 in the lower part 55.

Furthermore, an intermediate electrode 57 of nonmagnetic material is provided between the free magnetic layer 51 and the free magnetic layer 61 so that the free magnetic layer 61 in the upper part 65 and the free magnetic layer 51 in the lower part 55 can be magnetized separately in independent directions. The intermediate electrode 57 may be formed by, for example, depositing Ru to a thickness of about 5 nm.

In the second embodiment, as well as in the first embodiment, a fixed magnetic layer, a tunnel insulating layer, and a free magnetic layer are stacked inversely in the upper part and the lower part, and accordingly, a current in a direction causes transition in the opposes directions in the upper part and the lower part. It is noted that the directions of transition in the second embodiment are inverse to those in the first embodiment as described later.

As in the case of the first embodiment, the current direction from the top to the bottom in FIG. 12 is defined as positive direction while the current direction from the bottom to the top is defined as negative direction. Transition from the H/L state is illustrated below as an example. In the first embodiment, transition from the H/L state to the L/H state takes place via the L/L or the H/H state as an increasing current is applied in the positive direction. And an increasing negative directional current does not cause any transition from the H/L state.

In the second embodiment, on the other hand, transition from the H/L state does not take place if an increasing current is applied in the positive direction. Transition from the H/L state to the L/H state takes place via the L/L or the H/H state as an increasing current is applied in the negative direction.

In the second embodiment, the H/H state develops under the same conditions for the first embodiment. Accordingly, the H/H state can be produced if the threshold current value for the transition from the L state to the H state in one of either the upper part or the lower part is adjusted to be smaller than the threshold current value for the transition from the H state to the L state in the other one of either the upper part or the lower part.

As described above, the magnetoresistance element according to the second embodiment can also switch over among at least the three states of L/L, H/L, and L/H and therefore, it is suitable for producing, for example, a multivalued, i.e., ternary or higher, memory element. A semiconductor memory device containing the magnetoresistance element according to the second embodiment can be produced and operated in the same manner as for a semiconductor memory device containing the magnetoresistance element according to the first embodiment. For a semiconductor memory device containing the magnetoresistance element according to the second embodiment, however, the magnetoresistance element is formed by depositing and patterning layers as illustrated in FIG. 12.

The film deposition and patterning steps can be performed more easily for the first embodiment than for the second embodiment because a less number of layers are required for producing a magnetoresistance element. It is noted that the intermediate electrode in the second embodiment has a somewhat large thickness (for example, a thickness of about 5 nm for Ru) in order to reduce the mutual influence between the free magnetic layer in the upper part and that in the lower part.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A magnetoresistance element comprising:
   a first magnetoresistance subelement including a first free magnetization layer, a first tunnel insulating layer and a first fixed magnetization layer, the first tunnel insulating layer interposed between the first free magnetization layer and the first fixed magnetization layer, a magnetization direction of the first free magnetization layer changing according to an electric current flowing in a thickness direction of the first magnetoresistance subelement, and a resistance of the first magnetoresistance subelement changing between a low resistance state and a high resistance state according to the magnetization direction of the first free magnetization layer; and
   a second magnetoresistance subelement including a second free magnetization layer, a second tunnel insulating layer and a second fixed magnetization layer, the second tunnel insulating layer interposed between the second free magnetization layer and the second fixed magnetization layer, a magnetization direction of the second free magnetization layer changing according to an electric current flowing in a thickness direction of the second magnetoresistance subelement, and a resistance of the second magnetoresistance subelement changing between a low resistance state and a high resistance state according to the magnetization direction of the second free magnetization layer, wherein the first and second magnetoresistance subelements are stacked each other, an order of the first free magnetization layer and the first fixed magnetization layer is opposite to an order of the second free magnetization layer and the second fixed magnetization layer in a thickness direction of the magnetoresistance element, the first magnetoresistance subelement is in the low resistance state having a first resistance value when the magnetization direction of the first free magnetization layer is identical with a magnetization direction of the first fixed magnetization layer, the first magnetoresistance subelement is in the high resistance state having a second resistance value larger than the first resistance value when the magnetization direction of the first free magnetization layer is opposed to the magnetization direction of the first fixed magnetization layer, the second magnetoresistance subelement is in the low resistance state having a third resistance value when the magnetization direction of the second free magnetization layer is identical to a magnetization direction of the second fixed magnetization layer, the second magnetoresistance subelement is in the high resistance state having a fourth resistance value larger than the third resistance value when the magnetization direction of the second free magnetization layer is opposed to the magnetization direction of the second fixed magnetization layer, and a sum of the first resistance value and the fourth resistance value is unequal to a sum of the second resistance value and the third resistance value.

2. A magnetoresistance element comprising:

a first magnetoresistance subelement including a first free magnetization layer, a first tunnel insulating layer and a first fixed magnetization layer, the first tunnel insulating layer interposed between the first free magnetization layer and the first fixed magnetization layer, a magnetization direction of the first free magnetization layer changing according to an electric current flowing in a thickness direction of the first magnetoresistance subelement, and a resistance of the first magnetoresistance subelement changing between a low resistance state and a high resistance state according to the magnetization direction of the first free magnetization layer; and a second magnetoresistance subelement including a second free magnetization layer, a second tunnel insulating layer and a second fixed magnetization layer, the second tunnel insulating layer interposed between the second free magnetization layer and the second fixed magnetization layer, a magnetization direction of the second free magnetization layer changing according to an electric current flowing in a thickness direction of the second magnetoresistance subelement, and a resistance of the second magnetoresistance subelement changing between a low resistance state and a high resistance state according to the magnetization direction of the second free magnetization layer, wherein the first and second magnetoresistance subelements are stacked each other, an order of the first free magnetization layer and the first fixed magnetization layer is opposite to an order of the second free magnetization layer and the second fixed magnetization layer in a thickness direction of the magnetoresistance element, the first magnetoresistance subelement in the high resistance state transits to the low resistance state by applying an electric current equal to or greater than a first current value in a direction from the first free magnetization layer to the first fixed magnetization layer, the first magnetoresistance subelement in the low resistance state transits to the high resistance state by applying an electric current equal to or greater than a second current value that is greater than the first current value in a direction from the first fixed magnetization layer to the first free magnetization layer, the second magnetoresistance subelement in the high resistance state transits to the low resistance state by applying an electric current equal to or greater than a third current value in a direction from the second free magnetization layer to the second fixed magnetization layer, the second magnetoresistance subelement in the low resistance state transits to the high resistance state by applying an electric current equal to or greater than a fourth current value that is greater than the third current value in a direction from the second fixed magnetization layer to the second free magnetization layer, and either the second current value is smaller than the third current value, or the fourth current value is smaller than the first current value.

3. The magnetoresistance element according to claim 2, wherein the first magnetoresistance subelement is in the low resistance state having a first resistance value when the magnetization direction of the first free magnetization layer is identical with a magnetization direction of the first fixed magnetization layer, the first magnetoresistance subelement is in the high resistance state having a second resistance value larger than the first resistance value when the magnetization direction of the first free magnetization layer is opposed to the magnetization direction of the first fixed magnetization layer, the second magnetoresistance subelement is in the low resistance state having a third resistance value when the magnetization direction of the second free magnetization layer is identical to a magnetization direction of the second fixed magnetization layer, the second magnetoresistance subelement is in the high resistance state having a fourth resistance value larger than the third resistance value when the magnetization direction of the second free magnetization layer is opposed to the magnetization direction of the second fixed magnetization layer, and a sum of the first resistance value and the fourth resistance value is unequal to a sum of the second resistance value and the third resistance value.

4. The magnetoresistance element according to claim 2, wherein the first magnetoresistance subelement is in the low resistance state having a first resistance value when the magnetization direction of the first free magnetization layer is identical with a magnetization direction of the first fixed magnetization layer, the first magnetoresistance subelement is in the high resistance state having a second resistance value larger than the first resistance value when the magnetization direction of the first free magnetization layer is opposed to the magnetization direction of the first fixed magnetization layer, the second magnetoresistance subelement is in the low resistance state having a third resistance value when the magnetization direction of the second free magnetization layer is identical to a magnetization direction of the second fixed magnetization layer, the second magnetoresistance subelement is in the high resistance state having a fourth resistance value larger than the third resistance value when the magnetization direction of the second free magnetization layer is opposed to the magnetization direction of the second fixed magnetization layer, and a sum of the first resistance value and the fourth resistance value is equal to a sum of the second resistance value and the third resistance value.

5. A magnetoresistance element comprising:

a first magnetoresistance subelement including a first free magnetization layer, a first tunnel insulating layer and a first fixed magnetization layer, the first tunnel insulating layer interposed between the first free magnetization layer and the first fixed magnetization layer, a magnetization direction of the first free magnetization layer changing according to an electric current flowing in a thickness direction of the first magnetoresistance subelement, and a resistance of the first magnetoresistance subelement changing between a low resistance state and a high resistance state according to the magnetization direction of the first free magnetization layer;

a second magnetoresistance subelement including a second free magnetization layer, a second tunnel insulating layer and a second fixed magnetization layer, the second tunnel insulating layer interposed between the second free magnetization layer and the second fixed magnetization layer, a magnetization direction of the second free magnetization layer changing according to an electric current flowing in a thickness direction of the second magnetoresistance subelement, and a resistance of the second magnetoresistance subelement changing between a low resistance state and a high resistance state according to the magnetization direction of the second free magnetization layer; and an antiferromagnetic layer interposed between the first fixed magnetic layer and the second fixed magnetic layer, and wherein the first free magnetization layer and the second free magnetization layer are disposed outside of the first fixed magnetization layer and the second fixed magnetization layer, respectively, wherein the first and second magnetoresistance subelements are stacked each other, and an order of the first free magnetization layer and the first fixed magnetization layer is opposite to an order of the second free magnetization layer and the second fixed magnetization layer in a thickness direction of the magnetoresistance element.

6. The magnetoresistance element according to claim 1, further comprising an antiferromagnetic layer interposed between the first fixed magnetic layer and the second fixed magnetic layer, and wherein the first free magnetization layer and the second free magnetization layer are disposed outside of the first fixed magnetization layer and the second fixed magnetization layer, respectively.

7. The magnetoresistance element according to claim 2, further comprising an antiferromagnetic layer interposed between the first fixed magnetic layer and the second fixed magnetic layer, and wherein the first free magnetization layer and the second free magnetization layer are disposed outside of the first fixed magnetization layer and the second fixed magnetization layer, respectively.

8. The magnetoresistance element according to claim 3, further comprising an antiferromagnetic layer interposed between the first fixed magnetic layer and the second fixed magnetic layer, and wherein the first free magnetization layer and the second free magnetization layer are disposed outside of the first fixed magnetization layer and the second fixed magnetization layer, respectively.

9. A magnetoresistance element comprising:

a first magnetoresistance subelement including a first free magnetization layer, a first tunnel insulating layer and a first fixed magnetization layer, the first tunnel insulating layer interposed between the first free magnetization layer and the first fixed magnetization layer, a magnetization direction of the first free magnetization layer changing according to an electric current flowing in a thickness direction of the first magnetoresistance subelement, and a resistance of the first magnetoresistance subelement changing between a low resistance state and a high resistance state according to the magnetization direction of the first free magnetization layer;

a second magnetoresistance subelement including a second free magnetization layer, a second tunnel insulating layer and a second fixed magnetization layer, the second tunnel insulating layer interposed between the second free magnetization layer and the second fixed magnetization layer, a magnetization direction of the second free magnetization layer changing according to an electric current flowing in a thickness direction of the second magnetoresistance subelement, and a resistance of the second magnetoresistance subelement changing between a low resistance state and a high resistance state according to the magnetization direction of the second free magnetization layer; and an interlayer of nonmagnetic material interposed between the first free magnetization layer and the second free magnetization layer, wherein the first fixed magnetization layer and the second fixed magnetization layer are disposed outside of the first free magnetization layer and the second free magnetization layer, respectively, and further comprising a first antiferromagnetic layer disposed outside of the first fixed magnetization layer and a second antiferromagnetic layer disposed outside of the second fixed magnetization layer, wherein the first and second magnetoresistance subelements are stacked each other, and an order of the first free magnetization layer and the first fixed magnetization layer is opposite to an order of the second free magnetization layer and the second fixed magnetization layer in a thickness direction of the magnetoresistance element.

10. The magnetoresistance element according to claim 1, wherein the first tunnel insulating layer and the second tunnel insulating layer are formed of an identical material and have different thicknesses.

11. The magnetoresistance element according to claim 2, wherein the first free magnetic layer and the second free magnetic layer are formed of an identical material and have different thicknesses.

12. A semiconductor memory device comprising:

a magnetoresistance element;

a MOS transistor having either of source/drain regions electrically connected to the magnetoresistance element; and a control circuit to perform writing operation by controlling a gate voltage of the MOS transistor and a voltage applied to both ends of the magnetoresistance element and supplying a current to the magnetoresistance element so as to cause the magnetoresistance element to transition to a target resistance state, wherein the magnetoresistance element comprises:

a first magnetoresistance subelement including a first free magnetization layer, a first tunnel insulating layer and a first fixed magnetization layer, the first tunnel insulating layer interposed between the first free magnetization layer and the first fixed magnetization layer, a magnetization direction of the first free magnetization layer changing according to an electric current flowing in a thickness direction of the first magnetoresistance subelement, and a resistance of the first magnetoresistance subelement changing between a low resistance state and a high resistance state according to the magnetization direction of the first free magnetization layer; and a second magnetoresistance subelement including a second free magnetization layer, a second tunnel insulating layer and a second fixed magnetization layer, the second tunnel insulating layer interposed between the second free magnetization layer and the second fixed magnetization layer, a magnetization direction of the second free magnetization layer changing according to an electric current flowing in a thickness direction of the second magnetoresistance subelement, and a resistance of the second magnetoresistance subelement changing between a low resistance state and a high resistance state according to the magnetization direction of the second free magnetization layer, and wherein the first and second magnetoresistance subelements are stacked each other, and an order of the first free magnetization layer and the first fixed magnetization layer is opposite to an order of the second free magnetization layer and the second fixed magnetization layer in a thickness direction of the magnetoresistance element, and wherein the control circuit causes the magnetoresistance element to undergo two steps of transition in order to cause the magnetoresistance element to reach the target resistance state starting from a resistance state other than the target resistance state.

13. A semiconductor memory device comprising:
a magnetoresistance element; and
a MOS transistor having either of source/drain regions electrically connected to the magnetoresistance element, wherein the magnetoresistance element comprises:

a first magnetoresistance subelement including a first free magnetization layer, a first tunnel insulating layer and a first fixed magnetization layer, the first tunnel insulating layer interposed between the first free magnetization layer and the first fixed magnetization layer, a magnetization direction of the first free magnetization layer changing according to an electric current flowing in a thickness direction of the first magnetoresistance subelement, and a resistance of the first magnetoresistance subelement changing between a low resistance state and a high resistance state according to the magnetization direction of the first free magnetization layer; and a second magnetoresistance subelement including a second free magnetization layer, a second tunnel insulating layer and a second fixed magnetization layer, the second tunnel insulating layer interposed between the second free magnetization layer and the second fixed magnetization layer, a magnetization direction of the second free magnetization layer changing according to an electric current flowing in a thickness direction of the second magnetoresistance subelement, and a resistance of the second magnetoresistance subelement changing between a low resistance state and a high resistance state according to the magnetization direction of the second free magnetization layer, and wherein the first and second magnetoresistance subelements are stacked each other, and an order of the first free magnetization layer and the first fixed magnetization layer is opposite to an order of the second free magnetization layer and the second fixed magnetization layer in a thickness direction of the magnetoresistance element, and wherein the first magnetoresistance subelement is in the low resistance state having a first resistance value when the magnetization direction of the first free magnetization layer is identical with a magnetization direction of the first fixed magnetization layer, the first magnetoresistance subelement is in the high resistance state having a second resistance value larger than the first resistance value when the magnetization direction of the first free magnetization layer is opposed to the magnetization direction of the first fixed magnetization layer, the second magnetoresistance subelement is in the low resistance state having a third resistance value when the magnetization direction of the second free magnetization layer is identical to a magnetization direction of the second fixed magnetization layer, the second magnetoresistance subelement is in the high resistance state having a fourth resistance value larger than the third resistance value when the magnetization direction of the second free magnetization layer is opposed to the magnetization direction of the second fixed magnetization layer, and a sum of the first resistance value and the fourth resistance value is unequal to a sum of the second resistance value and the third resistance value.

14. A semiconductor memory device comprising:
a magnetoresistance element; and
a MOS transistor having either of source/drain regions electrically connected to the magnetoresistance element, wherein the magnetoresistance element comprises:

a first magnetoresistance subelement including a first free magnetization layer, a first tunnel insulating layer and a first fixed magnetization layer, the first tunnel insulating layer interposed between the first free magnetization layer and the first fixed magnetization layer, a magnetization direction of the first free magnetization layer changing according to an electric current flowing in a thickness direction of the first magnetoresistance subelement, and a resistance of the first magnetoresistance subelement changing between a low resistance state and a high resistance state according to the magnetization direction of the first free magnetization layer; and a second magnetoresistance subelement including a second free magnetization layer, a second tunnel insulating layer and a second fixed magnetization layer, the second tunnel insulating layer interposed between the second free magnetization layer and the second fixed magnetization layer, a magnetization direction of the second free magnetization layer changing according to an electric current flowing in a thickness direction of the second magnetoresistance subelement, and a resistance of the second magnetoresistance subelement changing between a low resistance state and a high resistance state according to the magnetization direction of the second free magnetization layer, and wherein the first and second magnetoresistance subelements are stacked each other, and an order of the first free magnetization layer and the first fixed magnetization layer is opposite to an order of the second free magnetization layer and the second fixed magnetization layer in a thickness direction of the magnetoresistance element, and wherein the first magnetoresistance subelement in the high resistance state transits to the low resistance state by applying an electric current equal to or greater than a first current value in a direction from the first free magnetization layer to the first fixed magnetization layer, the first magnetoresistance subelement in the low resistance state transits to the high resistance state by applying an electric current equal to or greater than a second current value that is greater than the first current value in a direction from the first fixed magnetization layer to the first free magnetization layer, the second magnetoresistance subelement in the high resistance state transits to the low resistance state by applying an electric current equal to or greater than a third current value in a direction from the second free magnetization layer to the second fixed magnetization layer, the second magnetoresistance subelement in the low resistance state transits to the high resistance state by applying an electric current equal to or greater than a fourth current value that is greater than the third current value in a direction from the second fixed magnetization layer to the second free magnetization layer, and either the second current value is smaller than the third current value, or the fourth current value is smaller than the first current value.

15. The semiconductor memory device according to claim 14, wherein the first magnetoresistance subelement is in the low resistance state having a first resistance value when the magnetization direction of the first free magnetization layer is identical with a magnetization direction of the first fixed magnetization layer, the first magnetoresistance subelement is in the high resistance state having a second resistance value larger than the first resistance value when the magnetization direction of the first free magnetization layer is opposed to the magnetization direction of the first fixed magnetization layer, the second magnetoresistance subelement is in the low resistance state having a third resistance value when the magnetization direction of the second free magnetization layer is identical to a magnetization direction of the second fixed magnetization layer, the second magnetoresistance subelement is in the high resistance state having a fourth resistance value larger than the third resistance value when the magnetization direction of the second free magnetization layer is opposed to the magnetization direction of the second fixed magnetization layer, and a sum of the first resistance value and the fourth resistance value is unequal to a sum of the second resistance value and the third resistance value.

\* \* \* \* \*